US011502086B2

United States Patent
Son et al.

(10) Patent No.: US 11,502,086 B2
(45) Date of Patent: Nov. 15, 2022

(54) SEMICONDUCTOR MEMORY DEVICE AND METHOD FOR MANUFACTURING THE SAME

(71) Applicant: Samsung Electronics Co., Ltd., Suwon-si (KR)

(72) Inventors: Yong-hoon Son, Yongin-si (KR); Jae Hoon Kim, Seoul (KR); Kwang-Ho Park, Cheonan-si (KR); Seungjae Jung, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 107 days.

(21) Appl. No.: 17/038,355

(22) Filed: Sep. 30, 2020

(65) Prior Publication Data

US 2021/0183862 A1 Jun. 17, 2021

(30) Foreign Application Priority Data

Dec. 16, 2019 (KR) .................. 10-2019-0168208

(51) Int. Cl.
*H01L 27/108* (2006.01)
*H01L 29/06* (2006.01)
(Continued)

(52) U.S. Cl.
CPC .. *H01L 27/10805* (2013.01); *H01L 21/02603* (2013.01); *H01L 21/28518* (2013.01);
(Continued)

(58) Field of Classification Search
CPC .............. H01L 27/10; H01L 27/1052; H01L 27/10805; H01L 27/10897; H01L 27/1122; H01L 27/11286; H01L 27/115; H01L 27/11563; H01L 27/1157; H01L 27/11578; H01L 27/11582; H01L 27/11597; H01L 29/0673; H01L 29/41; H01L 29/42392; H01L 29/66742; H01L 29/7827;
(Continued)

(56) References Cited

U.S. PATENT DOCUMENTS 9,023,723 B2 5/2015 Chang et al.
9,343,462 B2 5/2016 Tang
(Continued)

FOREIGN PATENT DOCUMENTS

KR 10-2008-0028030 A 3/2008
KR 10-2012-0132671 A 12/2012
KR 10-2021-0042225 A 10/2019

*Primary Examiner* — Cheung Lee
(74) *Attorney, Agent, or Firm* — Harness, Dickey & Pierce, P.L.C.

(57) ABSTRACT

A semiconductor memory device includes a stack structure comprising a plurality of layers vertically stacked on a substrate, each layer including a semiconductor pattern, a gate electrode extending in a first direction on the semiconductor pattern, and a data storage element electrically connected to the semiconductor pattern, a plurality of vertical insulators penetrating the stack structure, the vertical insulators arranged in the first direction, and a bit line provided at a side of the stack structure and extending vertically. The bit line electrically connects the semiconductor patterns which are stacked. Each of the vertical insulators includes first and second vertical insulators adjacent to each other. The gate electrode includes a connection portion disposed between the first and second vertical insulators.

20 Claims, 46 Drawing Sheets

(51) Int. Cl.
*H01L 29/423* (2006.01)
*H01L 29/786* (2006.01)
*H01L 29/66* (2006.01)
*H01L 21/02* (2006.01)
*H01L 21/306* (2006.01)
*H01L 21/285* (2006.01)

(52) U.S. Cl.
CPC .. *H01L 21/30604* (2013.01); *H01L 27/10873* (2013.01); *H01L 27/10885* (2013.01); *H01L 27/10897* (2013.01); *H01L 29/0673* (2013.01); *H01L 29/42392* (2013.01); *H01L 29/66742* (2013.01); *H01L 29/78696* (2013.01)

(58) Field of Classification Search
CPC ......... H01L 29/78642; H01L 29/78696; G11C 11/223; G11C 11/2259
See application file for complete search history.

(56) References Cited

U.S. PATENT DOCUMENTS

| | | |
|---|---|---|
| 9,444,046 B2 | 9/2016 | Pio |
| 9,837,155 B1 | 12/2017 | Kim et al. |
| 10,074,605 B2 | 9/2018 | Aw |
| 10,355,049 B1 | 7/2019 | Grobis et al. |
| 2011/0023631 A1 | 2/2011 | Sleeman |
| 2018/0323198 A1 | 11/2018 | Luan et al. |
| 2018/0350823 A1 | 12/2018 | Or-Bach et al. |
| 2019/0013317 A1 | 1/2019 | Luan et al. |
| 2019/0103407 A1 | 4/2019 | Kim et al. |
| 2019/0164985 A1 | 5/2019 | Lee et al. |

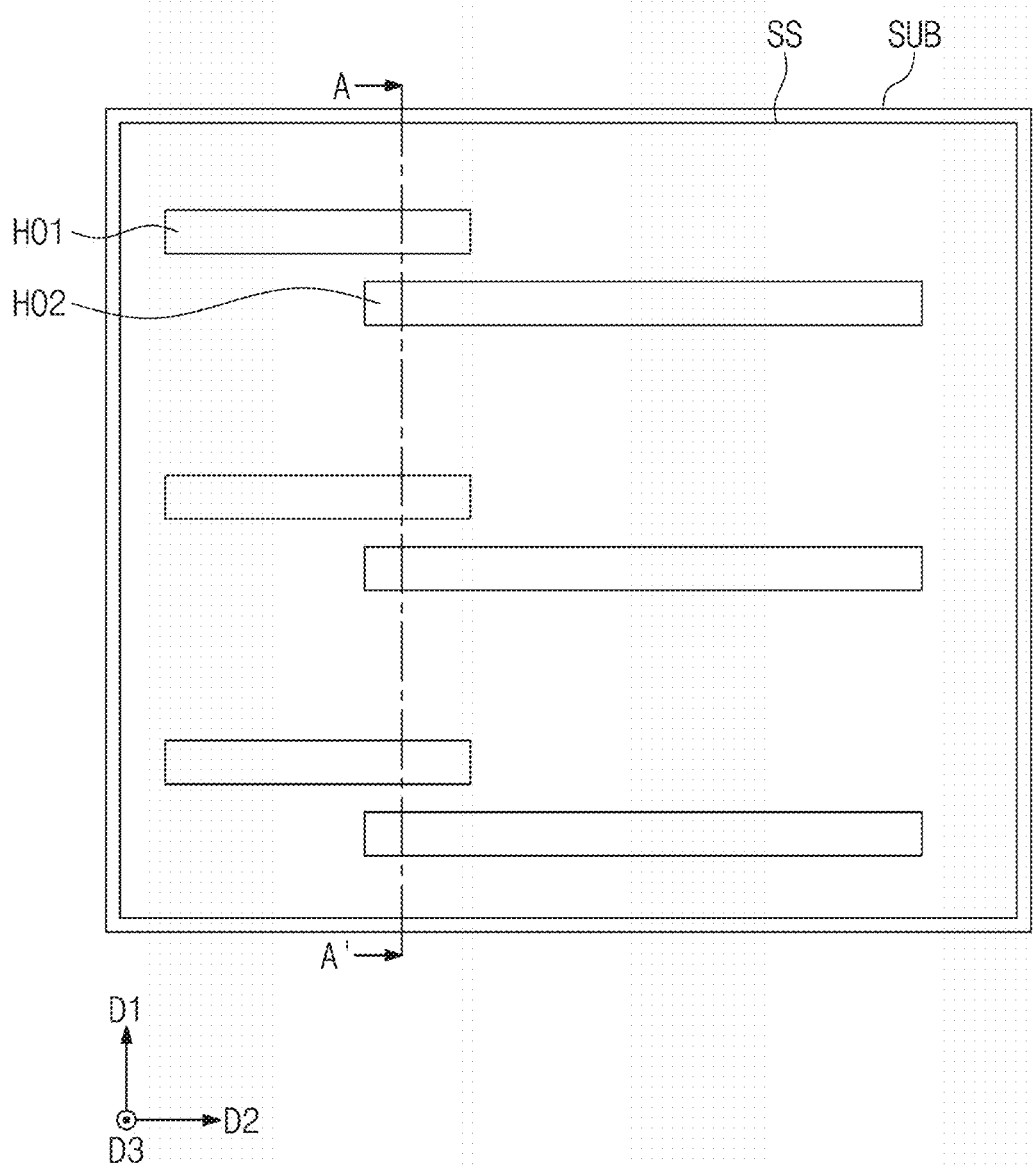

SEMICONDUCTOR MEMORY DEVICE AND METHOD FOR MANUFACTURING THE SAME

CROSS-REFERENCE TO RELATED APPLICATION

This U.S. non-provisional patent application claims priority under 35 U.S.C. § 119 to Korean Patent Application No. 10-2019-0168208, filed on Dec. 16, 2019, in the Korean Intellectual Property Office, the disclosure of which is hereby incorporated by reference in its entirety.

BACKGROUND

Example embodiments of inventive concepts relate to a semiconductor device and/or a method for manufacturing the same and, more particularly, to a three-dimensional (3D) semiconductor memory device with improved electrical characteristics and/or a method for manufacturing the same.

Semiconductor devices have been highly integrated to provide improved/excellent performance and/or low manufacturing costs. The integration density of semiconductor devices affects, e.g. directly affects the costs of the semiconductor devices, thereby resulting in a demand of highly integrated semiconductor devices. The integration density of typical two-dimensional (2D) or planar semiconductor devices may be mainly determined by an area where a unit memory cell occupies. Therefore, the integration density of the typical 2D semiconductor devices may be greatly affected by a technique of forming fine patterns. However, since extremely high-priced apparatuses are used/needed to form fine patterns, the integration density of 2D semiconductor devices continues to increase but is still limited. Thus, three-dimensional (3D) semiconductor memory devices have been developed to overcome the above limitations. 3D semiconductor memory devices may include memory cells three-dimensionally arranged.

SUMMARY

Some example embodiments of inventive concepts may provide a three-dimensional (3D) semiconductor memory device with improved electrical characteristics and reliability.

Some example embodiments of inventive concepts may also provide a method for manufacturing/fabricating a 3D semiconductor memory device with improved electrical characteristics and reliability.

According to some example embodiments, a semiconductor memory device may include a stack structure comprising a plurality of layers vertically stacked on a substrate, wherein each of the plurality of layers includes a semiconductor pattern, a gate electrode extending in a first direction on the semiconductor pattern, and a data storage element electrically connected to the semiconductor pattern. The semiconductor memory device includes a plurality of vertical insulators penetrating the stack structure, at least one of the plurality of the vertical insulators arranged in the first direction, and a bit line vertically extending on a side of the stack structure. The bit line is electrically connected the semiconductor patterns. Each of the vertical insulators comprises, a first vertical insulator, and a second vertical insulator adjacent to the first vertical insulator. The gate electrode includes a connection portion between the first vertical insulator and the second vertical insulator.

According to some example embodiments, a semiconductor memory device may include a stack structure including a plurality of layers vertically stacked on a substrate, wherein each of the plurality of layers includes a semiconductor pattern, a gate electrode extending in a first direction on the semiconductor pattern, and a data storage element electrically connected to the semiconductor pattern. The semiconductor memory device includes a vertical insulator penetrating the stack structure, the vertical insulator extending in a second direction intersecting the first direction, and a bit line vertically extending on a side of the stack structure. The semiconductor pattern includes a first semiconductor sub-pattern and a second semiconductor sub-pattern which are spaced apart from each other in the first direction with the vertical insulator interposed therebetween. The vertical insulator includes a first vertical insulator and a second vertical insulator adjacent to the first vertical insulator. The gate electrode includes a connection portion between the first vertical insulator and the second vertical insulator. The gate electrode on the first semiconductor pattern is connected to the gate electrode on the second semiconductor pattern through the connection portion.

According to some example embodiments, a semiconductor memory device may include a bit line extending in a first direction on a substrate, the first direction perpendicular to a top surface of the substrate, a semiconductor pattern extending in a second direction from the bit line, the second direction parallel to the top surface of the substrate, the semiconductor pattern having a first surface and a second surface which are opposite to each other in the first direction, a first gate electrode and a second gate electrode on the first surface and the second surface of the semiconductor pattern, respectively, the first and second gate electrodes extending in a third direction, the first and second gate electrodes parallel to each other, the third direction being parallel to the top surface of the substrate and intersecting the second direction, and a data storage element electrically connected to the semiconductor pattern.

According to some example embodiments, a method for manufacturing a semiconductor memory device may include forming a stack structure including a plurality of layers vertically stacked on a substrate, wherein each of the plurality of layers comprises a first insulating layer, a semiconductor layer and a second insulating layer, the first insulating layer and the second insulating layer sequentially stacked, forming a first hole and a second hole, the first hole and the second hole penetrating the stack structure, partially etching the semiconductor layers exposed by the first and second holes to divide each of the semiconductor layers into a pair of semiconductor patterns, forming a vertical insulator filling the first and second holes, replacing a portion of each of the second insulating layers with a gate electrode, forming a bit line on a side of the stack structure, the bit line extending vertically, replacing a portion of each of the semiconductor patterns with a first electrode, and replacing a remaining portion of each of the second insulating layers with a second electrode.

BRIEF DESCRIPTION OF THE DRAWINGS

Inventive concepts will become more apparent in view of the attached drawings and accompanying detailed description.

FIGS. 9, 11, 13, 15, 17 and 19 are plan views illustrating a method for manufacturing a 3D semiconductor memory device, according to some example embodiments of inventive concepts.

DETAILED DESCRIPTION OF EXAMPLE EMBODIMENTS

When an element is referred to as being "on," "connected to," "coupled to," or "adjacent to," another element, the element may be directly on, connected to, coupled to, or adjacent to, the other element, or one or more other intervening elements may be present. In contrast, when an element is referred to as being "directly on," "directly connected to," "directly coupled to," or "immediately adjacent to," another element there are no intervening elements present.

Figure 1:
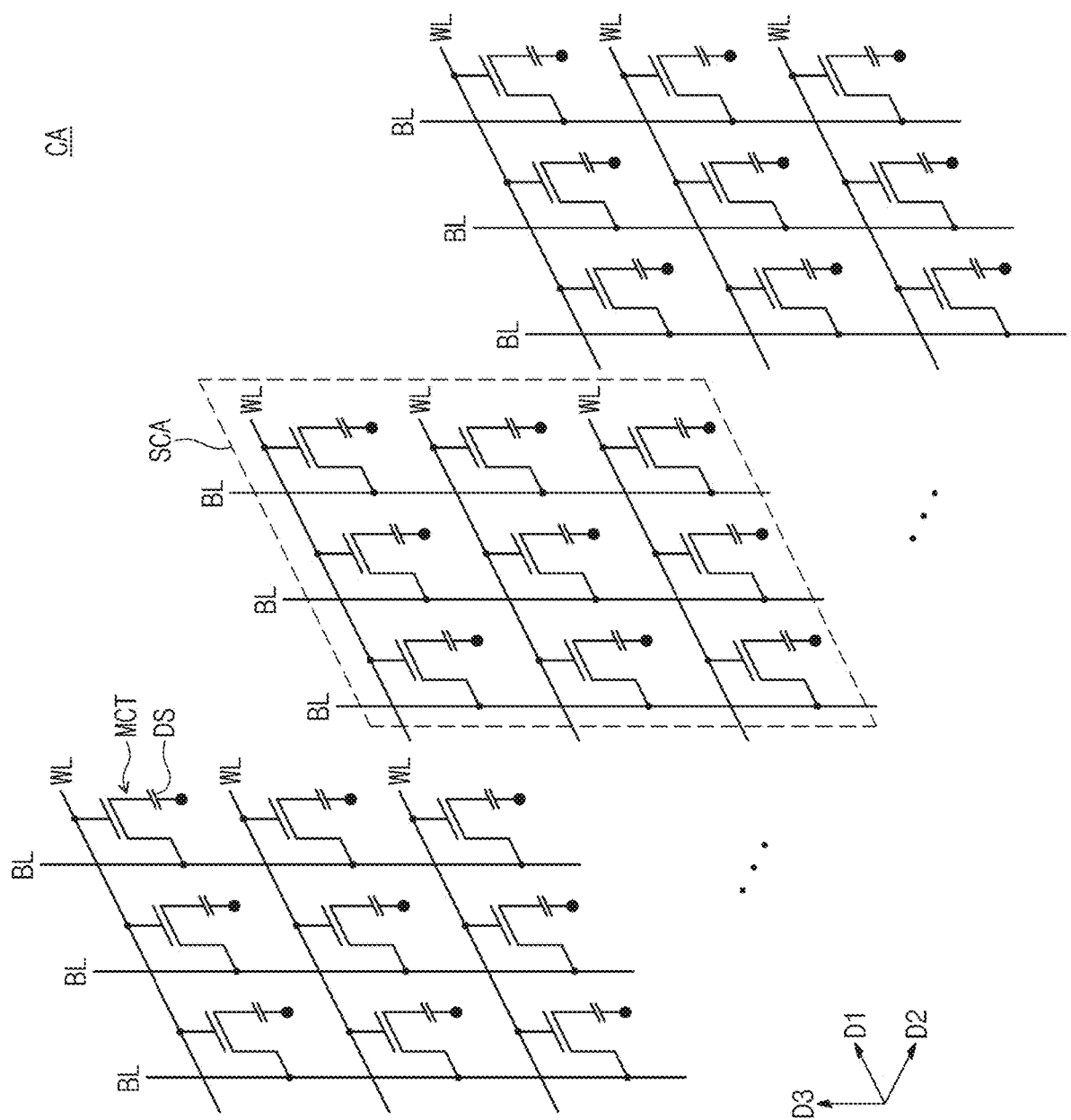
FIG. 1 is a schematic circuit diagram illustrating a cell array of a three-dimensional (3D) semiconductor memory device according to some example embodiments of inventive concepts.

FIG. 1 is a schematic circuit diagram illustrating a cell array of a three-dimensional (3D) semiconductor memory device according to some example embodiments of inventive concepts.

Referring to FIG. 1, a cell array CA of a 3D semiconductor memory device according to some example embodiments of inventive concepts may include a plurality of sub-cell arrays SCA. The sub-cell arrays SCA may be arranged in a second direction D2.

Each of the sub-cell arrays SCA may include a plurality of bit lines BL, a plurality of word lines WL, and a plurality of memory cell transistors MCT. One of the memory cell transistors MCT may be disposed between one of the word lines WL and one of the bit lines BL. The memory cell transistors MCT may be N-type metal oxide semiconductor field effect transistors (MOSFETs); however, example embodiments are not limited thereto.

The bit lines BL may be or include conductive patterns (e.g., metal lines) extending from a substrate in a vertical direction (i.e., a third direction D3). The bit lines BL in each of the sub-cell arrays SCA may be arranged in a first direction D1. The bit lines BL in each of the sub-cell arrays SCA may be spaced apart from each other in the first direction D1.

The word lines WL may be or include conductive patterns (e.g., metal lines and/or polysilicon lines) stacked on the substrate in the third direction D3. Each of the word lines WL may extend in the first direction D1. The word lines WL in each of the sub-cell arrays SCA may be spaced apart from each other in the third direction D3.

A gate of the memory cell transistor MCT may be connected to the word line WL, and a first source/drain of the memory cell transistor MCT may be connected to the bit line BL. A second source/drain of the memory cell transistor MCT may be connected to a data storage element DS. For example, the data storage element DS may be a capacitor. The second source/drain of the memory cell transistor MCT may be connected to a first electrode of the capacitor. There may be other passive components between the second source/drain of the memory cell transistor MCT and the data storage element DS; however, example embodiments are not limited thereto.

FIGS. 2 to 6 are perspective views illustrating 3D semiconductor memory devices according to some example embodiments of inventive concepts.

Figure 2:
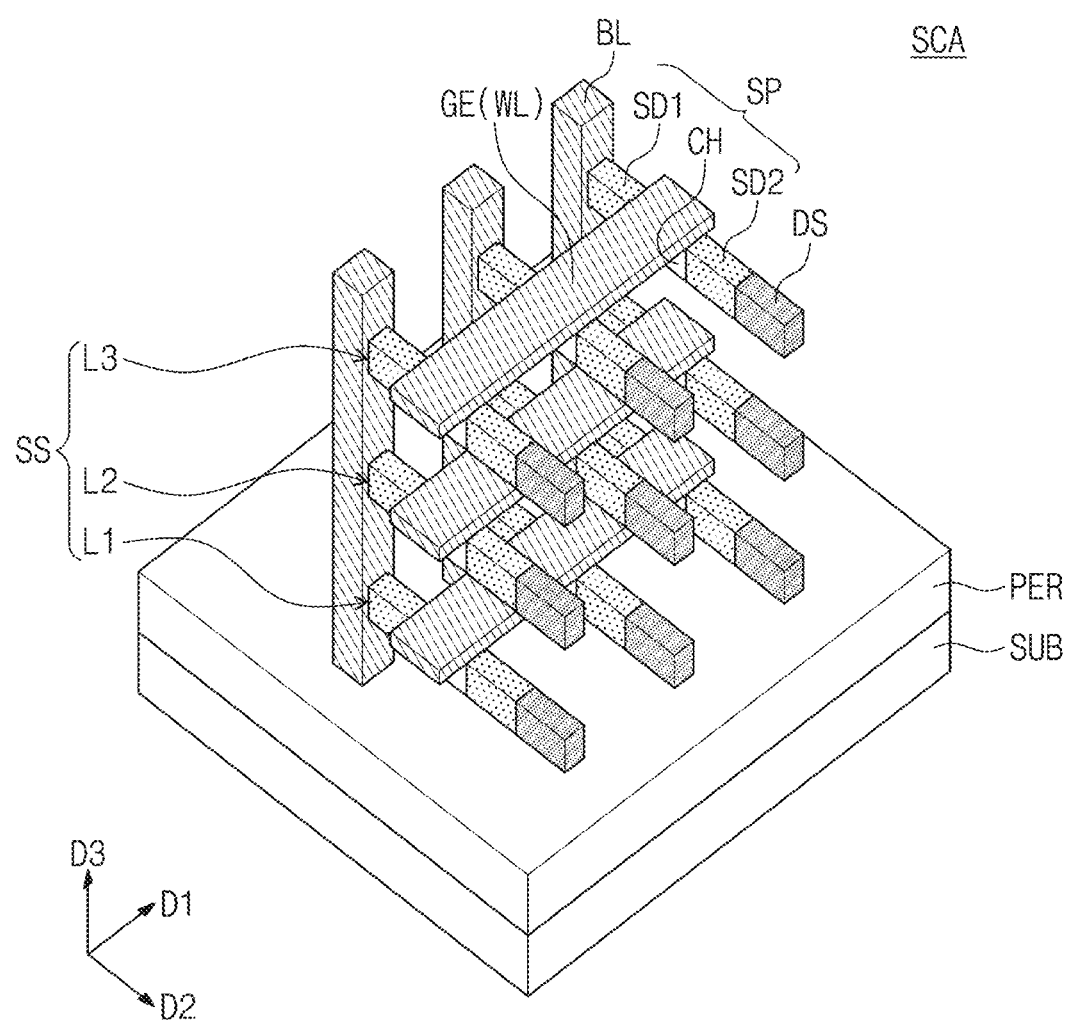
FIGS. 2 to 6 are perspective views illustrating 3D semiconductor memory devices according to some example embodiments of inventive concepts.

Referring to FIGS. 1 and 2, a peripheral circuit region PER may be provided on a substrate SUB. The substrate SUB may be or include a silicon substrate, a germanium substrate, and/or a silicon-germanium substrate. The peripheral circuit region PER may include peripheral transistors provided on the substrate SUB. The peripheral circuit region PER may include a circuit for operating a memory cell array (or a cell array) according to some example embodiments of inventive concepts. For example the peripheral circuit region PER may include address decoder circuitry. The peripheral circuit region PER may include, for example, planar transistors formed within the substrate SUB.

One of the plurality of sub-cell arrays SCA described with reference to FIG. 1 may be provided on, e.g. over or on top of, the peripheral circuit region PER. For example, a stack structure SS including first to third layers L1, L2 and L3 may be provided on the peripheral circuit region PER. The first to third layers L1, L2 and L3 of the stack structure SS may be stacked in a vertical direction (i.e., the third direction D3) and may be spaced apart from each other in the vertical direction (i.e., the third direction D3). Each of the first to third layers L1, L2 and L3 may include a plurality of semiconductor patterns SP, a plurality of data storage elements DS, and a gate electrode GE. Although FIG. 2 illustrates three layers L1, L2, L3, example embodiments are not limited thereto, and there may be more, or fewer, layers in the stack structure SS.

Each of the semiconductor patterns SP may have a line shape or bar shape extending in the second direction D2. The semiconductor patterns SP may include a semiconductor material such as silicon, germanium, and/or silicon-germanium. For example, the semiconductor patterns SP may include poly-silicon and/or single-crystalline silicon.

Each of the semiconductor patterns SP may include a channel region CH, a first dopant region SD1, and a second dopant region SD2. The channel region CH may be disposed between the first and second dopant regions SD1 and SD2. The channel region CH may correspond to a channel of the memory cell transistor MCT described with reference to FIG. 1. The first and second dopant regions SD1 and SD2 may correspond to the first source/drain and the second source/drain of the memory cell transistor MCT described with reference to FIG. 1, respectively.

The first and second dopant regions SD1 and SD2 may be regions of the semiconductor pattern SP, which are doped with dopants such as boron, phosphorus, and/or arsenic. Thus, the first and second dopant regions SD1 and SD2 may have an N-type or P-type conductivity type. The first and second dopant regions SD1 and SD2 may include other dopants such as carbon; however, example embodiments are not limited thereto. The first dopant region SD1 may be formed adjacent to a first end of the semiconductor pattern SP, and the second dopant region SD2 may be formed adjacent to a second end of the semiconductor pattern SP. The second end may be opposite to the first end in the second direction D2.

The data storage elements DS may be connected to, e.g. directly connected to or connected with a passive element therebetween, the second ends of the semiconductor patterns SP, respectively. The data storage elements DS may be connected or directly connected to the second dopant regions SD2 of the semiconductor patterns SP, respectively. The data storage elements DS may be memory elements capable of storing data. Each of the data storage elements DS may be or include, or correspond to, a memory element using a capacitor, a memory element using a magnetic tunnel junction (MTJ) pattern, or a memory element using a variable resistor including a phase-change material. For example, each of the data storage elements DS may be or include a capacitor, and may correspond to capacitors illustrated in FIG. 1.

Each of the gate electrodes GE may have a line or bar shape extending in the first direction D1. The gate electrodes GE may be stacked in the third direction D3 and may be spaced apart from each other in the third direction D3. Each of the gate electrodes GE may intersect the semiconductor patterns SP in each of the layers L1, L2 and L3 and may extend in the first direction D1. In other words/for example, the gate electrodes GE may be the horizontal word lines WL described with reference to FIG. 1.

The gate electrodes GE may include a conductive material. For example, the conductive material may include at least one of a doped semiconductor material (e.g., doped silicon and/or doped germanium such as doped polysilicon), a conductive metal nitride (e.g., titanium nitride or tantalum nitride), a metal (e.g., tungsten, titanium, and/or tantalum), or a metal-semiconductor compound (e.g., tungsten silicide, cobalt silicide, and/or titanium silicide).

A plurality of bit lines BL extending in the vertical direction (e.g., the third direction D3) may be provided on the substrate SUB. Each of the bit lines BL may have a line or pillar shape extending in the third direction D3. The bit lines BL may be arranged in the first direction D1. Each of the bit lines BL may be electrically connected to the first dopant regions SD1 of the semiconductor patterns SP vertically stacked.

The bit lines BL may include a conductive material, and the conductive material may include at least one of a doped semiconductor material, a conductive metal nitride, a metal, and/or a metal-semiconductor compound. The bit lines BL may be the vertical bit lines BL described with reference to FIG. 1.

The first layer L1 of the first to third layers L1, L2 and L3 will be described in detail as a representative example. The semiconductor patterns SP of the first layer L1 may be arranged in the first direction D1. The semiconductor patterns SP of the first layer L1 may be located at the same level. The gate electrode GE of the first layer L1 may intersect the semiconductor patterns SP of the first layer L1 and may extend in the first direction D1. For example, the gate electrode GE of the first layer L1 may be provided on top surfaces of the semiconductor patterns SP, over the semiconductor patterns SP.

Even though not shown in the drawings, a gate insulating layer may be disposed between the gate electrode GE and the channel region CH. The gate insulating layer may include at least one of a high-k dielectric layer, a silicon oxide layer, a silicon nitride layer, or a silicon oxynitride layer. For example, the high-k dielectric layer may include at least one of hafnium oxide, hafnium-silicon oxide, lanthanum oxide, zirconium oxide, zirconium-silicon oxide, tantalum oxide, titanium oxide, barium-strontium-titanium oxide, barium-titanium oxide, strontium-titanium oxide, lithium oxide, aluminum oxide, lead-scandium-tantalum oxide, or lead-zinc niobate.

The bit lines BL may be connected to, e.g. directly connected to, the first ends of the semiconductor patterns SP of the first layer L1, respectively. In some example embodiments, the bit line BL may be connected directly to the first dopant region SD1. In certain example embodiments, the bit line BL may be electrically connected to the first dopant region SD1 through a metal silicide, e.g. a metal silicide may correspond to a passive component between the first dopant region SD1 and the bit line BL. The second layer L2 and the third layer L3 may be substantially the same as the first layer L1 described above.

Even though not shown in the drawings, empty spaces in the stack structure SS may be filled with an insulating material. For example, the insulating material may include at least one of a silicon oxide layer, a silicon nitride layer, or a silicon oxynitride layer. An interconnection layer electrically connected to the sub-cell array SCA may be provided on the stack structure SS. The interconnection layer may be electrically connected to the peripheral circuit region PER through a through-contact.

In the following example embodiments of FIGS. 3 to 6, the descriptions to the same technical features as mentioned with reference to FIGS. 1 and 2 will be omitted for the purpose of ease and convenience in explanation. In other words, differences between the example embodiments of FIGS. 3 to 6 and the example embodiments of FIG. 2 will be mainly described hereinafter in detail.

Figure 3:
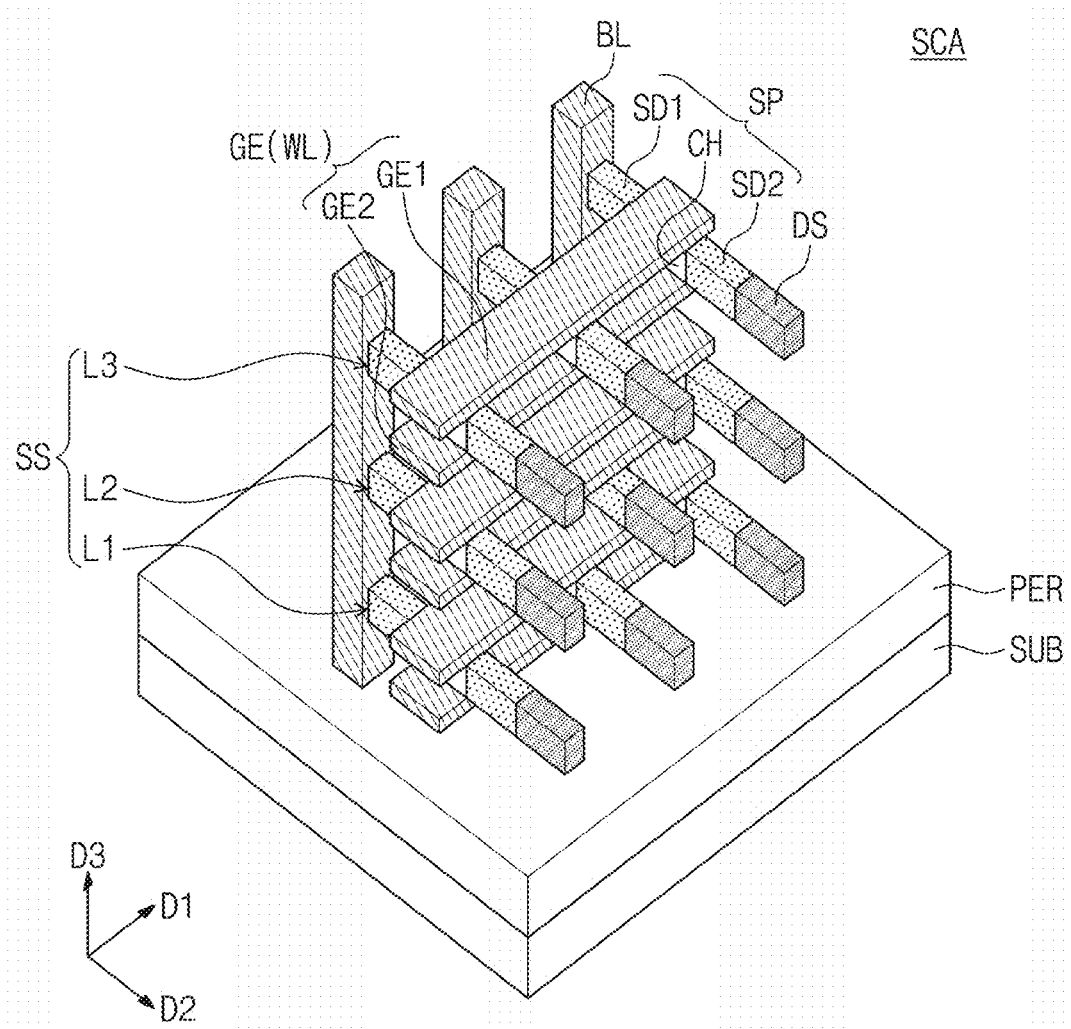

Referring to FIGS. 1 and 3, a gate electrode GE may include a first gate electrode GE1 on a top surface of (e.g. over) the semiconductor pattern SP, and a second gate electrode GE2 on a bottom surface of (e.g. below) the semiconductor pattern SP. For example, a memory cell transistor according to some example embodiments may be a double gate transistor in which the gate electrode GE is provided on both surfaces of the channel region CH.

Figure 4:
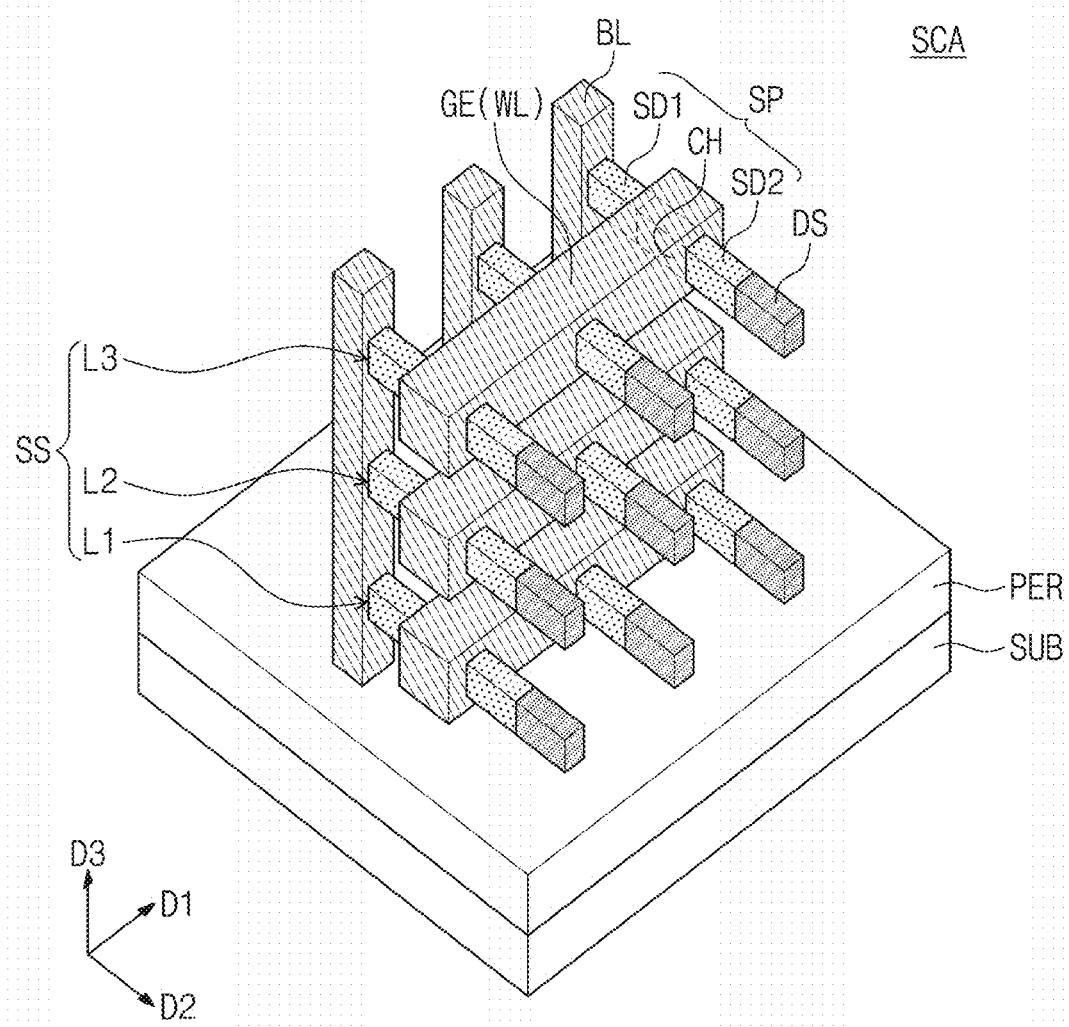

Referring to FIGS. 1 and 4, a gate electrode GE may surround the channel region CH of the semiconductor pattern SP. The gate electrode GE may be provided on a top surface, a bottom surface and both sidewalls of the channel region CH. For example, a memory cell transistor according to some example embodiments may be a gate-all-around (GAA) transistor in which the gate electrode GE surrounds the channel region CH.

Figure 5:
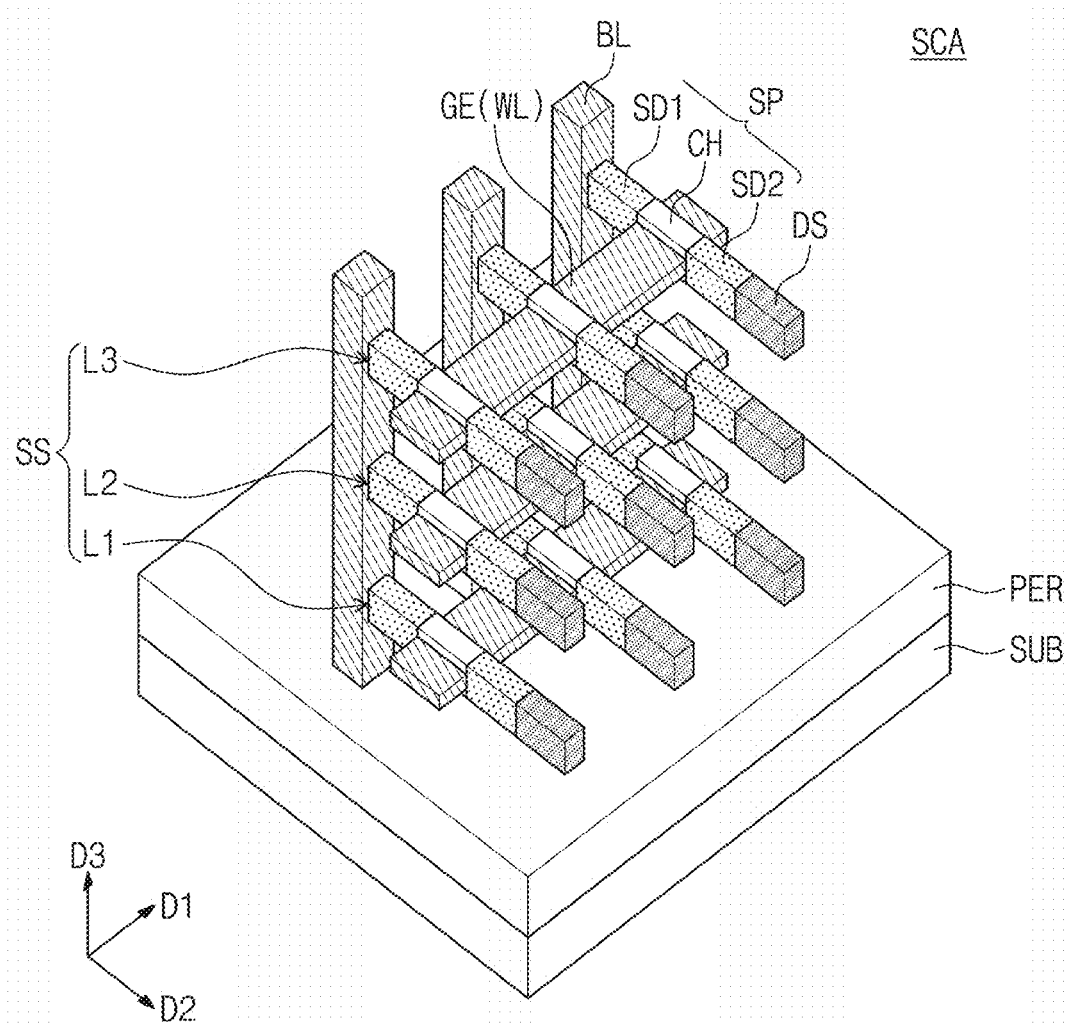

Referring to FIGS. 1 and 5, a gate electrode GE may penetrate the channel region CH of the semiconductor pattern SP and may extend in the first direction D1. The channel region CH may surround the gate electrode GE. For example, a memory cell transistor according to some example embodiments may be a channel-all-around (CAA) transistor in which the channel region CH surrounds the gate electrode GE.

Figure 6:
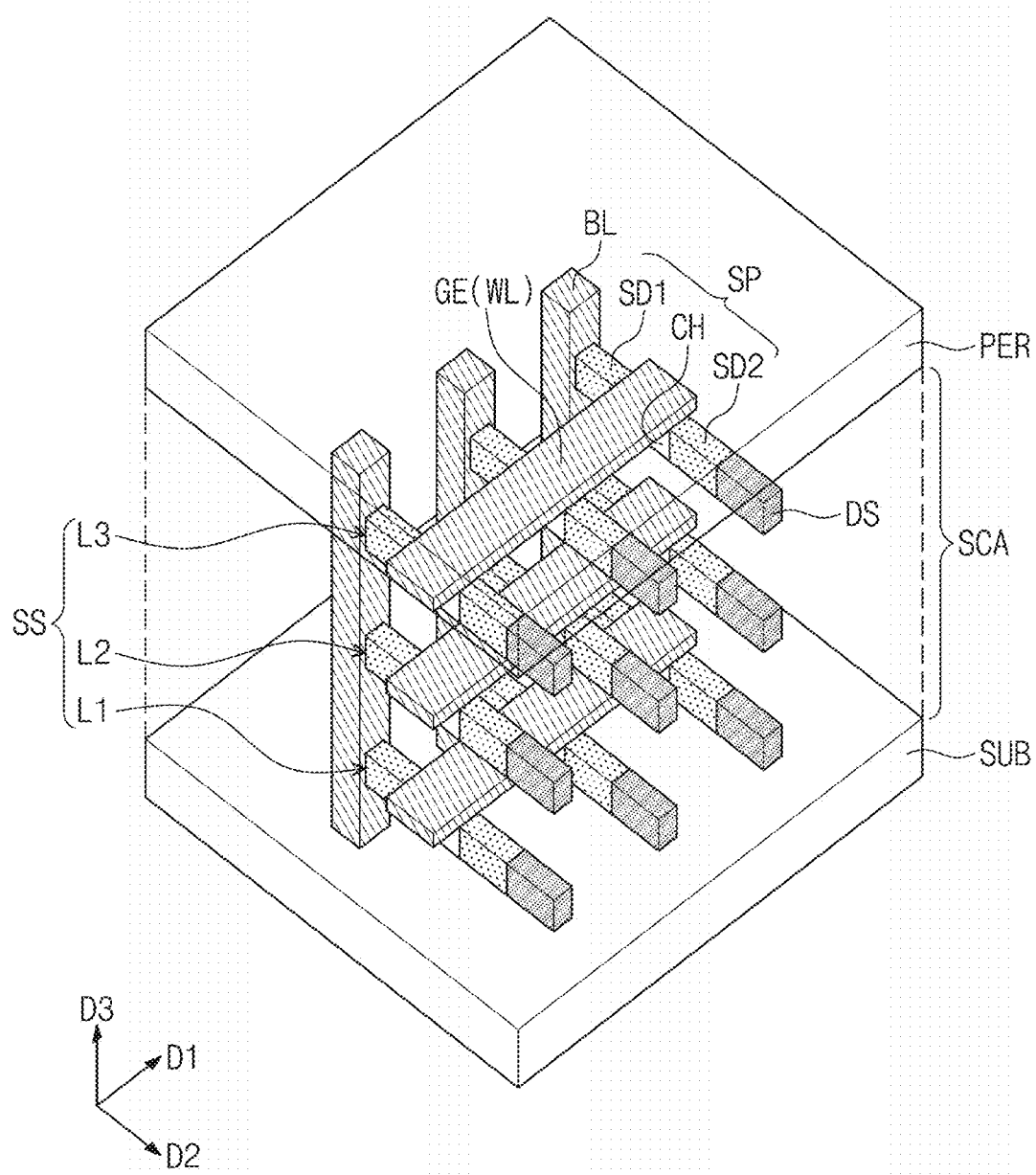

Referring to FIGS. 1 and 6, the sub-cell array SCA may be provided on or above, e.g. directly above, the substrate SUB. The peripheral circuit region PER may be provided on or above, e.g. directly above, the sub-cell array SCA. As described above, the peripheral circuit region PER may include the circuit for operating the sub-cell array SCA, and may include planar transistors.

Figure 7:
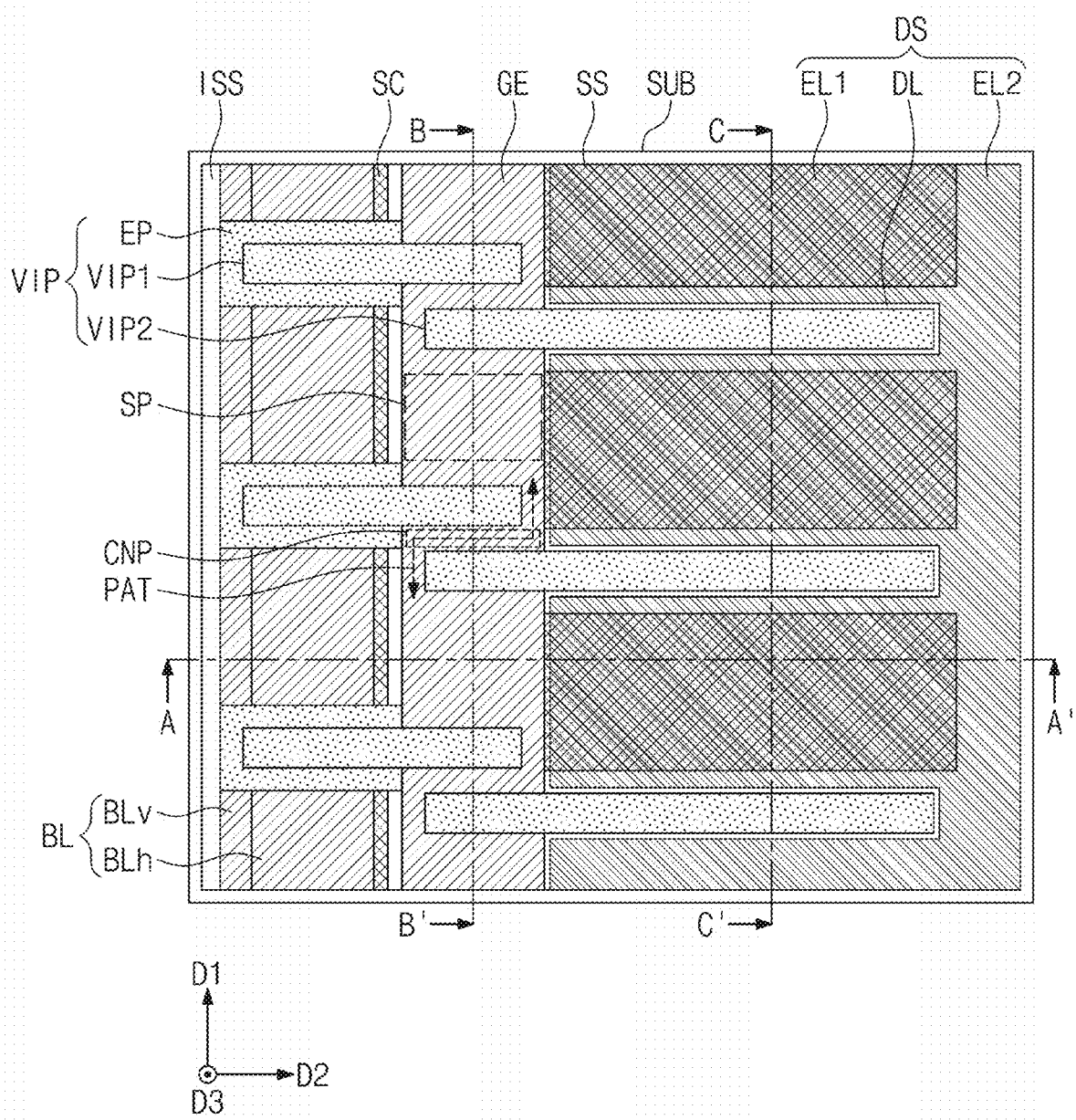
FIG. 7 is a plan view illustrating a 3D semiconductor memory device according to some example embodiments of inventive concepts.
Figure 8A:
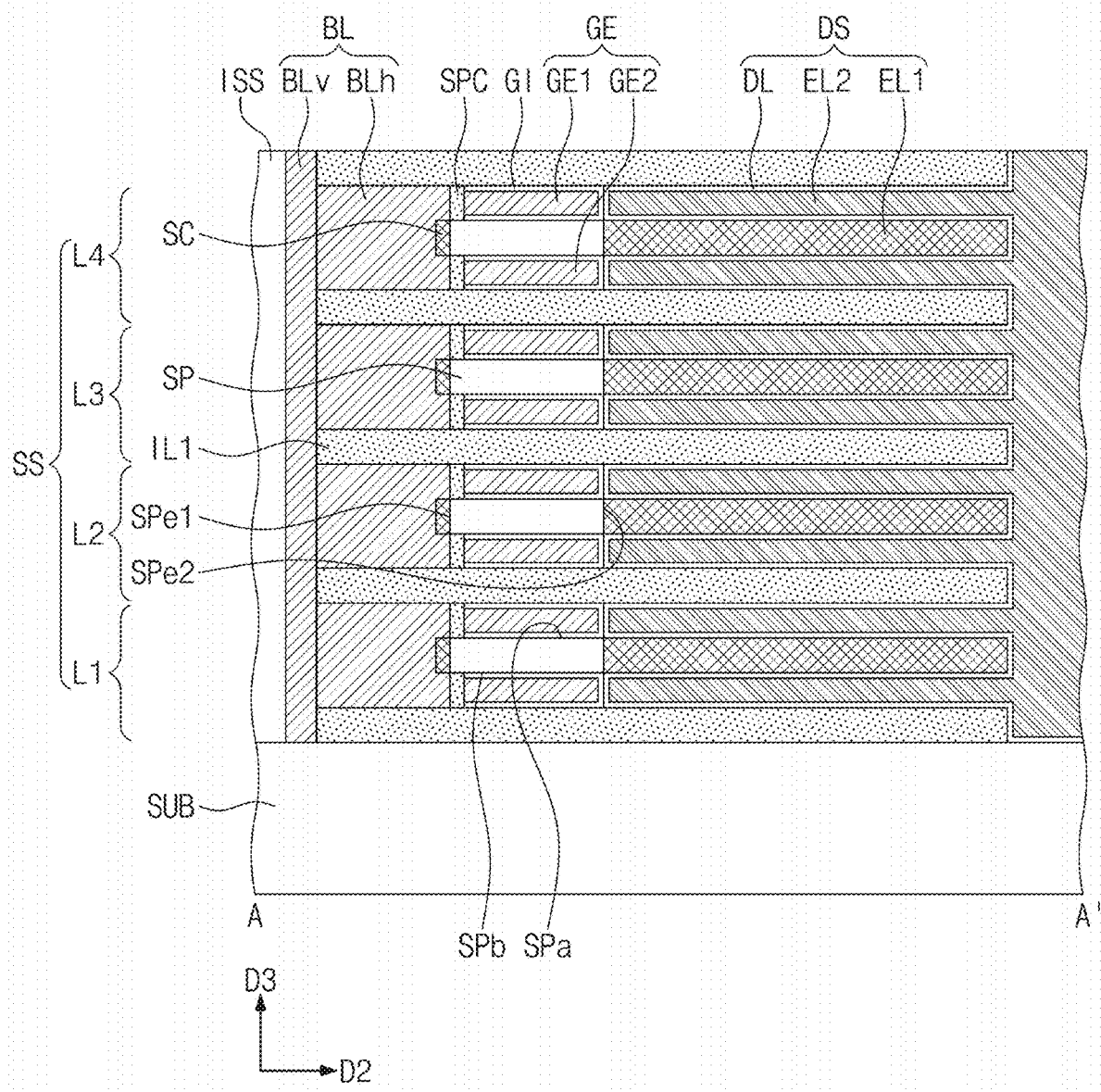
FIGS. 8A, 8B and 8C are cross-sectional views taken along lines A-A', B-B' and C-C' of FIG. 7, respectively.
Figure 8B:
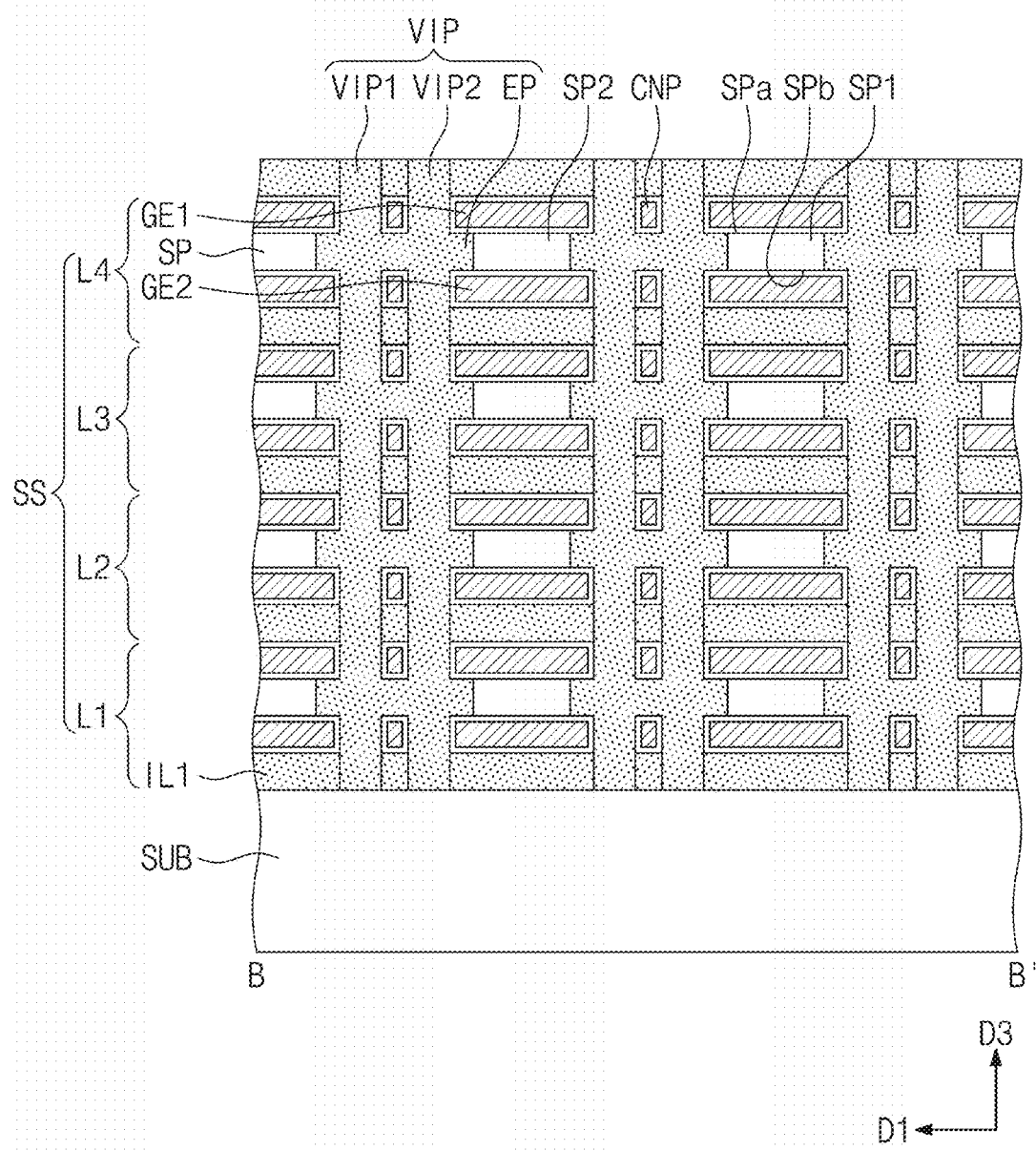
Figure 8C:
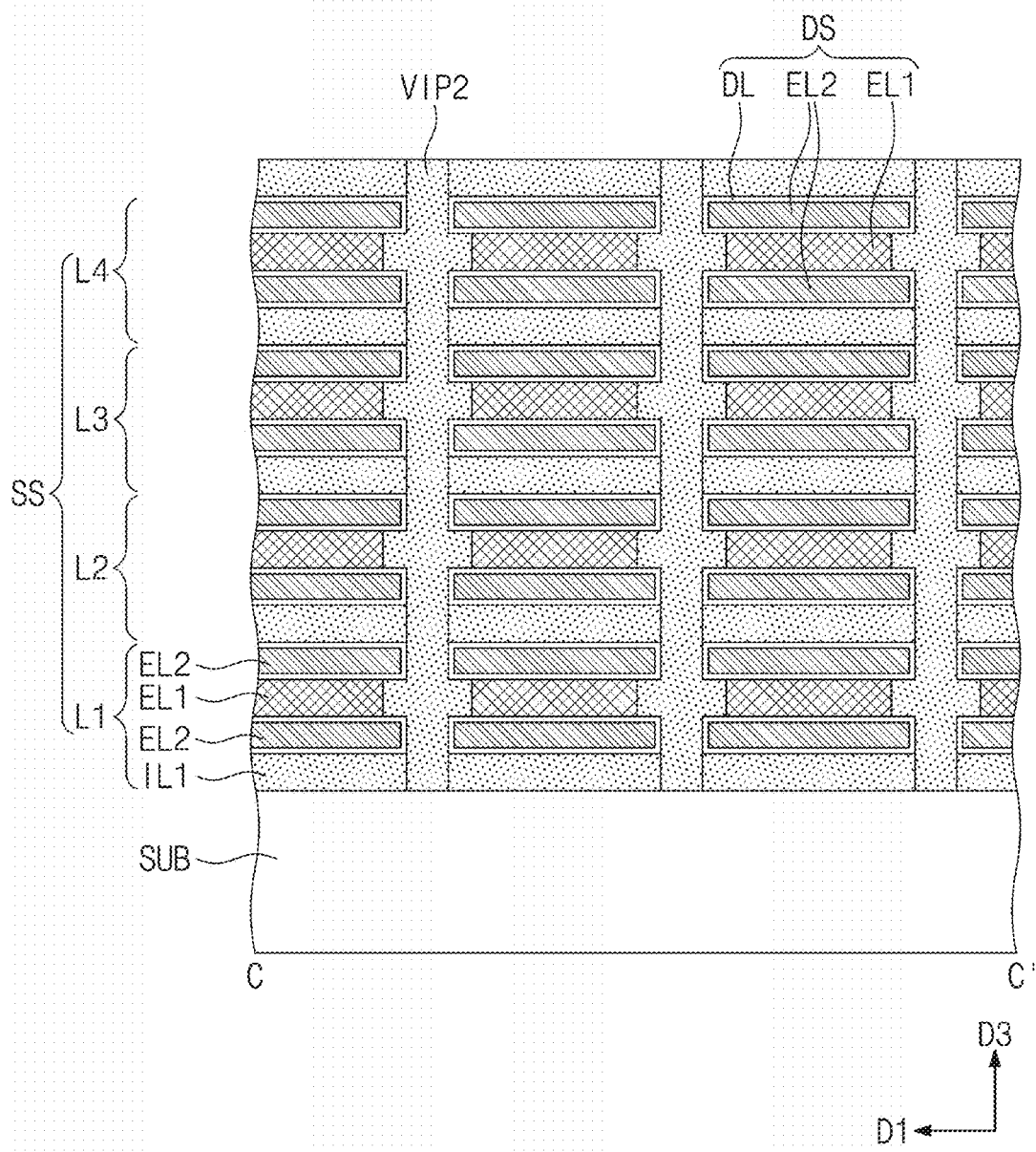

FIG. 7 is a plan view illustrating a 3D semiconductor memory device according to some example embodiments of inventive concepts. FIGS. 8A, 8B and 8C are cross-sectional views taken along lines A-A', B-B' and C-C' of FIG. 7, respectively. In example embodiments, the descriptions to the same technical features as in the example embodiments of FIGS. 1 and 2 will be omitted or mentioned briefly for the purpose of ease and convenience in explanation. In other words, differences between the example embodiments and the example embodiments of FIGS. 1 and 2 will be mainly described hereinafter in detail.

Referring to FIGS. 7 and 8A to 8C, a stack structure SS may be provided on or on top of the substrate SUB. For example, the stack structure SS may extend together with a gate electrode GE in the first direction D1. Even though not shown in the drawings, the stack structure SS may be provided in plurality, and the plurality of stack structures SS may be arranged in the second direction D2.

Referring to FIG. 8A, the stack structure SS may include first to fourth layers L1 to L4 sequentially stacked on the substrate SUB. The stack structure SS may include more than four layers; example embodiments are not limited thereto. Each of the first to fourth layers L1 to L4 may include a first insulating layer IL1, a horizontal portion BLh of a bit line BL, a semiconductor pattern SP, and the gate electrode GE. Each of the first to fourth layers L1 to L4 may further include a data storage element DS electrically connected to the semiconductor pattern SP. The first to fourth layers L1 to L4 according to some example embodiments are illustrated as an example. In certain example embodiments, additional layers may be repeatedly stacked on the fourth layer L4.

The horizontal portion BLh, the semiconductor pattern SP, and the gate electrode GE may be provided on the first insulating layer IL1. The first insulating layer IL1 may vertically separate the horizontal portion BLh of an upper layer from the horizontal portion BLh of a lower layer. In other words/for example, the horizontal portion BLh of the upper layer may be spaced apart from the horizontal portion BLh of the lower layer in the third direction D3 by the first insulating layer IL1. The first insulating layer IL1 may separate the gate electrode GE of the upper layer from the gate electrode GE of the lower layer in the third direction D3.

The gate electrode GE may include at least one of a doped semiconductor material such as doped polysilicon, a conductive metal nitride, a metal, or a metal-semiconductor compound. The semiconductor pattern SP may include a semiconductor material such as silicon, germanium, or silicon-germanium. The first insulating layer IL1 may include at least one of a silicon oxide layer, a silicon nitride layer, a silicon oxynitride layer, a carbon-containing silicon oxide layer, a carbon-containing silicon nitride layer, or a carbon-containing silicon oxynitride layer.

The gate electrode GE of each of the first to fourth layers L1 to L4 may include a first gate electrode GE1 on a first surface SPa of the semiconductor pattern SP (e.g. above the semiconductor pattern SP), and a second gate electrode GE2 on a second surface SPb of the semiconductor pattern SP (e.g. below the semiconductor pattern SP). The second surface SPb may be opposite to the first surface SPa in the third direction D3. For example, the first surface SPa may be a top surface of the semiconductor pattern SP, and the second surface SPb may be a bottom surface of the semiconductor pattern SP.

The first gate electrode GE1 and the second gate electrode GE2 may be vertically spaced apart from each other with the semiconductor pattern SP interposed therebetween. In other words/for example, the semiconductor pattern SP may be sandwiched between the first and second gate electrodes GE1 and GE2 respectively provided thereon and thereunder. The first and second gate electrodes GE1 and GE2 may extend in the first direction D1 and may be parallel to each other. For example, the gate electrode GE of each of the first to fourth layers L1 to L4 may correspond to one of the word lines WL of FIG. 1.

A gate insulating layer GI may be disposed between the semiconductor pattern SP and the first and second gate electrodes GE1 and GE2. The gate insulating layer GI may include at least one of a high-k dielectric layer, a silicon oxide layer, a silicon nitride layer, or a silicon oxynitride layer. The gate insulating layer GI may surround the gate electrodes GE1 and GE2.

A memory cell transistor according to some example embodiments may have a double gate structure in which the first and second gate electrodes GE1 and GE2 are disposed on and under a body (e.g., the semiconductor pattern SP) of a transistor, respectively. In other words/for example, the memory cell transistor according to some example embodiments may be the double gate transistor described above with reference to FIG. 3. Since the memory cell transistor according to some example embodiments has the double gate structure, channel controllability of the gate electrode GE may be improved.

Referring to FIGS. 7 and 8B, a plurality of vertical insulators VIP may be provided to penetrate the stack structure SS. Each of the vertical insulators VIP may extend in the second direction D2. The vertical insulators VIP may be arranged in the first direction D1. The vertical insulator VIP may include at least one of a silicon oxide layer, a silicon nitride layer, a silicon oxynitride layer, a carbon-containing silicon oxide layer, a carbon-containing silicon nitride layer, or a carbon-containing silicon oxynitride layer.

Each of the vertical insulators VIP may include a first vertical insulator VIP1, a second vertical insulator VIP2, and an extension EP. Each of the first and second vertical insulators VIP1 and VIP2 may penetrate the stack structure SS. The extension EP may horizontally extend and may connect, e.g. directly connect, the first and second vertical insulators VIP1 and VIP2 adjacent to each other. The first vertical insulator VIP1 and the second vertical insulator VIP2 may have bar shapes extending in the second direction D2 when viewed in a plan view. The first vertical insulator VIP1 may not be aligned with the second vertical insulator VIP2 in the second direction D2 but may be offset from the second vertical insulator VIP2 in the first direction D1.

Referring to FIG. 8B, the extension EP may be provided at the same level as the semiconductor pattern SP of each of the first to fourth layers L1 to L4. The extension EP may not be provided at a level at which the first insulating layer IL1 is disposed. The extension EP may not be provided at a level at which the first gate electrode GE1 is disposed. The extension EP may not be provided at a level at which the second gate electrode GE2 is disposed.

The semiconductor pattern SP in one layer may be divided into a plurality of semiconductor patterns SP, e.g. a plurality of sub patterns, by the first vertical insulator VIP1, the second vertical insulator VIP2 and the extension EP. For example, a first semiconductor pattern SP1 and a second semiconductor pattern SP2 may be provided in the fourth layer L4. The second semiconductor pattern SP2 may be adjacent to the first semiconductor pattern SP1 in the first direction D1. The first semiconductor pattern SP1 and the second semiconductor pattern SP2 may be separated from each other in the first direction D1 by the first vertical insulator VIP1, the second vertical insulator VIP2, and the extension EP.

Since the extension EP is not provided around the first gate electrode GE1 as described above, a portion of the first gate electrode GE1 may be provided between the first and second vertical insulators VIP1 and VIP2. Since the extension EP is not provided around the second gate electrode GE2, a portion of the second gate electrode GE2 may be provided between the first and second vertical insulators VIP1 and VIP2. The portion of the first gate electrode GE1 between the first and second vertical insulators VIP1 and VIP2 and the portion of the second gate electrode GE2 between the first and second vertical insulators VIP1 and VIP2 may form connection portions CNP, respectively.

For example, referring to FIGS. 7 and 8B, the connection portion CNP of the first gate electrode GE1 may connect (e.g. electrically connect) the first gate electrode GE1 on the first semiconductor pattern SP1 to the first gate electrode GE1 on the second semiconductor pattern SP2. The first gate electrode GE1 on the first semiconductor pattern SP1 and the first gate electrode GE1 on the second semiconductor pattern SP2 may be connected to each other through a path PAT as illustrated in FIG. 7.

As described above, the semiconductor patterns SP in one layer may be separated from each other by the vertical insulators VIP. However, due to the connection portions CNP provided between the first and second vertical insulators VIP1 and VIP2, the gate electrode GE in one layer may not be divided but may extend in the first direction D1.

As a result, the gate electrode GE according to some example embodiments may continuously intersect the semiconductor patterns SP arranged in the first direction D1 in one layer, like the gate electrode GE described above with reference to FIGS. 1 and 2. The gate electrode GE according to some example embodiments may be or correspond to the horizontal word line WL described with reference to FIG. 1.

Referring to FIGS. 7, 8A and 8B, the semiconductor patterns SP of each of the first to fourth layers L1 to L4 may be separated from each other by the vertical insulators VIP and may be arranged in the first direction D1. The semiconductor pattern SP may have a bar shape extending from the bit line BL in the second direction D2 (see FIG. 8A). Even though not shown in the drawings, each of the semiconductor patterns SP may include a channel region, a first dopant region, and a second dopant region. The channel region may be disposed between the first and second dopant regions.

The semiconductor pattern SP may have a first end SPe1 and a second end SPe2 opposite to the first end SPe1 in the second direction D2. The first dopant region may be provided at the first end SPe1, and the second dopant region may be provided at the second end SPe2. The bit line BL may be electrically connected to the first end SPe1 of the semiconductor pattern SP. The data storage element DS may be electrically connected to the second end SPe2 of the semiconductor pattern SP.

Referring to FIGS. 7, 8A and 8C, each of the data storage elements DS may include a first electrode EL1, a dielectric layer DL, and a second electrode EL2. The data storage elements DS of the stack structure SS may share a single dielectric layer DL and a single second electrode EL2. In other words/for example, the first electrode EL1 may be provided in plurality in the stack structure SS, and the single dielectric layer DL may cover surfaces of the first electrodes ELL The single second electrode EL2 may be provided on the single dielectric layer DL. Each of the first electrodes EL1 may have a solid cylinder shape. The second electrode EL2 may be provided on an outer surface of the cylinder of the first electrode EL1.

The first electrodes EL1 may be connected to the semiconductor patterns SP in one layer, respectively. Referring to FIG. 8C, the first electrodes EL1 in one layer may be separated from each other by the second vertical insulator VIP2. The first electrodes EL1 in one layer may be arranged in the first direction D1.

The first electrode EL1 may be connected directly to the second end SPe2 of the semiconductor pattern SP. For example, the first electrode EL1 may include a metal silicide (e.g., cobalt silicide). The second electrode EL2 may include at least one of a metal material (e.g., titanium, tantalum, tungsten, copper, or aluminum), a conductive metal nitride (e.g., titanium nitride or tantalum nitride), or a doped semiconductor material (e.g., doped silicon such as doped polysilicon and/or doped germanium). The dielectric layer DL may include a high-k dielectric material, for example, hafnium oxide, hafnium-silicon oxide, lanthanum oxide, zirconium oxide, zirconium-silicon oxide, tantalum oxide, titanium oxide, barium-strontium-titanium oxide, barium-titanium oxide, strontium-titanium oxide, lithium oxide, aluminum oxide, lead-scandium-tantalum oxide, lead-zinc niobate, or any combination thereof.

Referring to FIGS. 7 and 8A, bit lines BL may be provided to penetrate the stack structure SS. The bit lines BL may be separated from each other by the vertical insulators VIP. The bit lines BL may be arranged in the first direction D1.

Each of the bit lines BL may include the horizontal portions BLh stacked on the substrate SUB, and a vertical portion BLv extending in the third direction D3. The vertical portion BLv may connect the stacked horizontal portions BLh. In other words/for example, the bit line BL according to some example embodiments may be or correspond to the vertical bit line BL described with reference to FIG. 1.

The horizontal portions BLh of the bit line BL may be electrically connected to the stacked semiconductor patterns SP, respectively. A silicide pattern SC may be disposed between the horizontal portion BLh and the first end SPe1 of the semiconductor pattern SP. In other words/for example, the bit line BL may be electrically connected to the semiconductor pattern SP through the horizontal portion BLh and the silicide pattern SC. The silicide pattern SC may include a metal silicide (e.g., cobalt silicide). A spacer SPC may be disposed between the horizontal portion BLh and the gate electrode GE. The spacer SPC may electrically insulate the horizontal portion BLh and the gate electrode GE from each other.

Referring to FIG. 7, the horizontal portion BLh of the bit line BL may not be aligned with the first electrode EL1 of the data storage element DS in the second direction D2 when viewed in a plan view. The horizontal portion BLh may be offset from the first electrode EL1 in the first direction D1.

An insulating structure ISS may be provided to cover sidewalls of the vertical portions BLv of the bit lines BL. The insulating structure ISS may extend in the first direction D1. The insulating structure ISS may include at least one of a silicon oxide layer, a silicon nitride layer, or a silicon oxynitride layer.

FIGS. 9, 11, 13, 15, 17 and 19 are plan views illustrating a method for manufacturing/fabricating a 3D semiconductor memory device, according to some example embodiments of inventive concepts. FIGS. 10, 12, 14A, 16A, 18A and 20A are cross-sectional views taken along lines A-A' of FIGS. 9, 11, 13, 15, 17 and 19, respectively. FIGS. 14B, 16B, 18B and 20B are cross-sectional views taken along lines B-B' of FIGS. 13, 15, 17 and 19, respectively.

Figure 10:
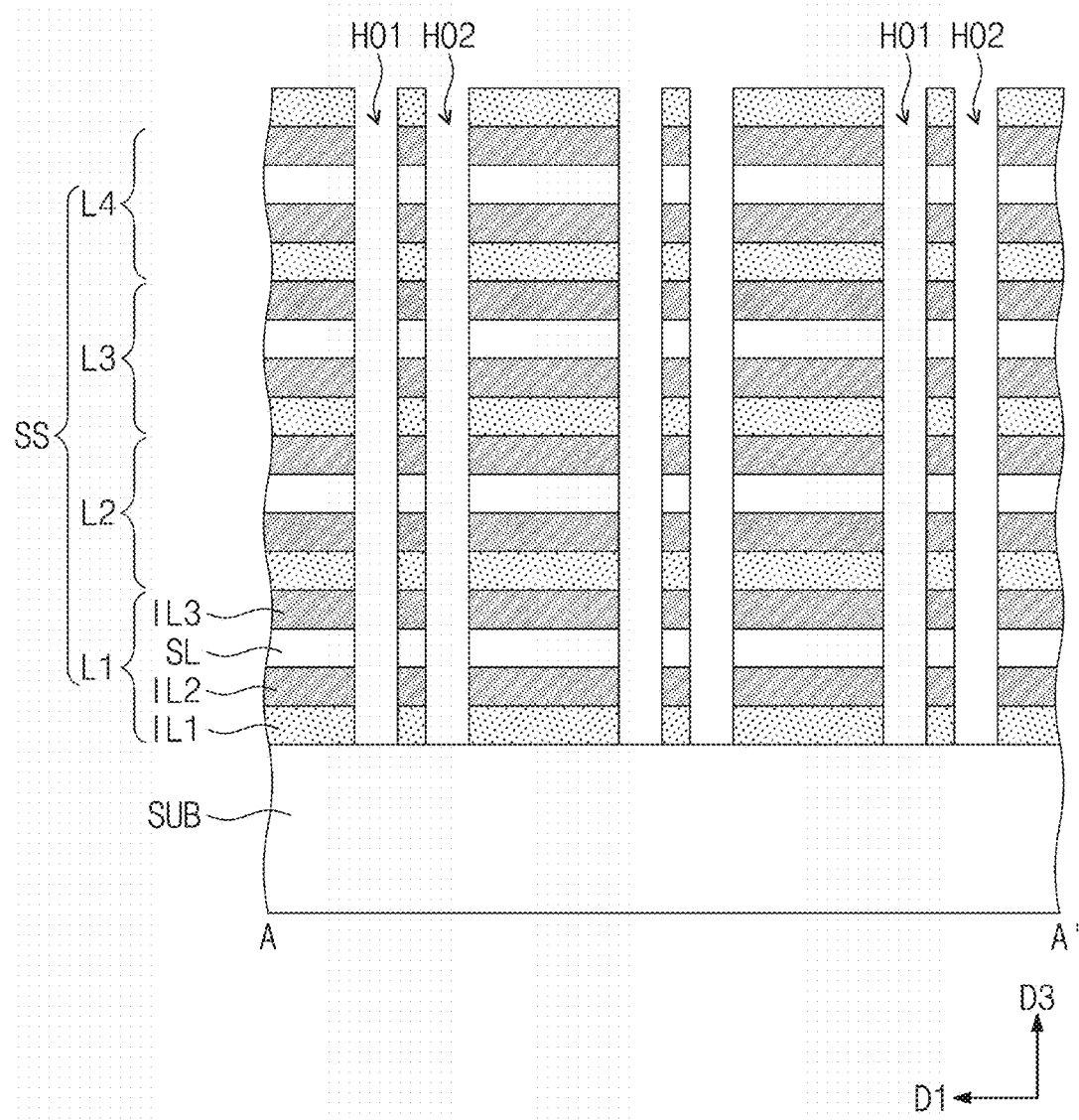
FIGS. 10, 12, 14A, 16A, 18A and 20A are cross-sectional views taken along lines A-A' of FIGS. 9, 11, 13, 15, 17 and 19, respectively.

Referring to FIGS. 9 and 10, a stack structure SS may be formed on a substrate SUB. The formation of the stack structure SS may include sequentially stacking first to fourth layers L1 to L4. Particularly, formation of each of the first to fourth layers L1 to L4 may include forming a first insulating layer IL1, forming a second insulating layer IL2 on the first insulating layer IL1, forming a semiconductor layer SL on the second insulating layer IL2, and forming a third insulating layer IL3 on the semiconductor layer SL. In other words/for example, each of the first to fourth layers L1 to L4 may include the first insulating layer IL1, the second insulating layer IL2, the semiconductor layer SL and the third insulating layer IL3, which are sequentially stacked. In some example embodiments, each of the first to fourth layers L1 to L4 may be formed in one fabrication step, e.g. within one tool and/or within one processing chamber; however, example embodiments are not limited thereto.

In certain example embodiments, the formation of the stack structure SS may include forming first semiconductor layers and second semiconductor layers which are alternately stacked, and replacing each of the second semiconductor layers with the first insulating layer IL1, the second insulating layer IL2 and the third insulating layer IL3. The remaining first semiconductor layer may correspond to the semiconductor layer SL. Here, the first semiconductor layer may be a silicon layer such as a single-crystal silicon layer, and the second semiconductor layer may be a silicon-germanium layer such as a single-crystal silicon-germanium layer.

Each of the first to third insulating layers IL1, IL2 and IL3 may include at least one of a silicon oxide layer, a silicon nitride layer, a silicon oxynitride layer, a carbon-containing silicon oxide layer, a carbon-containing silicon nitride layer, or a carbon-containing silicon oxynitride layer. The second insulating layer IL2 and the third insulating layer IL3 may include the same material; however, example embodiments are not limited thereto. The second and third insulating layers IL2 and IL3 may include a material having an etch selectivity with respect to the first insulating layer IL1. For example, the first insulating layer IL1 may include a silicon oxide layer, and the second and third insulating layers IL2 and IL3 may include silicon nitride layers. The semiconductor layer SL may include a semiconductor material such as silicon, germanium, or silicon-germanium.

The stack structure SS may be patterned to form first holes HO1 and second holes HO2, which penetrate the stack structure SS. The first and second holes HO1 and HO2 may expose a top surface of the substrate SUB. The first and second holes HO1 and HO2 may have bar shapes extending in the second direction D2.

The second hole HO2 may be formed adjacent to the first hole HO1 in the second direction D2. The second hole HO2 may not be aligned with the first hole HO1 in the second direction D2. The second hole HO2 may be alternated with the first hole HO1. For example, the first hole HO1 may be offset from the second hole HO2 in the first direction D1.

The first holes HO1 may be arranged in the first direction D1 at a constant pitch. The second holes HO2 may be arranged in the first direction D1 at a constant pitch. The pitch of the first holes HO1 may be substantially equal to the pitch of the second holes HO2.

Figure 11:
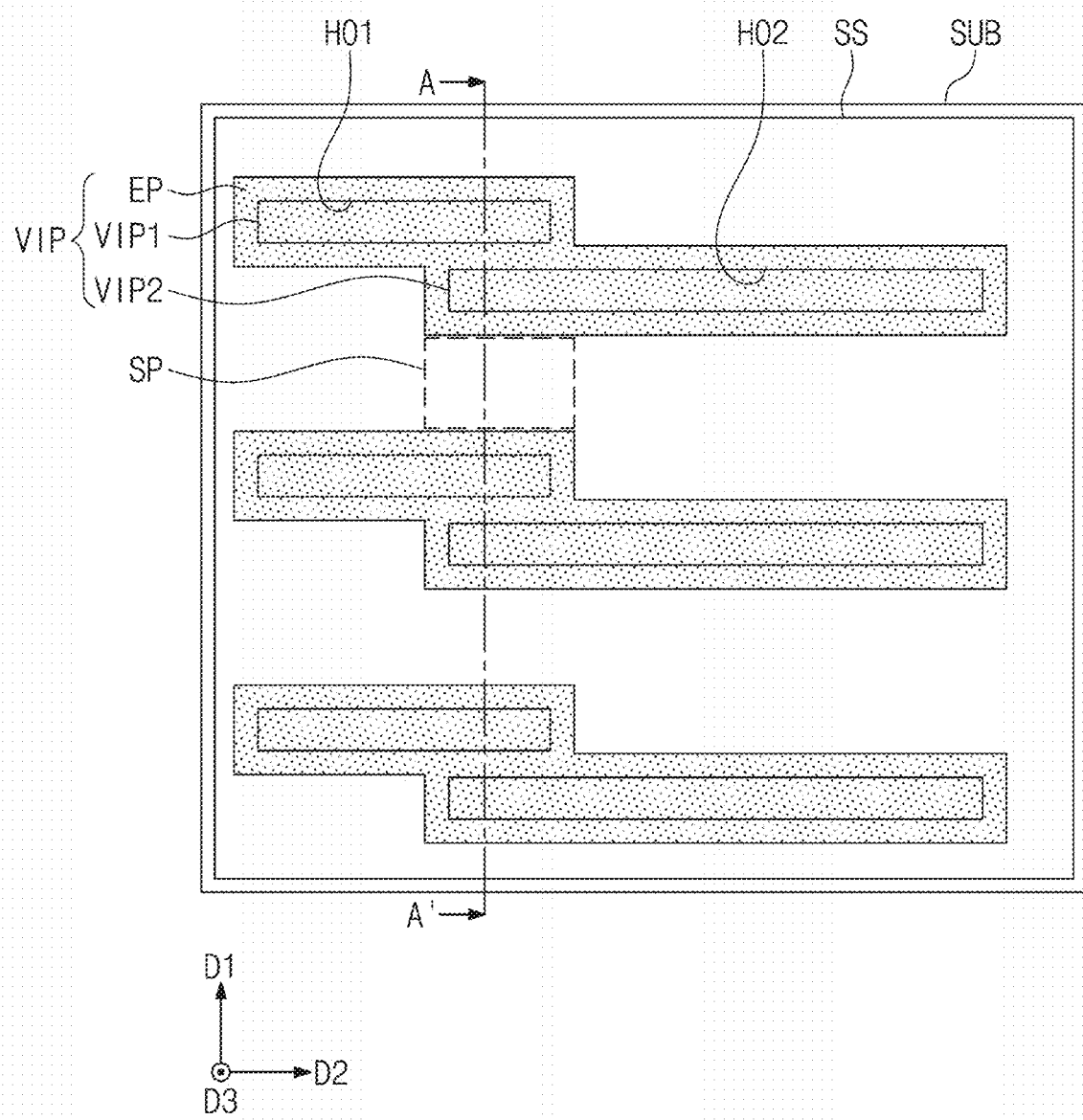
Figure 12:
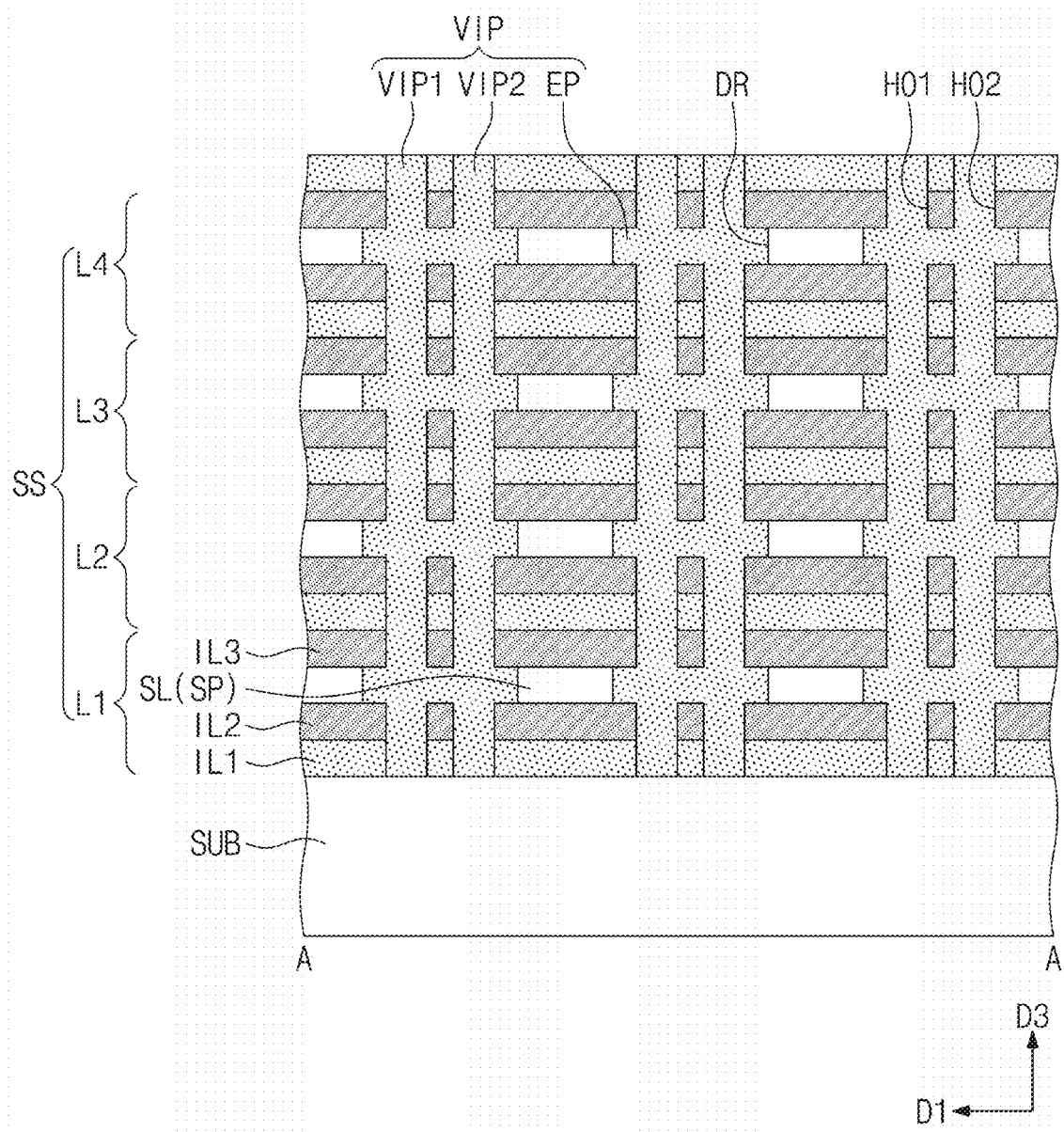

Referring to FIGS. 11 and 12, the semiconductor layers SL exposed by the first and second holes HO1 and HO2 may be partially etched, e.g. partially isotropically etched. For example, a wet etching process of selectively etching the semiconductor layers SL may be performed through the first and second holes HO1 and HO2. The first to third insulating layers IL1, IL2 and IL3 may remain during the wet etching process. The semiconductor layer SL may be partially etched during the wet etching process, thereby forming a depressed region DR. The depressed region DR may connect the first hole HO1 and the second hole HO2 adjacent to each other.

A plurality of vertical insulators VIP may be formed by filling the first and second holes HO1 and HO2 and the depressed regions DR with an insulating material, e.g. filling the first and second holes HO1 and HO2 with a chemical vapor deposition (CVD) process. Each of the vertical insulators VIP may include a first vertical insulator VIP1 filling the first hole HO1, a second vertical insulator VIP2 filling the second hole HO2, and an extension EP filling the depressed region DR. The first vertical insulator VIP1 and the second vertical insulator VIP2 adjacent to each other may be connected to each other by the extension EP. The extension EP may be provided at the same level as the semiconductor layer SL.

The vertical insulator VIP may include at least one of a silicon oxide layer, a silicon nitride layer, a silicon oxynitride layer, a carbon-containing silicon oxide layer, a carbon-containing silicon nitride layer, or a carbon-containing silicon oxynitride layer. The vertical insulator VIP may include a material having an etch selectivity with respect to the first to third insulating layers IL1, IL2 and IL3.

A portion of the first insulating layer IL1 may be disposed between the first vertical insulator VIP1 and the second vertical insulator VIP2 which are adjacent to each other. A portion of the second insulating layer IL2 may be disposed between the first vertical insulator VIP1 and the second vertical insulator VIP2 which are adjacent to each other. A portion of the third insulating layer IL3 may be disposed between the first vertical insulator VIP1 and the second vertical insulator VIP2 which are adjacent to each other.

The vertical insulators VIP may be arranged in the first direction D1 at a constant pitch. The semiconductor layer SL between the vertical insulators VIP adjacent to each other may be defined as a semiconductor pattern SP. In other words/for example, the vertical insulators VIP may divide the semiconductor layer SL into a plurality of the semiconductor patterns SP. The semiconductor patterns SP may be arranged in the first direction D1 at a constant pitch by the vertical insulators VIP.

Figure 13:
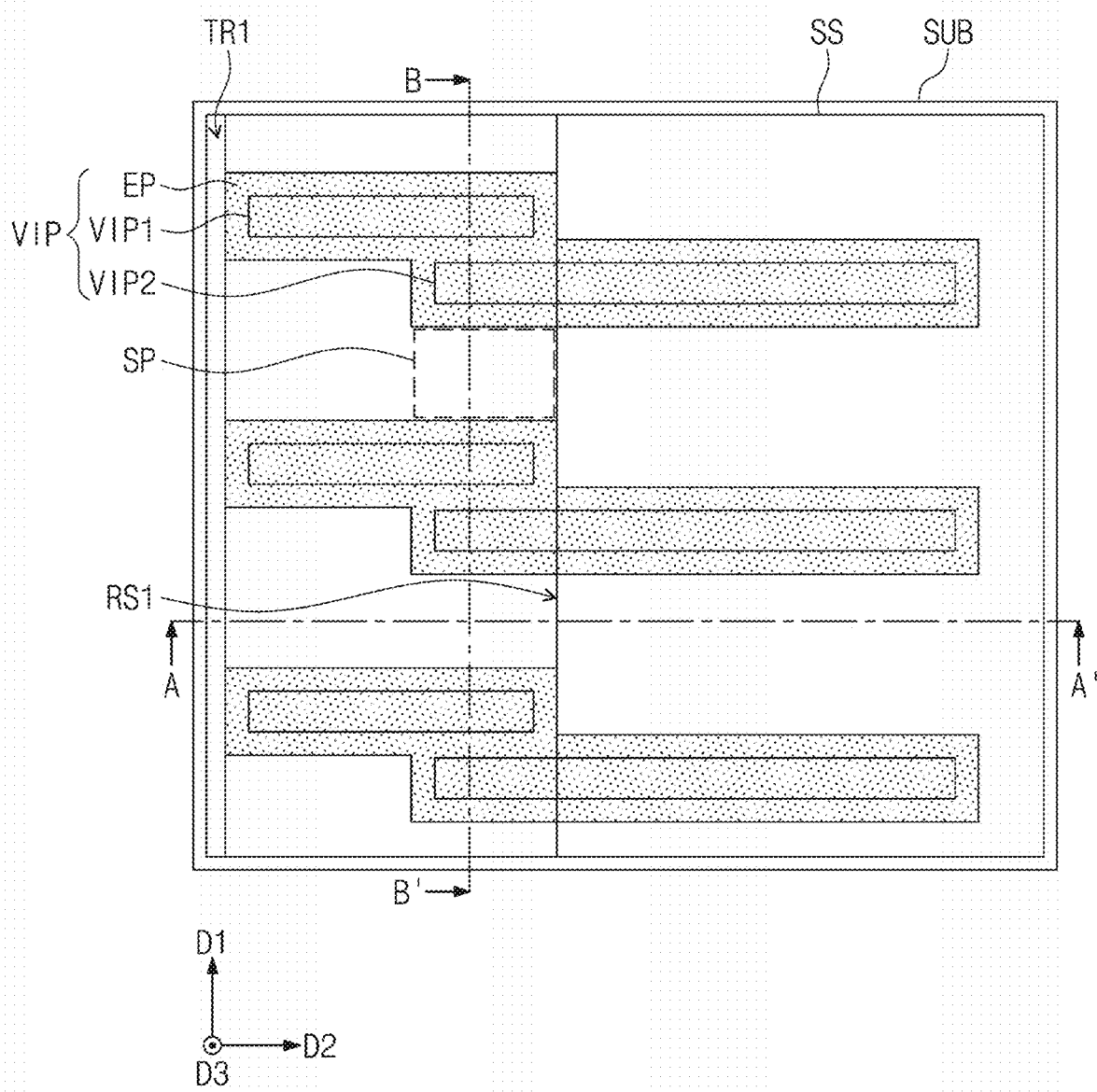
Figure 14A:
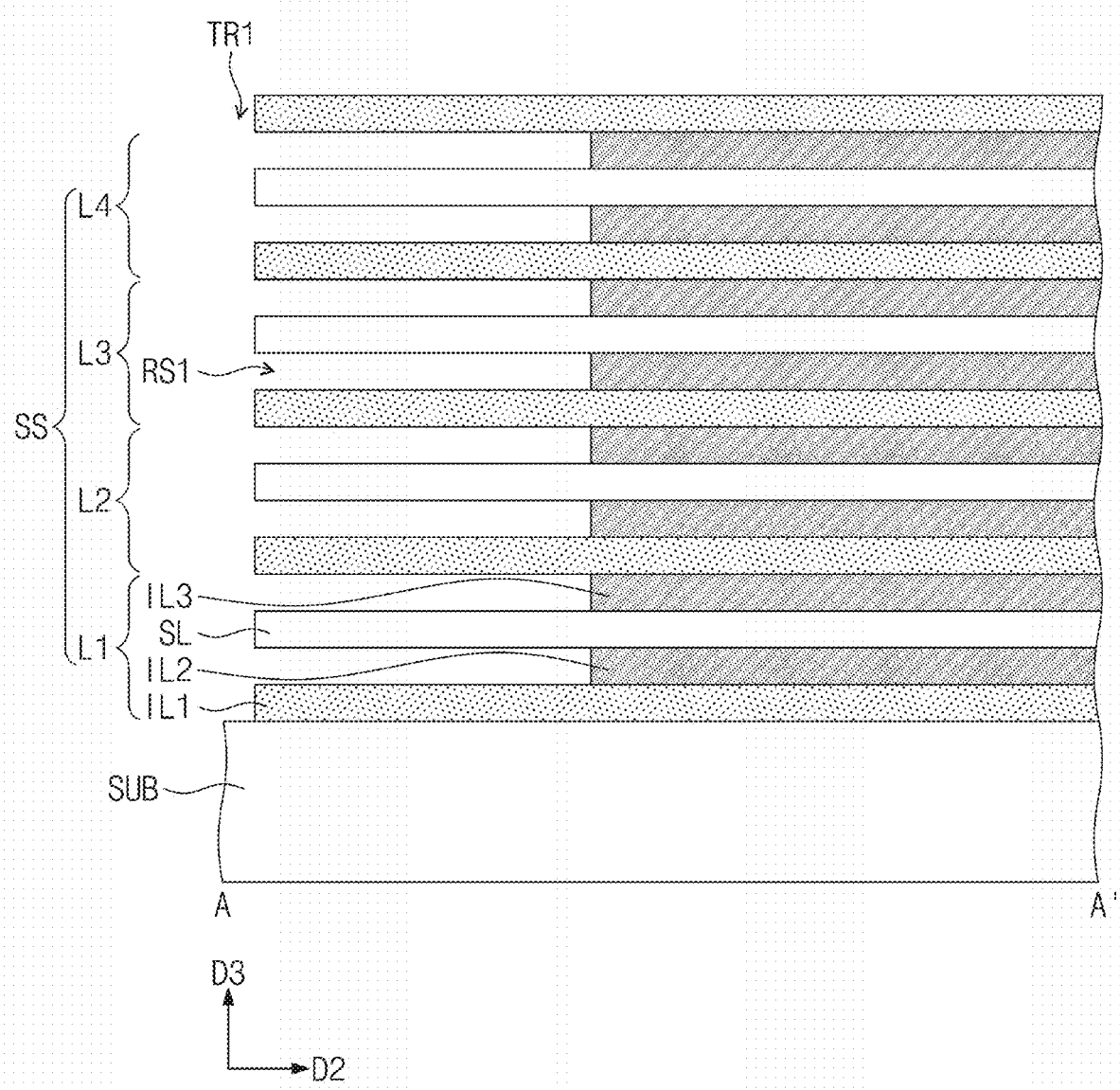
Figure 14B:
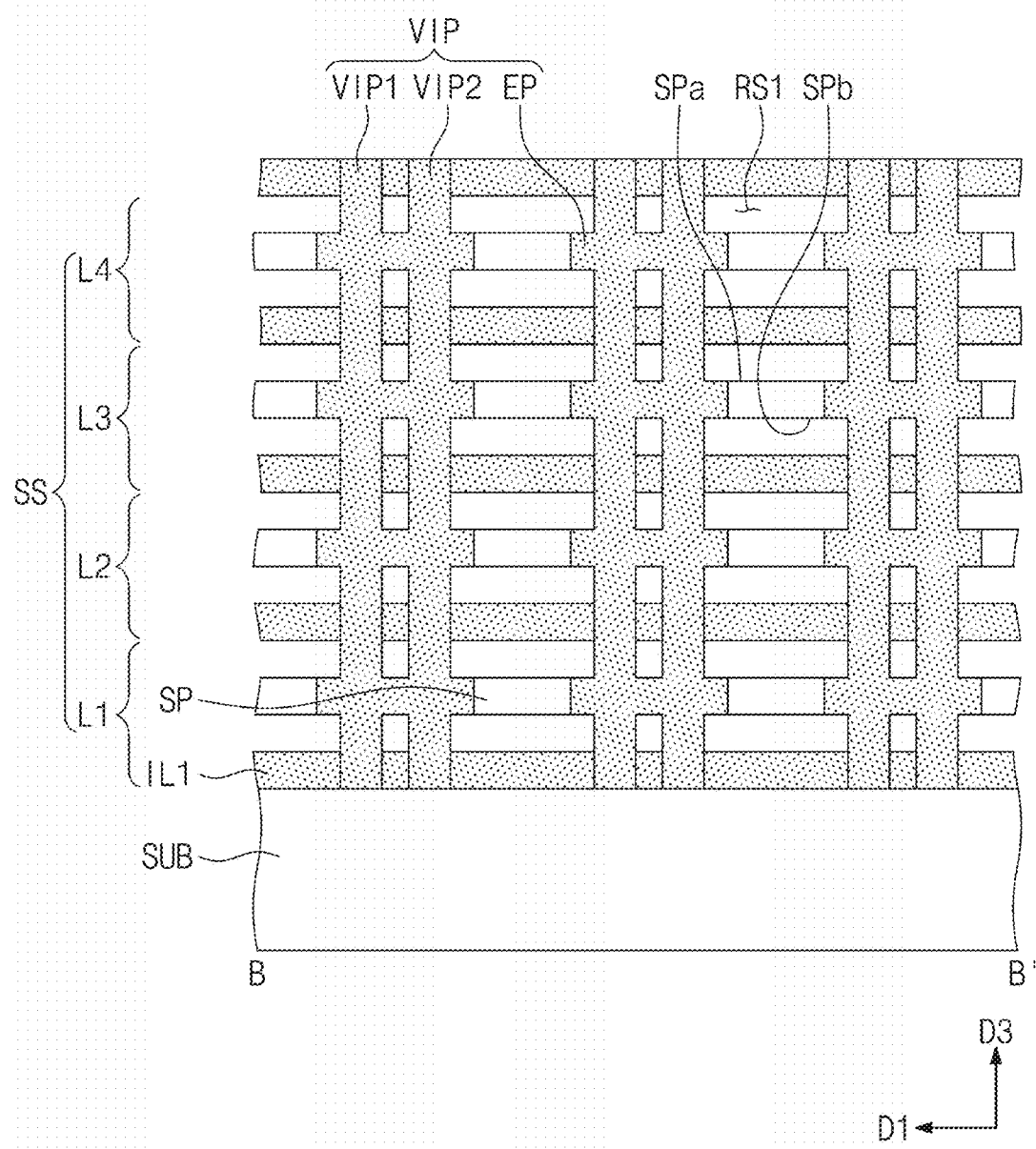
FIGS. 14B, 16B, 18B and 20B are cross-sectional views taken along lines B-B' of FIGS. 13, 15, 17 and 19, respectively.

Referring to FIGS. 13, 14A and 14B, the stack structure SS may be patterned to form a first trench TR1 extending in the first direction D1. The first trench TR1 may expose the top surface of the substrate SUB. A first sidewall of the stack structure SS, which extends in the first direction D1, may be defined by the first trench TR1. The first to third insulating layers IL1, IL2 and IL3 and the semiconductor layers SL of the stack structure SS may be exposed by the first trench TR1.

The second and third insulating layers IL2 and IL3 exposed by the first trench TR1 may be partially etched, e.g. partially etched using an isotropic etching process. For example, a wet etching process of selectively etching the second and third insulating layers IL2 and IL3 may be performed through the first trench TR1. The semiconductor layers SL and the first insulating layers IL1 may remain during the wet etching process.

Since the second and third insulating layers IL2 and IL3 are partially removed, first recesses RS1 may be formed. The first recesses RS1 may extend from the first trench TR1 in the second direction D2. Each of the first recesses RS1 may be deeper in the second direction D2 than the first vertical insulator VIP1. One end of each of the first recesses RS1 may be formed between one end of the first vertical insulator VIP1 and one end of the second vertical insulator VIP2. Each of the first recesses RS1 may expose the semiconductor pattern SP defined between the vertical insulators VIP adjacent to each other. Particularly, a first surface SPa and a second surface SPb of the semiconductor pattern SP between the vertical insulators VIP adjacent to each other may be exposed through the first recesses RS1.

Figure 15:
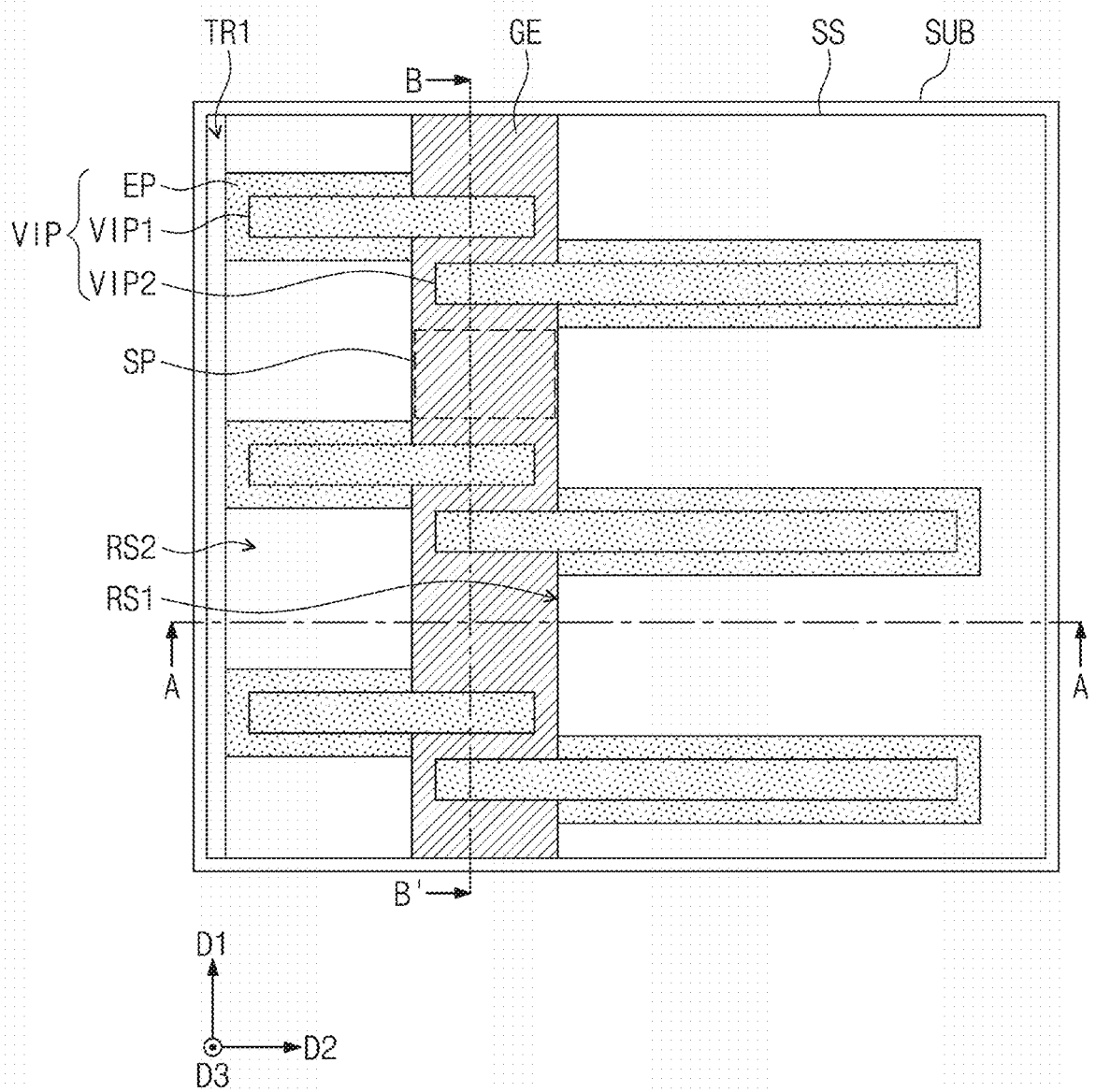
Figure 16A:
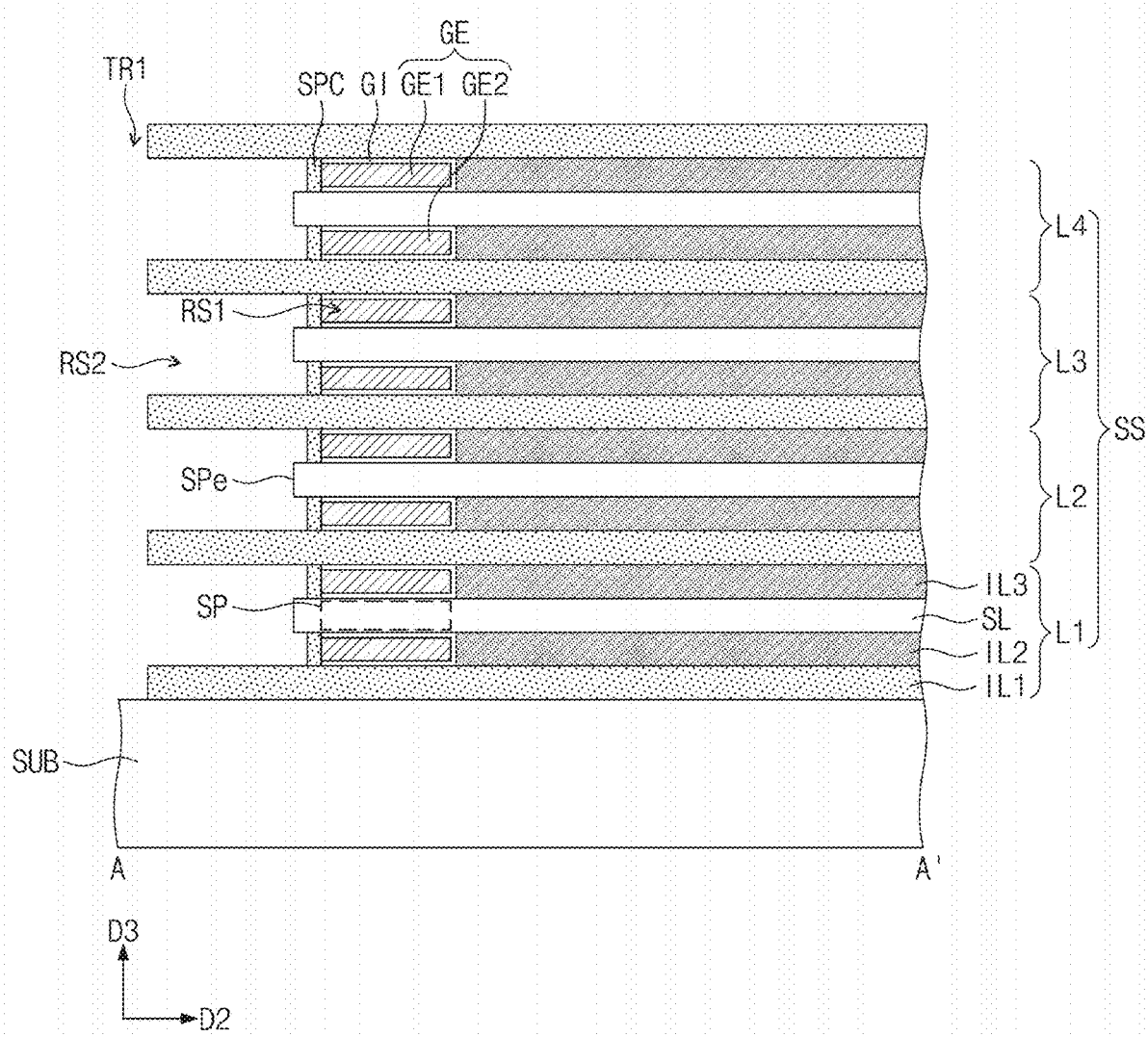
Figure 16B:
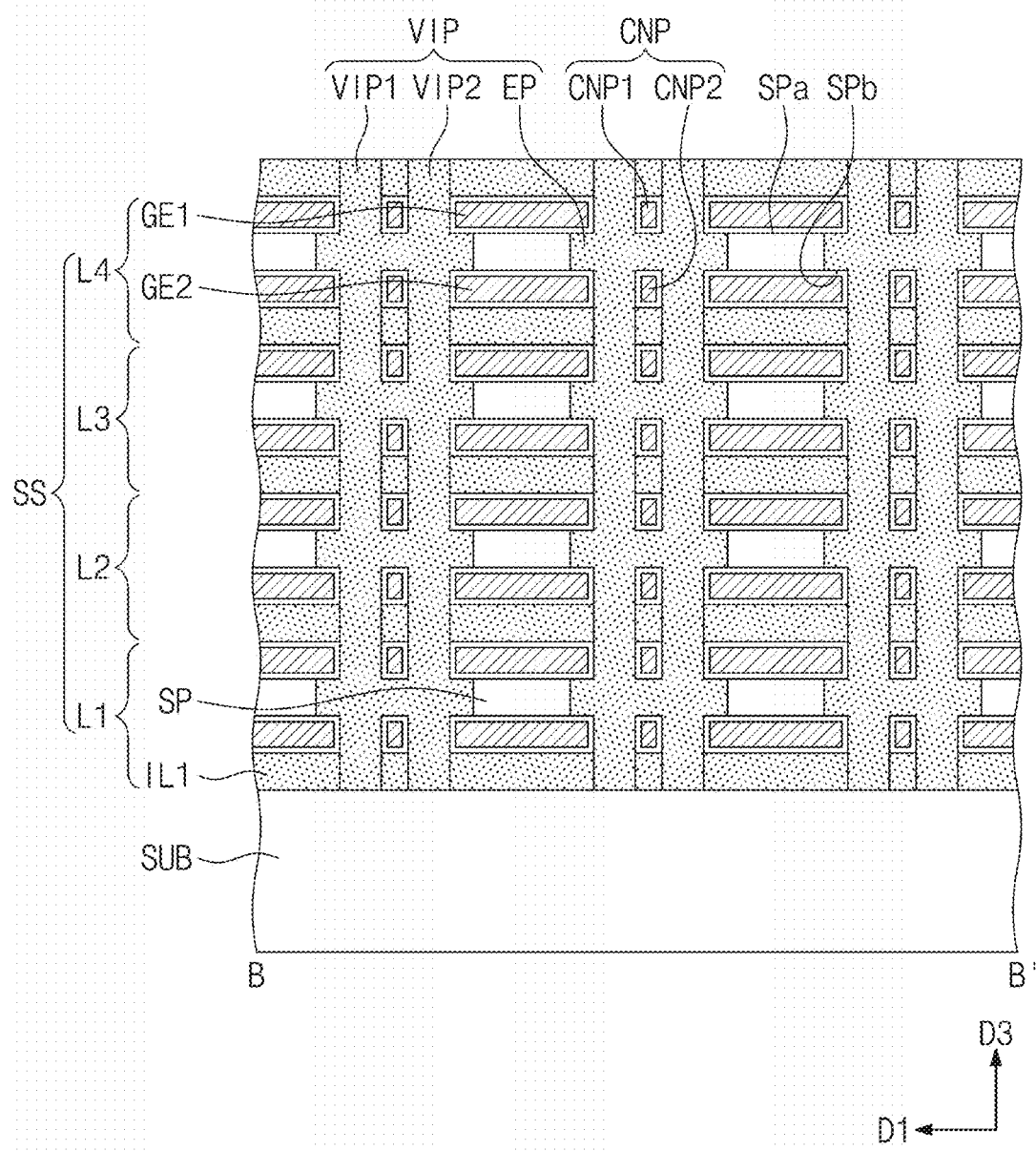

Referring to FIGS. 15, 16A and 16B, a gate insulating layer GI may be conformally formed in the first recesses RS1. The gate insulating layer GI may cover the first surface SPa and the second surface SPb of the semiconductor pattern SP, which are exposed. The gate insulating layer GI may not completely fill the first recesses RS1 but may partially fill the first recesses RS1. The gate insulating layer GI may be formed with a CVD process, such as with a plasma-enhanced CVD (PECVD) process and/or a low-pressure CVD (LPCVD) process.

Gate electrodes GE respectively filling the first recesses RS1 may be formed on the gate insulating layer GI. The gate electrode GE may include a first gate electrode GE1 on the first surface SPa of the semiconductor pattern SP, and a second gate electrode GE2 on the second surface SPb of the semiconductor pattern SP.

A portion CNP1 of the first gate electrode GE1 may be disposed between the first vertical insulator VIP1 and the second vertical insulator VIP2. A portion CNP2 of the second gate electrode GE2 may be disposed between the first vertical insulator VIM and the second vertical insulator VIP2. A portion of the gate electrode GE disposed between the first vertical insulator VIP1 and the second vertical insulator VIP2 may be defined as a connection portion CNP (i.e., CNP1 and CNP2).

The gate insulating layer GI and the gate electrode GE may be recessed through the first trench TR1. A spacer SPC may be formed in a region where the gate electrode GE is recessed. The formation of the spacer SPC may include forming a spacer layer in the first recess RS1, and wet-etching the spacer layer.

Subsequently, the semiconductor layers SL exposed through the first trench TR1 may be partially etched. Since the semiconductor layers SL are etched, a second recess RS2 may be formed in each of the first to fourth layers L1 to L4. The second recess RS2 may be formed in such a way that an end of each of the semiconductor layers SL is adjacent to the spacer SPC. The second recess RS2 may be formed in plurality in one layer. The second recesses RS2 in one layer may be separated from each other in the first direction D1 by the vertical insulators VIP.

Figure 17:
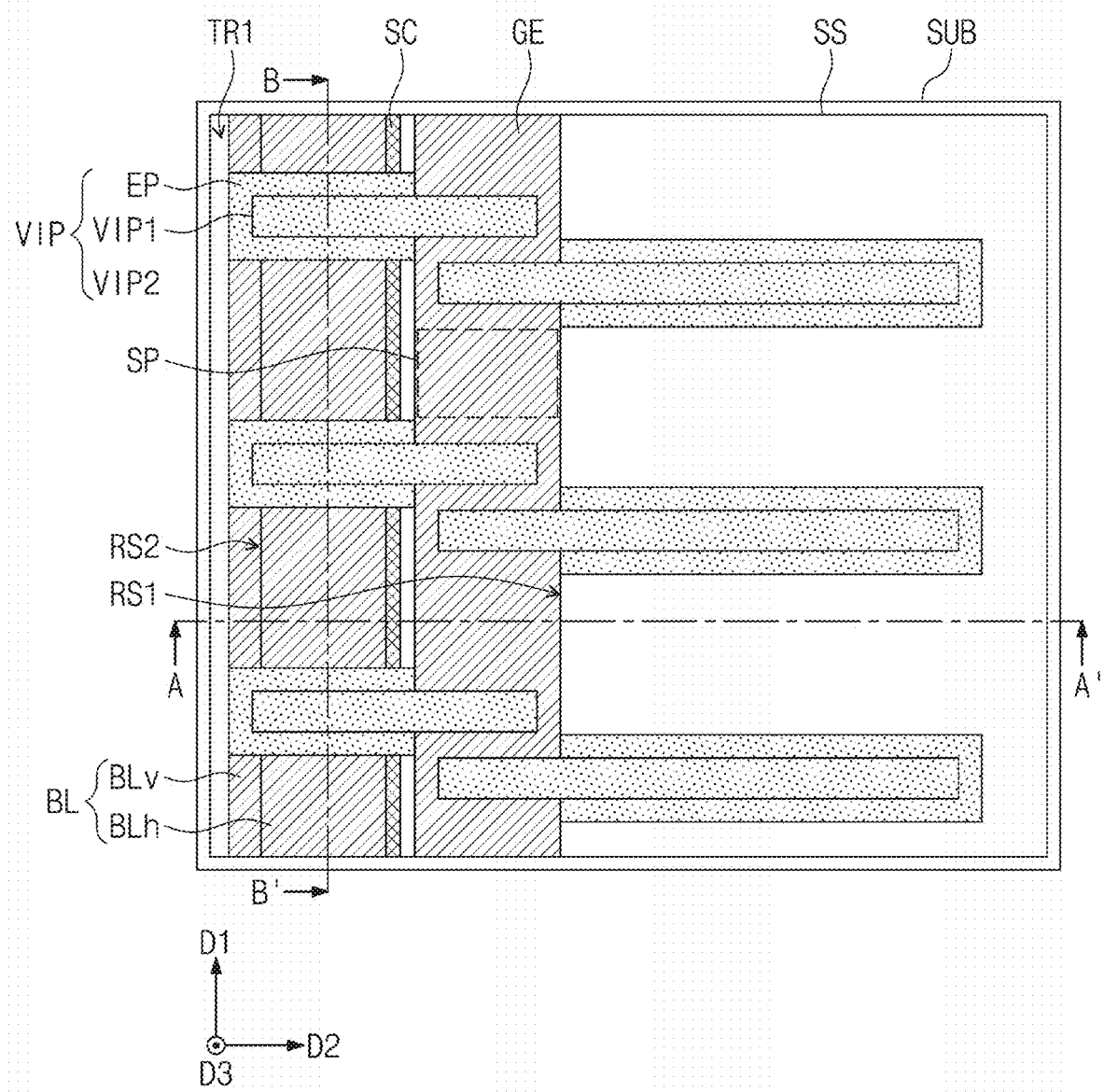
Figure 18A:
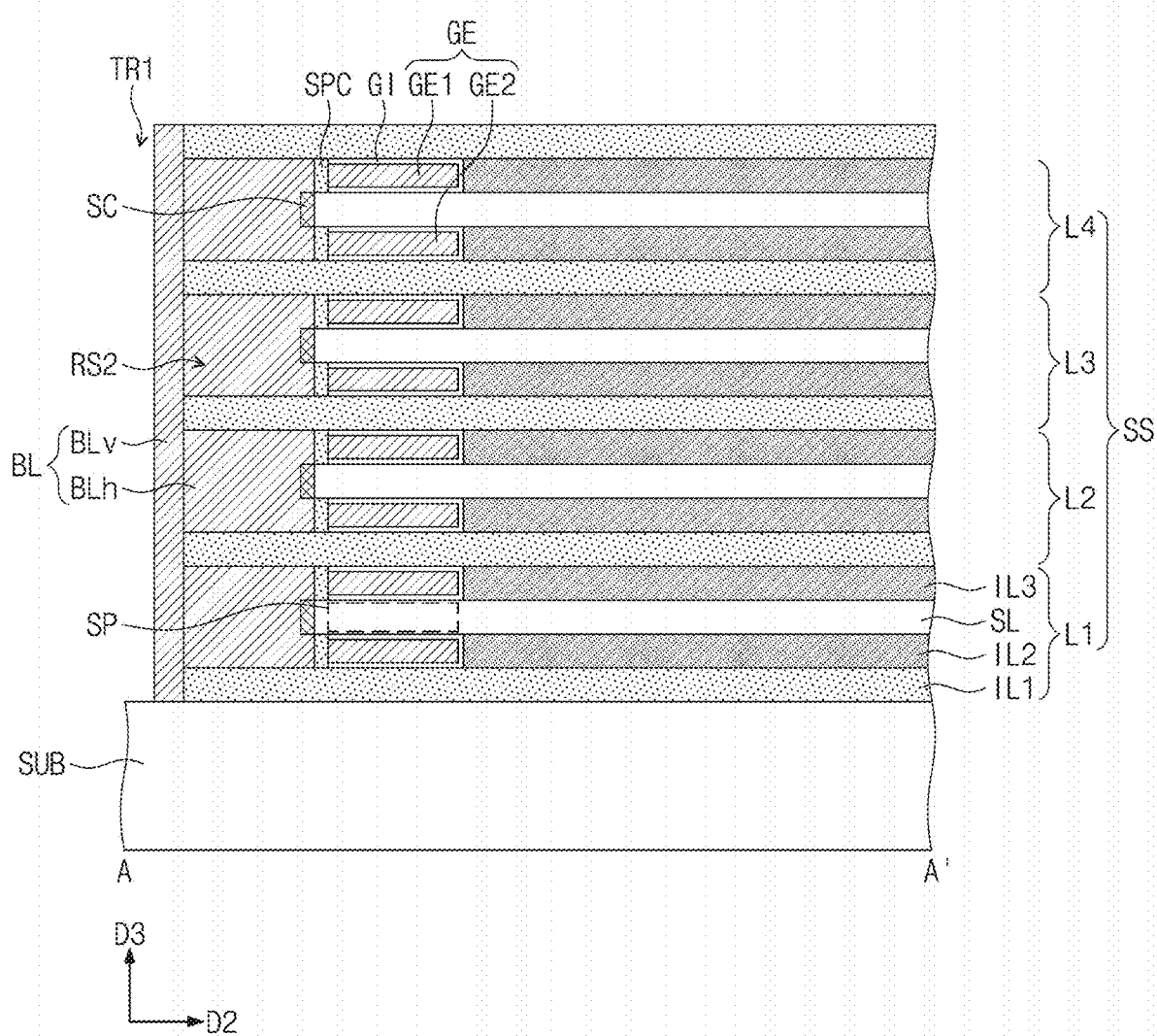
Figure 18B:
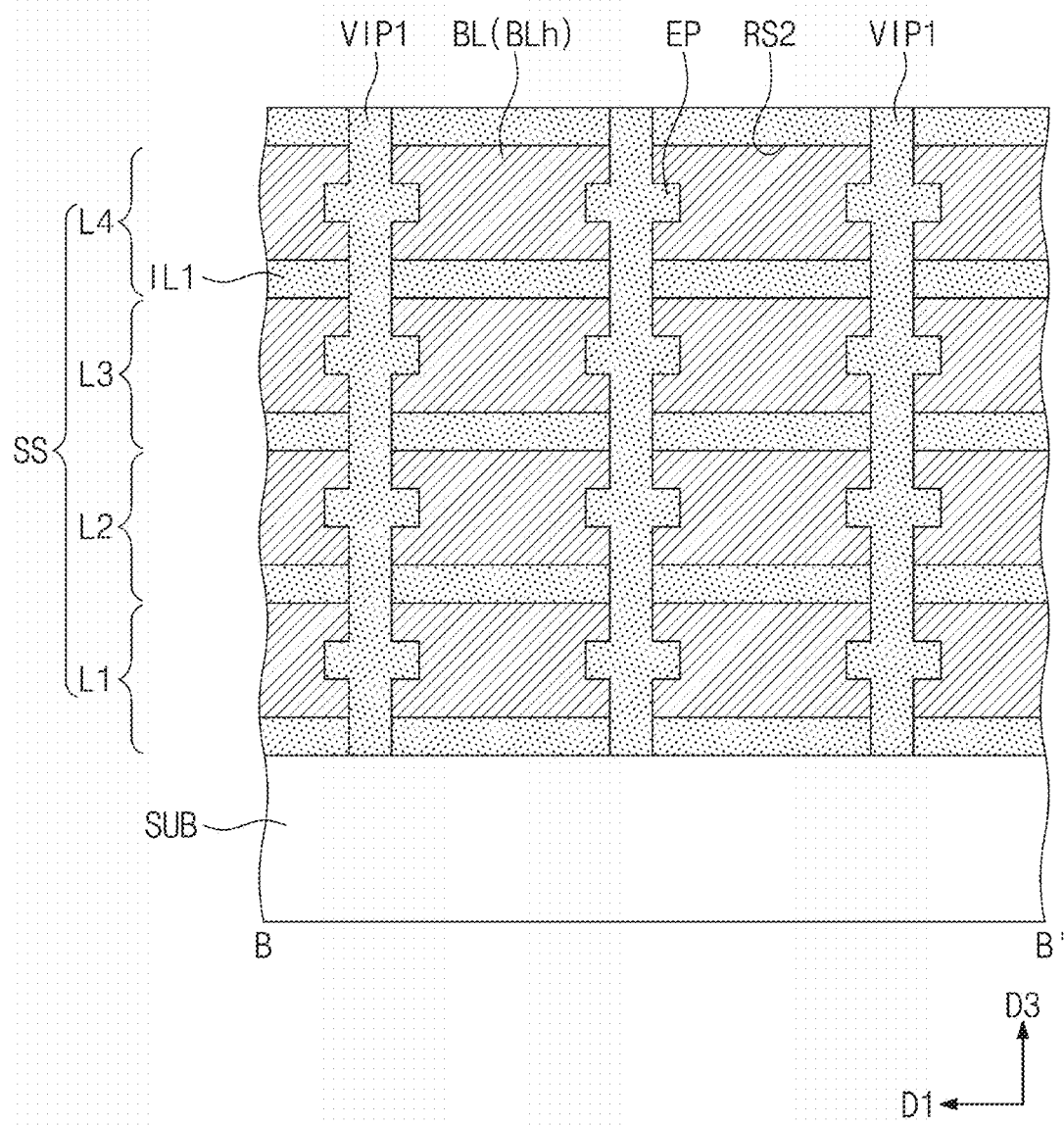

Referring to FIGS. 17, 18A and 18B, horizontal portions BLh of bit lines BL may be formed in the second recesses RS2, respectively. For example, the horizontal portions BLh may be formed by depositing a conductive material in the second recesses RS2. Thereafter, the first insulating layers IL1 may be partially removed through the first trench TR1. A conductive material may be additionally deposited in regions formed by the removal of the first insulating layers ILL thereby forming vertical portions BLv of the bit lines BL. The vertical portion BLv may extend in the third direction D3 and may connect the stacked horizontal portions BLh to each other.

A silicide pattern SC may be formed between the bit line BL and each of the semiconductor patterns SP. The formation of the silicide pattern SC may include performing a silicidation reaction on the semiconductor pattern SP exposed through the second recess RS2.

Even though not shown in the drawings, a first dopant region may be formed in the semiconductor pattern SP. The formation of the first dopant region may include doping the semiconductor pattern SP exposed through the second recess RS2 with dopants, such as boron, phosphorus, and/or arsenic, before the formation of the silicide pattern SC.

Figure 19:
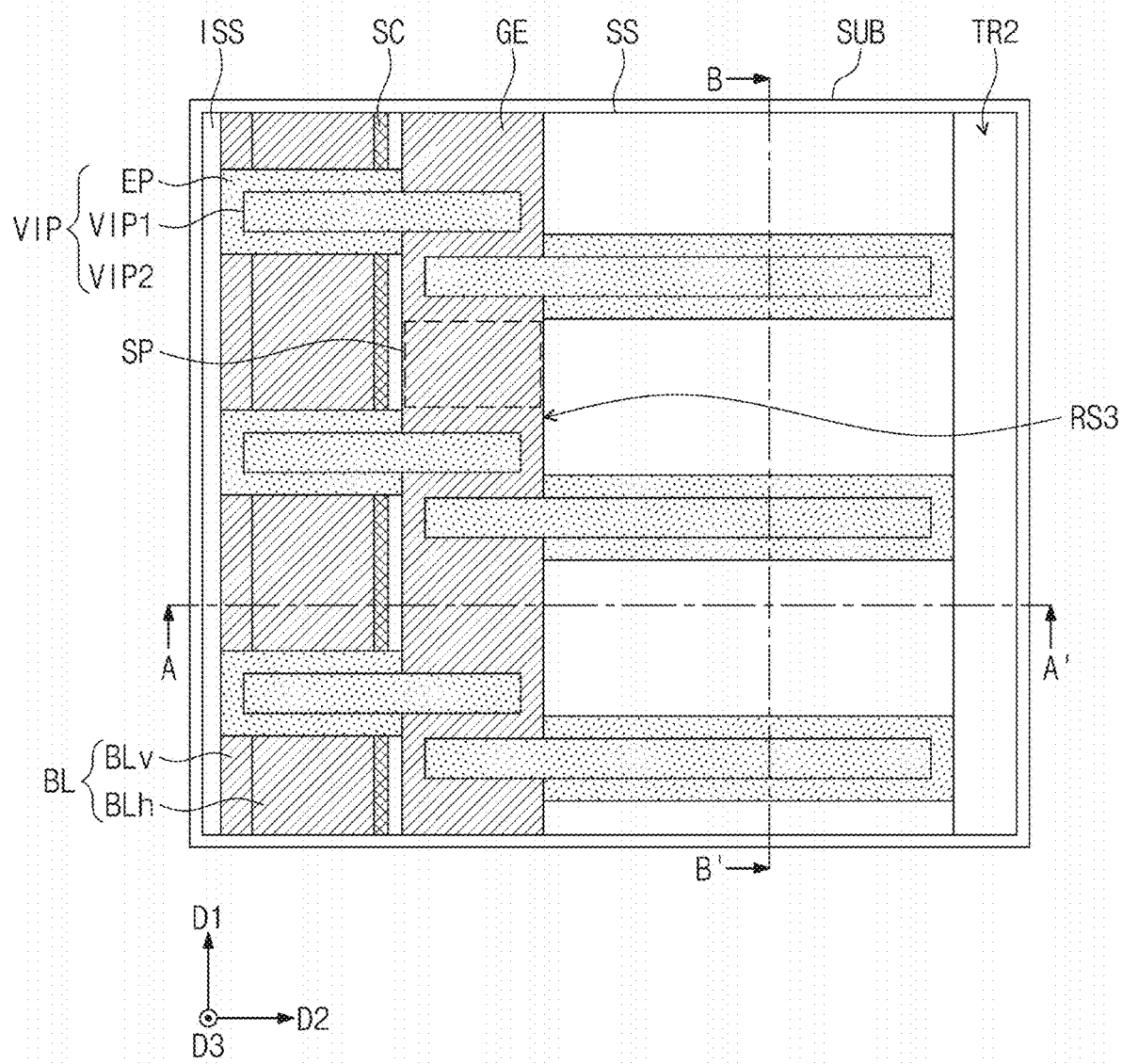
Figure 20A:
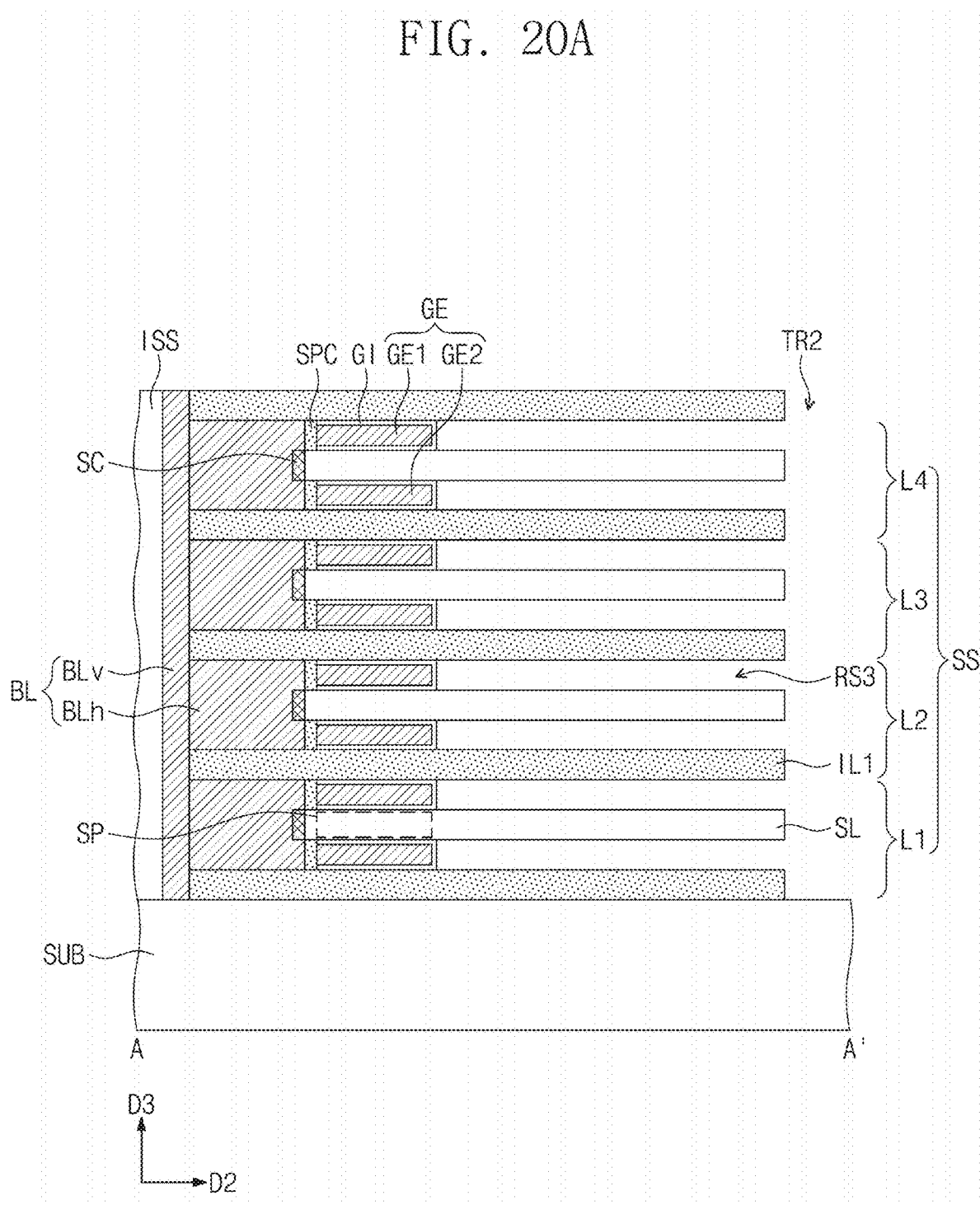
Figure 20B:
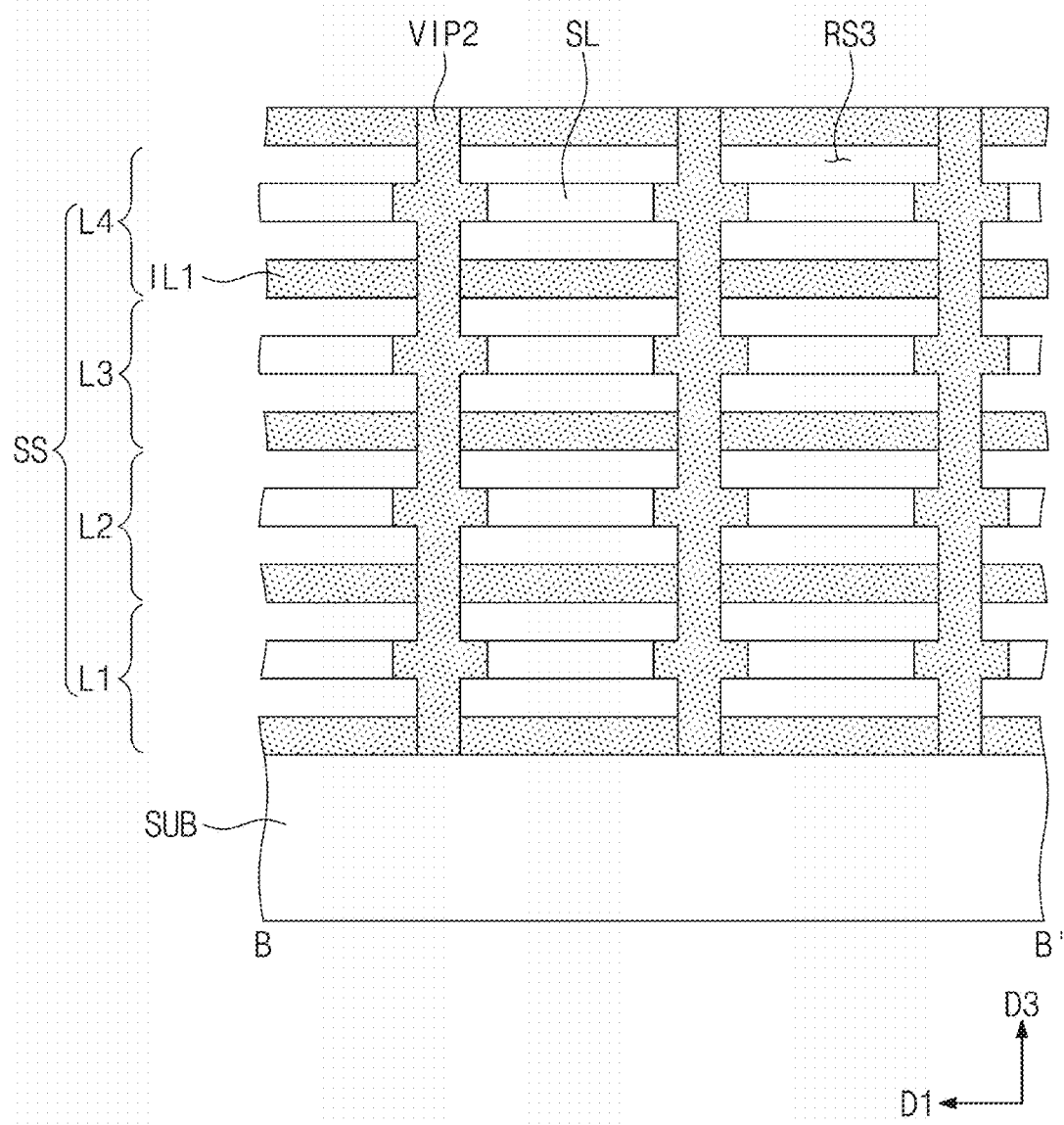

Referring to FIGS. 19, 20A and 20B, an insulating structure ISS may be formed to fill the first trench TR1. The insulating structure ISS may include at least one of a silicon oxide layer, a silicon nitride layer, or a silicon oxynitride layer.

The stack structure SS may be patterned to form a second trench TR2 extending in the first direction D1. The second trench TR2 may be formed at a side of the stack structure SS, which is opposite to the first trench TR1. The second trench TR2 may expose the top surface of the substrate SUB. A second sidewall of the stack structure SS, which extends in the first direction D1, may be defined by the second trench TR2. The first to third insulating layers IL1, IL2 and IL3 and the semiconductor layers SL of the stack structure SS may be exposed by the second trench TR2.

The second and third insulating layers IL2 and IL3 exposed by the second trench TR2 may be completely removed. For example, a wet etching process of selectively etching the second and third insulating layers IL2 and IL3 may be performed through the second trench TR2. The semiconductor layers SL and the first insulating layers IL1 may remain during the wet etching process.

Since the remaining second and third insulating layers IL2 and IL3 are completely removed, third recesses RS3 may be formed. The third recesses RS3 may horizontally extend from the second trench TR2 toward the gate electrode GE.

Referring again to FIGS. 7 and 8A to 8C, a silicidation reaction may be performed on the semiconductor layers SL exposed by the third recesses RS3, and thus first electrodes EL1 may be formed. Since the first electrodes EL1 are formed by the silicidation of exposed portions of the semiconductor layers SL, the first electrodes EL1 may be connected directly to the semiconductor patterns SP, respectively. The first electrodes EL1 in one layer may be separated from each other in the first direction D1 by the second vertical insulators VIP2. Each of the first electrodes EL1 may have a solid cylinder shape.

Even though not shown in the drawings, a second dopant region may be formed in the semiconductor pattern SP before the formation of the first electrode EL1. The formation of the second dopant region may include doping the semiconductor layer SL exposed through the third recesses RS3 with dopants before the formation of the first electrode ELL The dopants used in the formation of the second dopant region may be the same as, or different from, the dopants used in the formation of the first dopant region.

A dielectric layer DL may be conformally formed on the first electrodes ELL The dielectric layer DL may cover exposed outer surfaces of the first electrodes ELL The dielectric layer DL may partially fill the third recesses RS3.

A second electrode EL2 may be formed on the dielectric layer DL. The second electrode EL2 may be formed to completely fill the second trench TR2 and the third recesses RS3. The first electrode EL1, the dielectric layer DL, and the second electrode EL2 may constitute/correspond to a data storage element DS.

Figure 21:
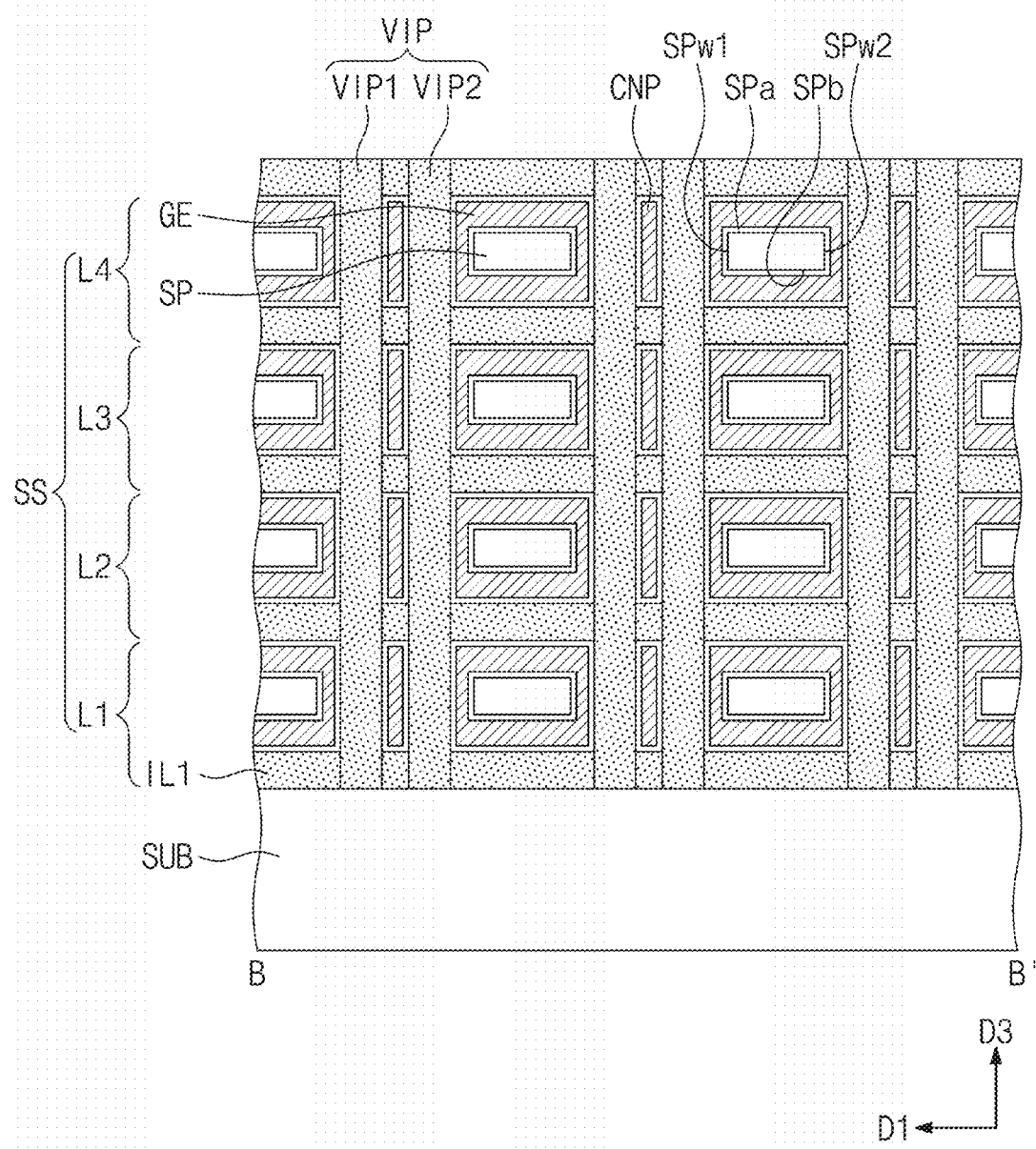
FIG. 21 is a cross-sectional view taken along the line B-B' of FIG. 7 to illustrate a 3D semiconductor memory device according to some example embodiments of inventive concepts.

FIG. 21 is a cross-sectional view taken along the line B-B' of FIG. 7 to illustrate a 3D semiconductor memory device according to some example embodiments of inventive concepts. In some example embodiments, the descriptions to the same technical features as in the example embodiments of FIGS. 7 and 8A to 8C will be omitted for the purpose of ease and convenience in explanation. In other words/for example, differences between example embodiments and the example embodiments of FIGS. 7 and 8A to 8C will be mainly described hereinafter in detail.

Referring to FIGS. 7 and 21, the vertical insulator VIP may not include the extension EP. A gate electrode GE may surround the first surface SPa, the second surface SPb, a first sidewall SPw1 and a second sidewall SPw2 of the semiconductor pattern SP. The first sidewall SPw1 and the second sidewall SPw2 may be both sidewalls of the semiconductor pattern SP.

A memory cell transistor according to some example embodiments may have a gate-all-around (GAA) structure in which the gate electrode GE surrounds a body (i.e., the semiconductor pattern SP) of a transistor. For example the memory cell transistor according to some example embodiments may be the gate-all-around (GAA) transistor described above with reference to FIG. 4. Since the memory cell transistor according to some example embodiments has the gate-all-around structure, channel controllability of the gate electrode GE may be improved.

In a method for manufacturing the semiconductor memory device according to some example embodiments, the extension EP of the vertical insulator VIP described above with reference to FIGS. 11 and 12 may be formed of the same insulating material as the second and third insulating layers IL2 and IL3. Thus, when the second and third insulating layers IL2 and IL3 are replaced with the gate electrode GE in a subsequent process, the extension EP as well as the second and third insulating layers IL2 and IL3 may be replaced with the gate electrode GE. As a result, the gate-all-around structure may be realized.

Figure 22:
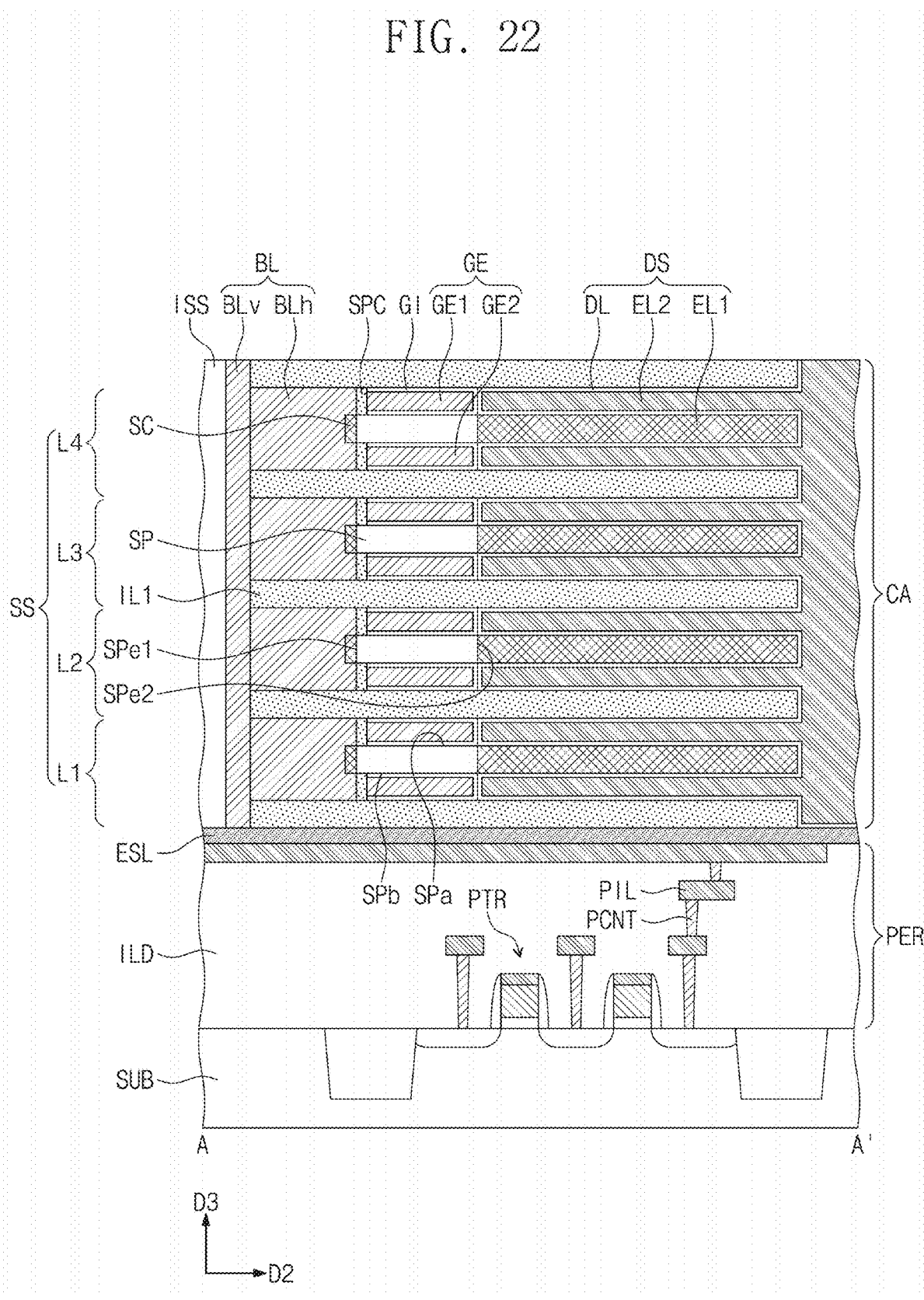
FIGS. 22 and 23 are cross-sectional views taken along the line A-A' of FIG. 7 to illustrate 3D semiconductor memory devices according to some example embodiments of inventive concepts.
Figure 23:
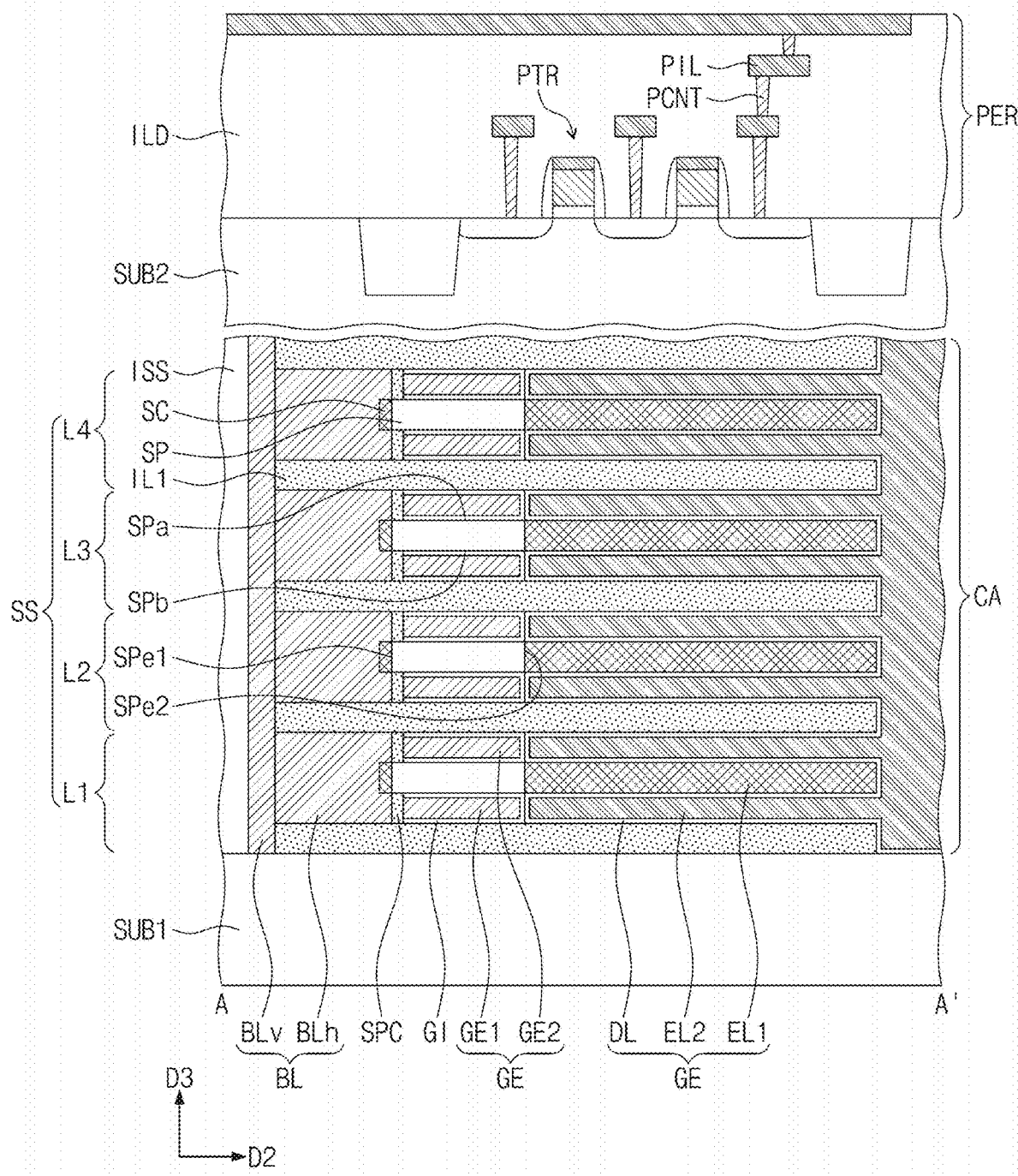

FIGS. 22 and 23 are cross-sectional views taken along the line A-A' of FIG. 7 to illustrate 3D semiconductor memory devices according to some example embodiments of inventive concepts. The descriptions to the same technical features as in the example embodiments of FIGS. 7 and 8A to 8C will be omitted for the purpose of ease and convenience in explanation. In other words, differences between example embodiments and the example embodiments of FIGS. 7 and 8A to 8C will be mainly described hereinafter in detail.

Referring to FIGS. 7 and 22, the cell array CA described with reference to FIG. 1 may be provided on the substrate SUB. The cell array CA may include the stack structure SS. A peripheral circuit region PER may be provided between the cell array CA and the substrate SUB. The peripheral circuit region PER may include a circuit for operating the cell array CA, such as row driver circuits and/or address decode circuits and/or sense amplifier circuits.

In some example embodiments, the peripheral circuit region PER may include peripheral transistors PTR, peripheral interconnection lines PIL, and peripheral contacts PCNT vertically connecting the peripheral interconnection lines PIL. Even though not shown in the drawings, the peripheral interconnection lines PIL may be electrically connected to the cell array CA through a through-contact. An etch stop layer ESL may be additionally disposed between the cell array CA and the peripheral circuit region PER.

The semiconductor memory device according to some example embodiments may have a cell-on-peri (COP) structure in which a memory cell is provided on a peripheral circuit region, as described above with reference to FIGS. 1 and 2. Since the peripheral circuit region PER and the cell array CA are three-dimensionally stacked, an area of the semiconductor memory device may be reduced and the high integration density of a circuit may be realized.

Referring to FIGS. 7 and 23, the cell array CA may be provided on a first substrate SUB1. A second substrate SUB2 may be provided on the cell array CA. The peripheral circuit region PER may be provided on the second substrate SUB2. The peripheral circuit region PER may include a circuit for operating the cell array CA.

A method for manufacturing the semiconductor memory device according to some example embodiments may include forming the cell array CA on the first substrate SUB1, forming the peripheral circuit region PER on the second substrate SUB2, and bonding the second substrate SUB2 onto the cell array CA by a wafer bonding method.

The semiconductor memory device according to some example embodiments may have a peri-on-cell (POC) structure in which a peripheral circuit region is provided on a memory cell, as described above with reference to FIGS. 1 and 6. Since the cell array CA and the peripheral circuit region PER are three-dimensionally stacked, an area of the semiconductor memory device may be reduced and the high integration density of a circuit may be realized.

Figure 24:
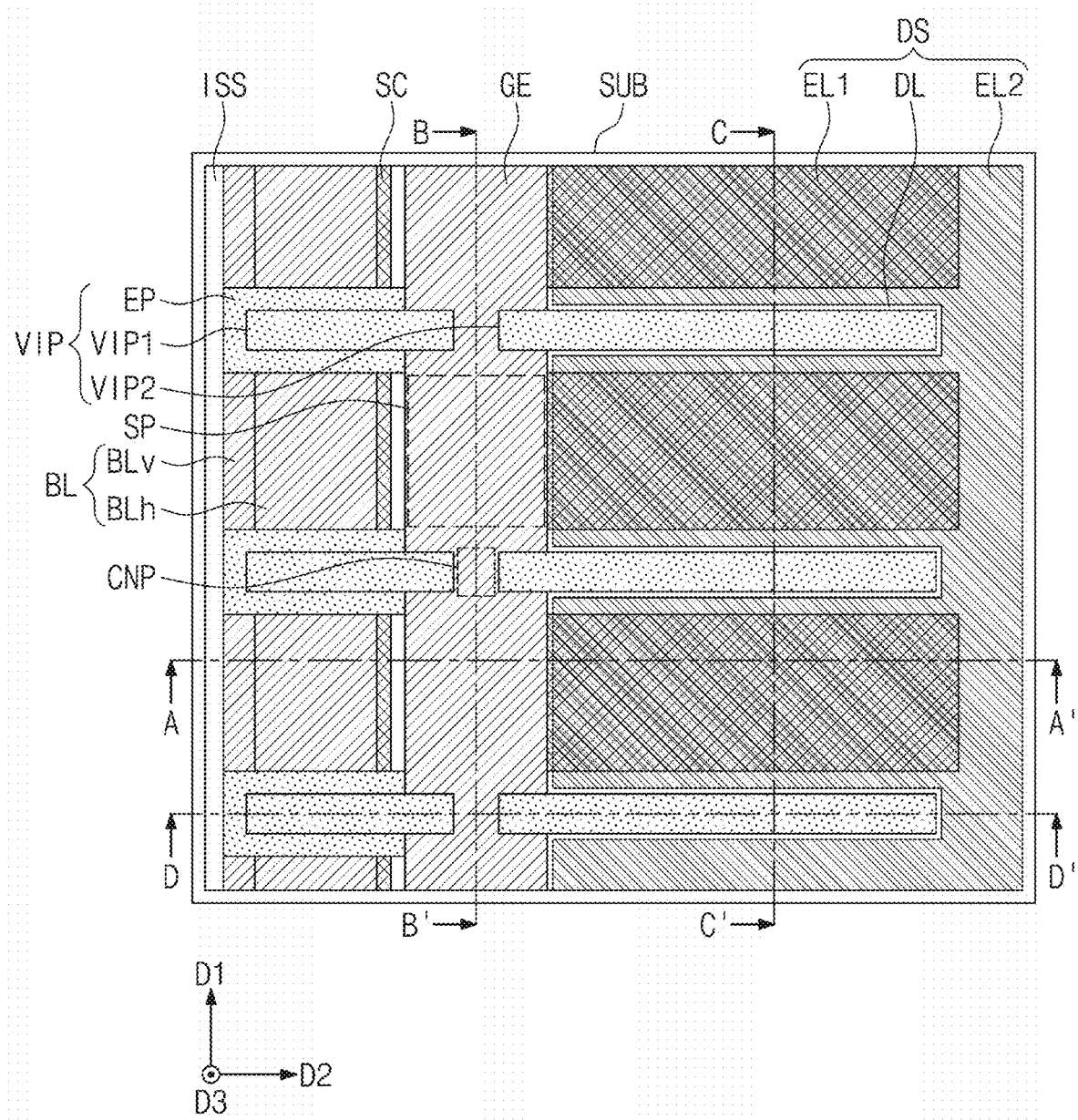
FIG. 24 is a plan view illustrating a 3D semiconductor memory device according to some example embodiments of inventive concepts.
Figure 25A:
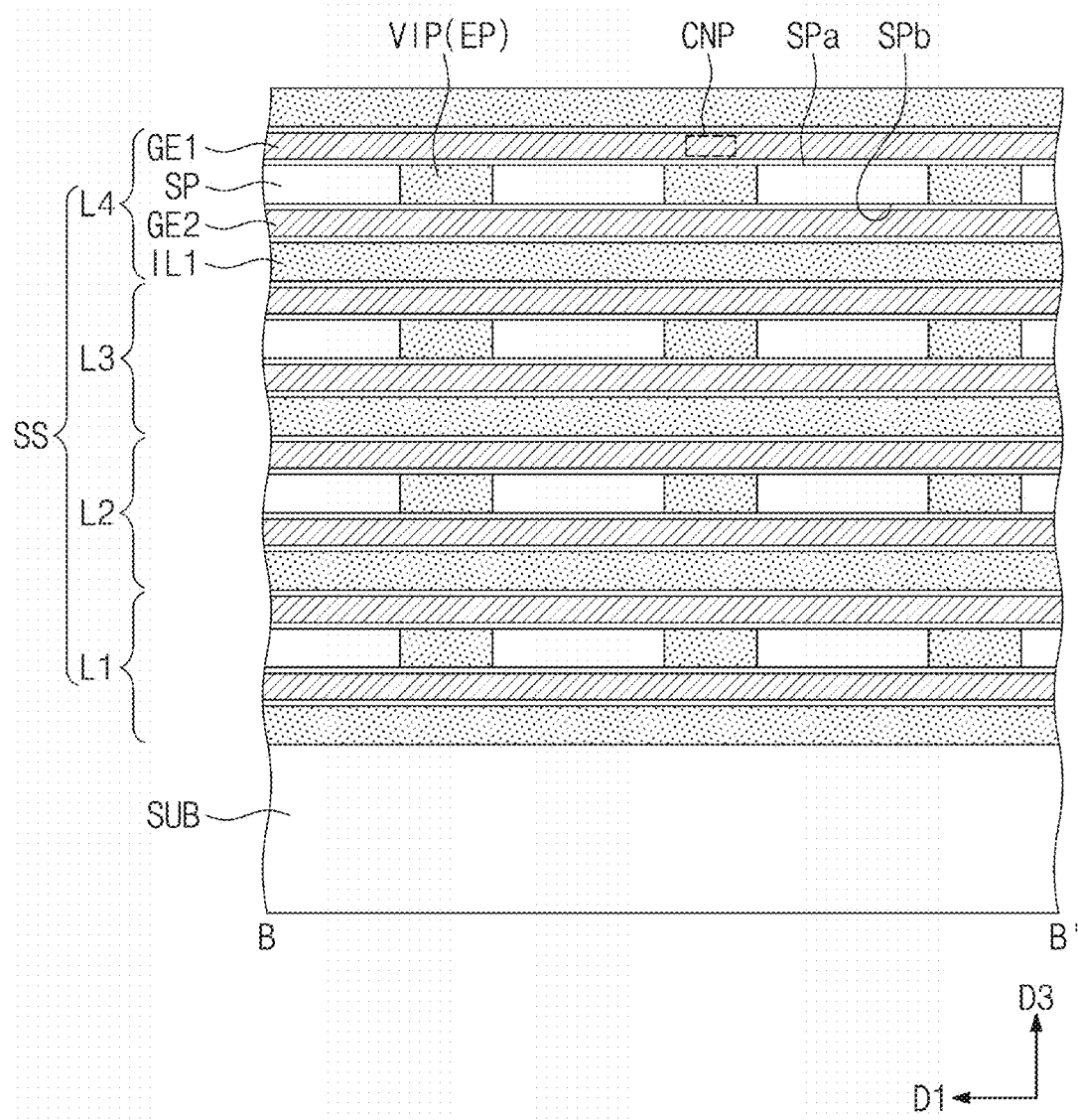
FIGS. 25A and 25B are cross-sectional views taken along lines B-B' and D-D' of FIG. 24, respectively.
Figure 25B:
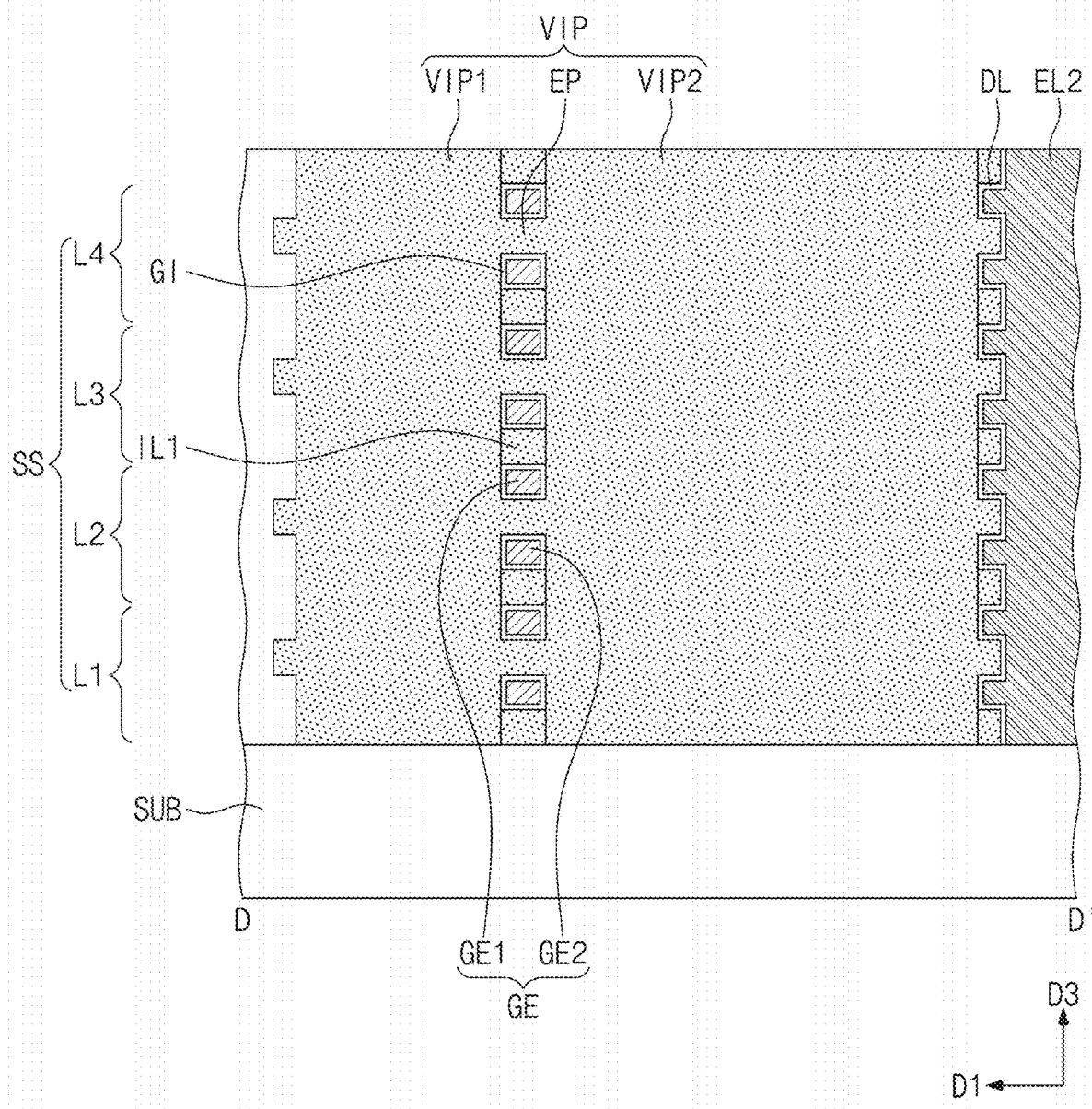

FIG. 24 is a plan view illustrating a 3D semiconductor memory device according to some example embodiments of inventive concepts. FIGS. 25A and 25B are cross-sectional views taken along lines B-B' and D-D' of FIG. 24, respectively. In some example embodiments, the descriptions to the same technical features as in the example embodiments of FIGS. 7 and 8A to 8C will be omitted for the purpose of ease and convenience in explanation. In other words, differences between some example embodiments and the example embodiments of FIGS. 7 and 8A to 8C will be mainly described hereinafter in detail. Cross-sectional views taken along lines A-A' and C-C' of FIG. 24 may be substantially the same as the cross-sectional views of FIGS. 8A and 8C, respectively.

Referring to FIGS. 24, 25A, 25B, 8A and 8C, first and second vertical insulators VIP1 and VIP2 of each of vertical insulators VIP may be aligned with each other in the second direction D2. The second vertical insulator VIP2 may be spaced apart from the first vertical insulator VIP1 in the second direction D2. A connection portion CNP of the gate electrode GE may be disposed between the first vertical insulator VIP1 and the second vertical insulator VIP2. Due to the connection portion CNP between the first and second vertical insulators VIP1 and VIP2, the gate electrode GE may not be divided but may continuously extend in the first direction D1.

Except for the aforementioned shape of the vertical insulator VIP, other features of the semiconductor memory device according to some example embodiments may be substantially the same as corresponding features of the semiconductor memory device described above with reference to FIGS. 7 and 8A to 8C.

Figure 26:
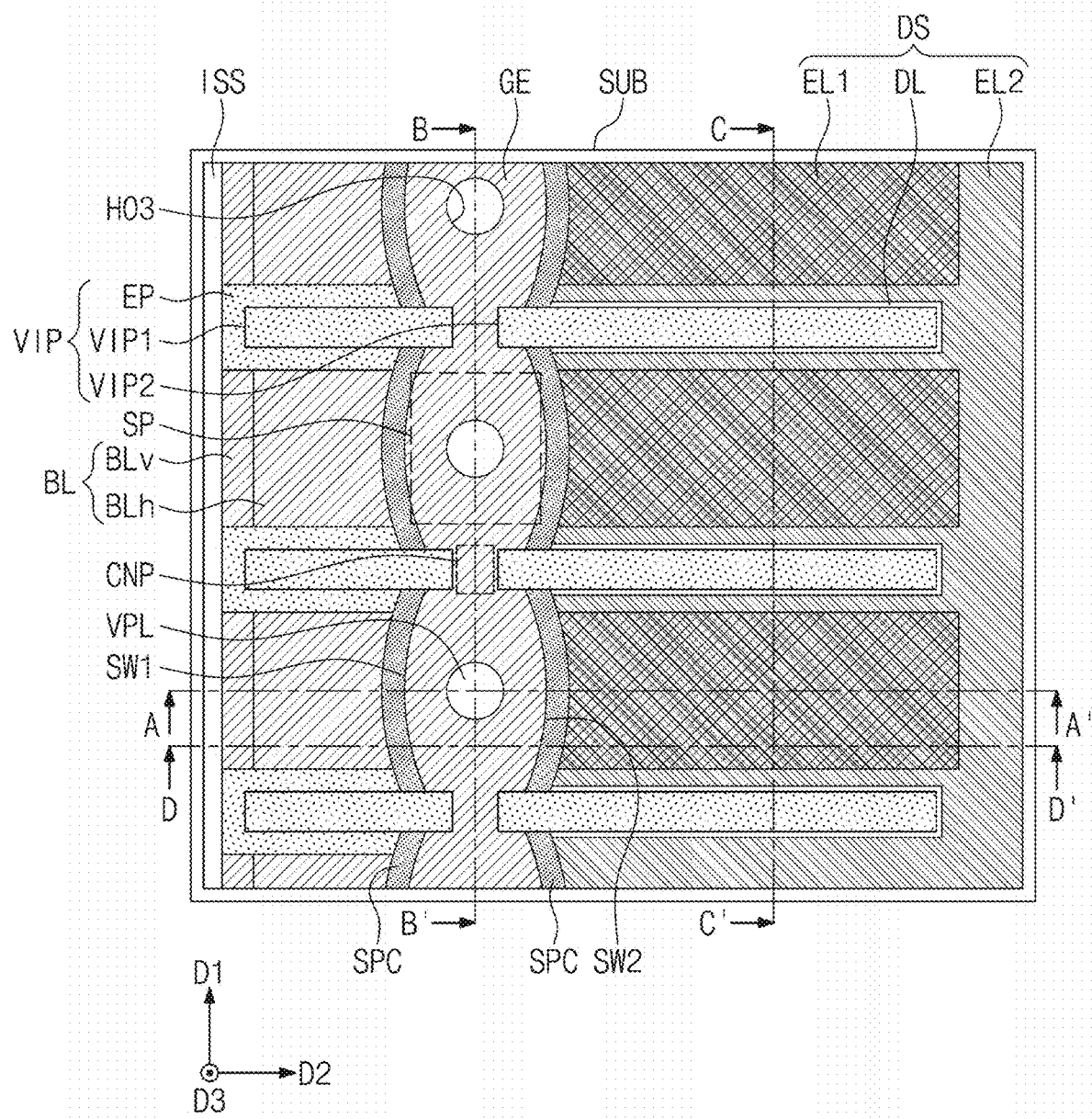
FIG. 26 is a plan view illustrating a 3D semiconductor memory device according to some example embodiments of inventive concepts.
Figure 27A:
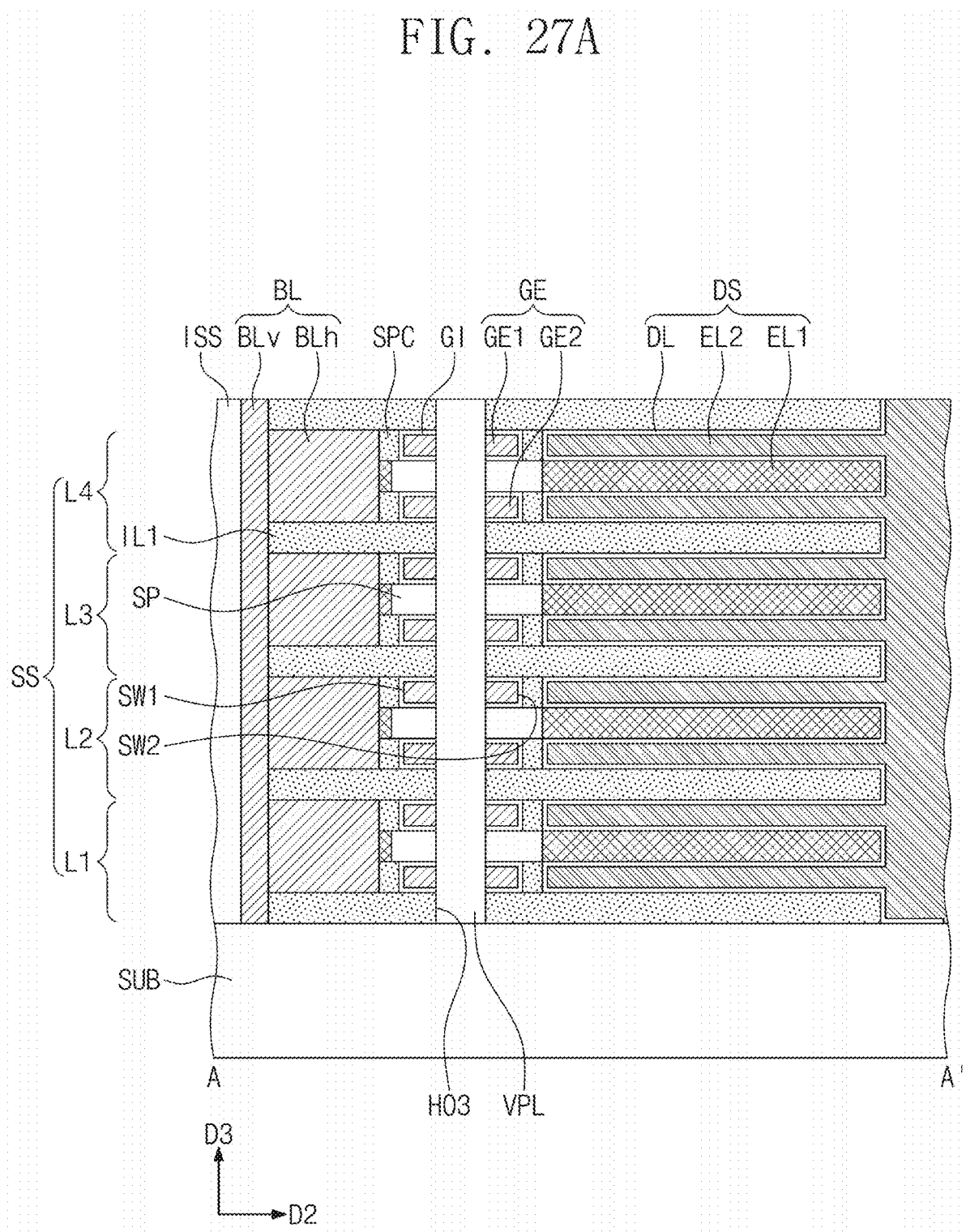
FIGS. 27A, 27B and 27C are cross-sectional views taken along lines A-A', B-B' and D-D' of FIG. 26, respectively.
Figure 27B:
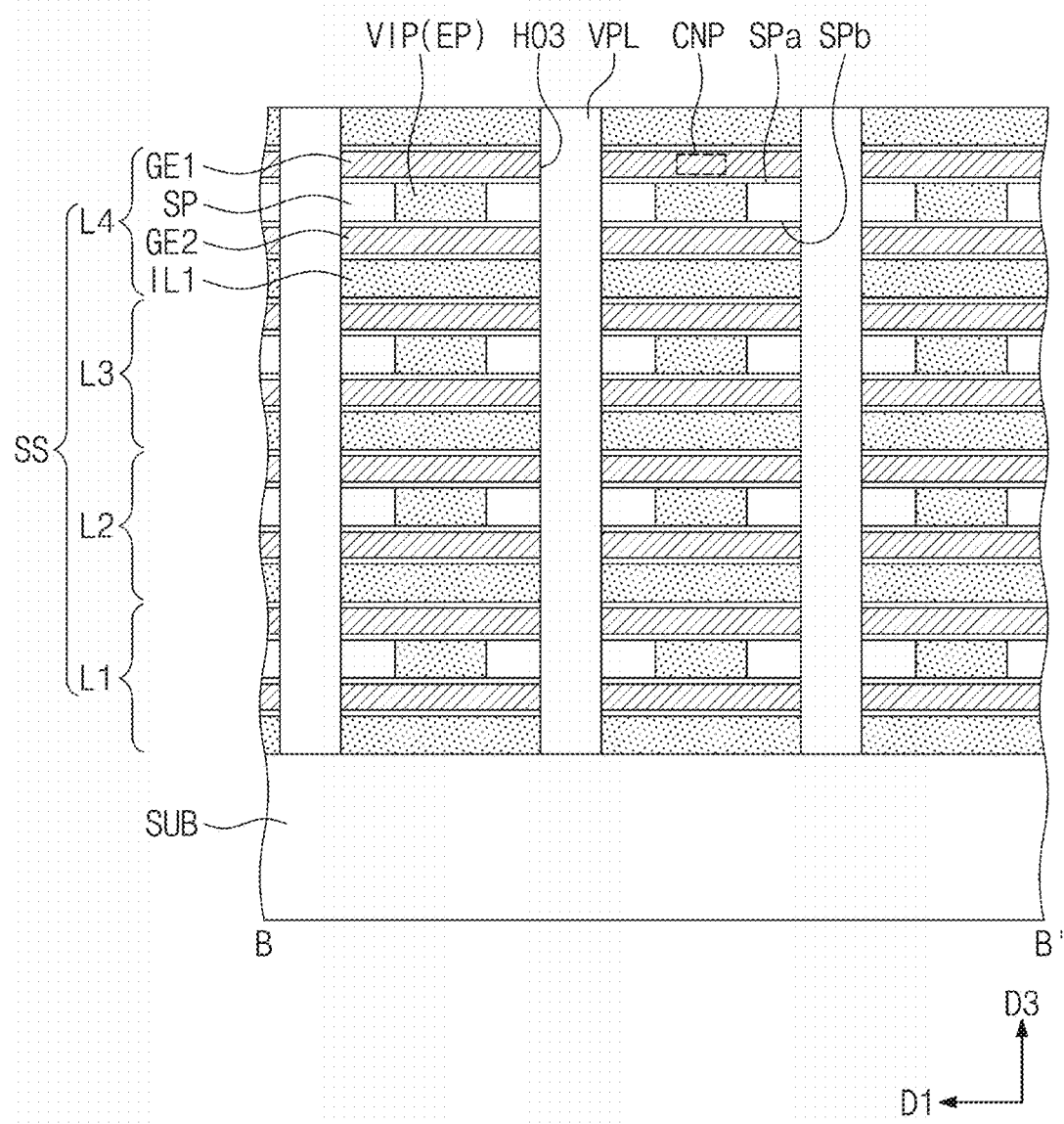
Figure 27C:
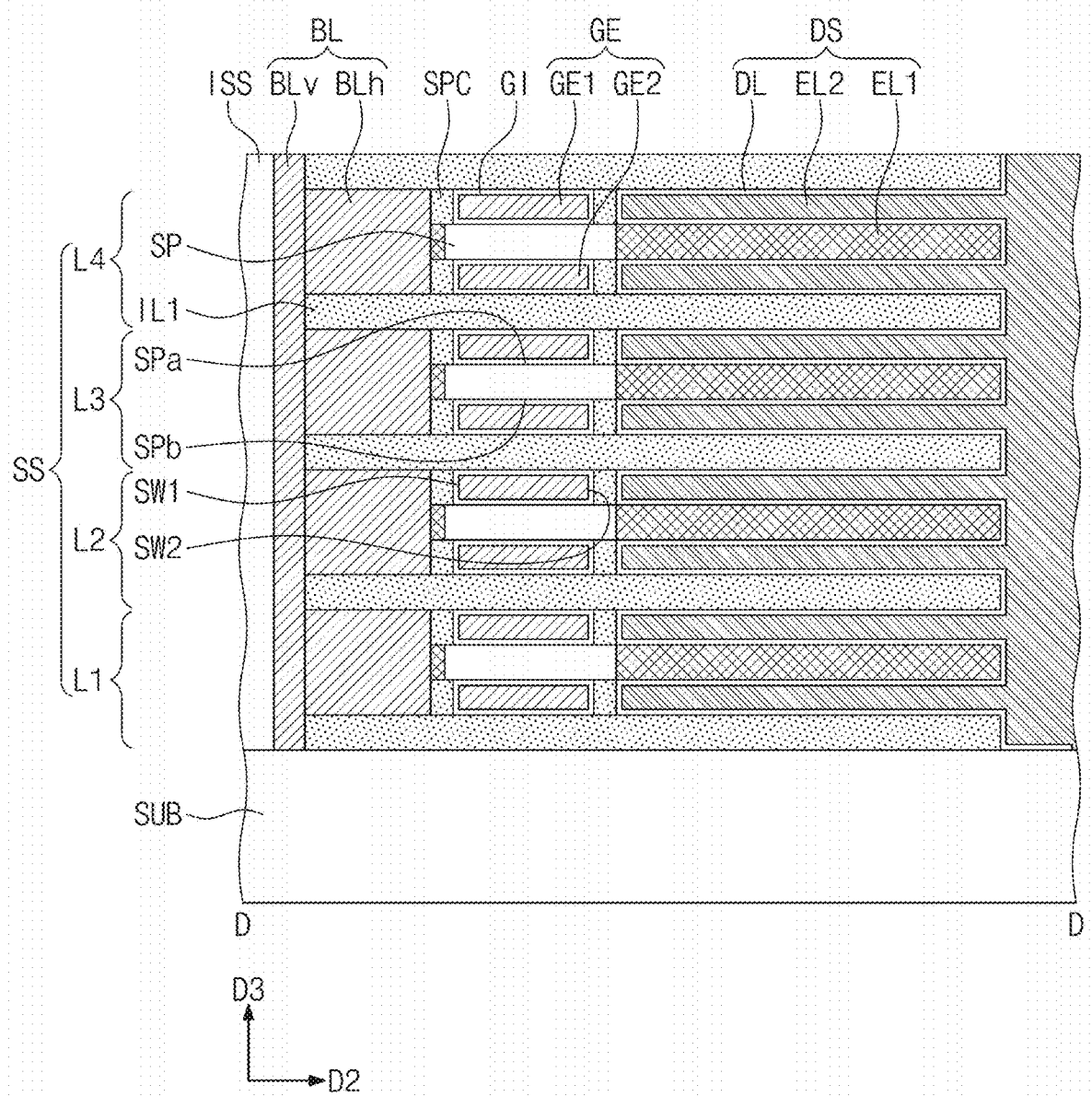

FIG. 26 is a plan view illustrating a 3D semiconductor memory device according to some example embodiments of inventive concepts. FIGS. 27A, 27B and 27C are cross-sectional views taken along lines A-A', B-B' and D-D' of FIG. 26, respectively. In some example embodiments, the descriptions to the same technical features as in the example embodiments of FIGS. 7 and 8A to 8C will be omitted for the purpose of ease and convenience in explanation. In other words, differences between some example embodiments and the example embodiments of FIGS. 7 and 8A to 8C will be mainly described hereinafter in detail. A cross-sectional view taken along a line C-C' of FIG. 26 may be substantially the same as the cross-sectional view of FIG. 8C.

Referring to FIGS. 26, 27A to 27C and 8C, third holes HO3 penetrating the stack structure SS may be defined. Each of the third holes HO3 may penetrate central portions of stacked semiconductor patterns SP. The third holes HO3 may be arranged in the first direction D1 at a constant pitch when viewed in a plan view. A planar shape of the third hole HO3 may be a circular shape. Insulating pillars VPL may be provided in the third holes HO3, respectively. The insulating pillars VPL may penetrate the gate electrode GE extending in the first direction D1 and may be arranged in the first direction D1 along the gate electrode GE. The insulating pillars VPL may include at least one of a silicon oxide layer, a silicon nitride layer, a silicon oxynitride layer, a carbon-containing silicon oxide layer, a carbon-containing silicon nitride layer, or a carbon-containing silicon oxynitride layer.

Referring to FIG. 26, the gate electrode GE may have a first sidewall SW1 and a second sidewall SW2 which are opposite to each other in the second direction D2. The first sidewall SW1 and the second sidewall SW2 may have curved profiles. The first sidewall SW1 may have a shape protruding toward the bit line BL, and the second sidewall SW2 may have a shape protruding toward the first electrode EL1. For example, a center of curvature of the first sidewall SW1 and a center of curvature of the second sidewall SW2 may substantially coincide with a center of the insulating pillar VPL. A spacer SPC may be provided on each of the first and second sidewalls SW1 and SW2 of the gate electrode GE.

The first and second vertical insulators VIP1 and VIP2 of each of the vertical insulators VIP may be aligned with each other in the second direction D2. The connection portion CNP of the gate electrode GE may be disposed between the first vertical insulator VIP1 and the second vertical insulator VIP2. Due to the connection portion CNP between the first and second vertical insulators VIP1 and VIP2, the gate electrode GE may not be divided but may continuously extend in the first direction D1.

FIGS. 28, 30, 32 and 34 are plan views illustrating a method for manufacturing a 3D semiconductor memory device, according to some example embodiments of inventive concepts. FIGS. 29, 31, 33A and 35A are cross-sectional views taken along lines A-A' of FIGS. 28, 30, 32 and 34, respectively. FIGS. 33B and 35B are cross-sectional views taken along lines B-B' of FIGS. 32 and 34, respectively.

Figure 28:
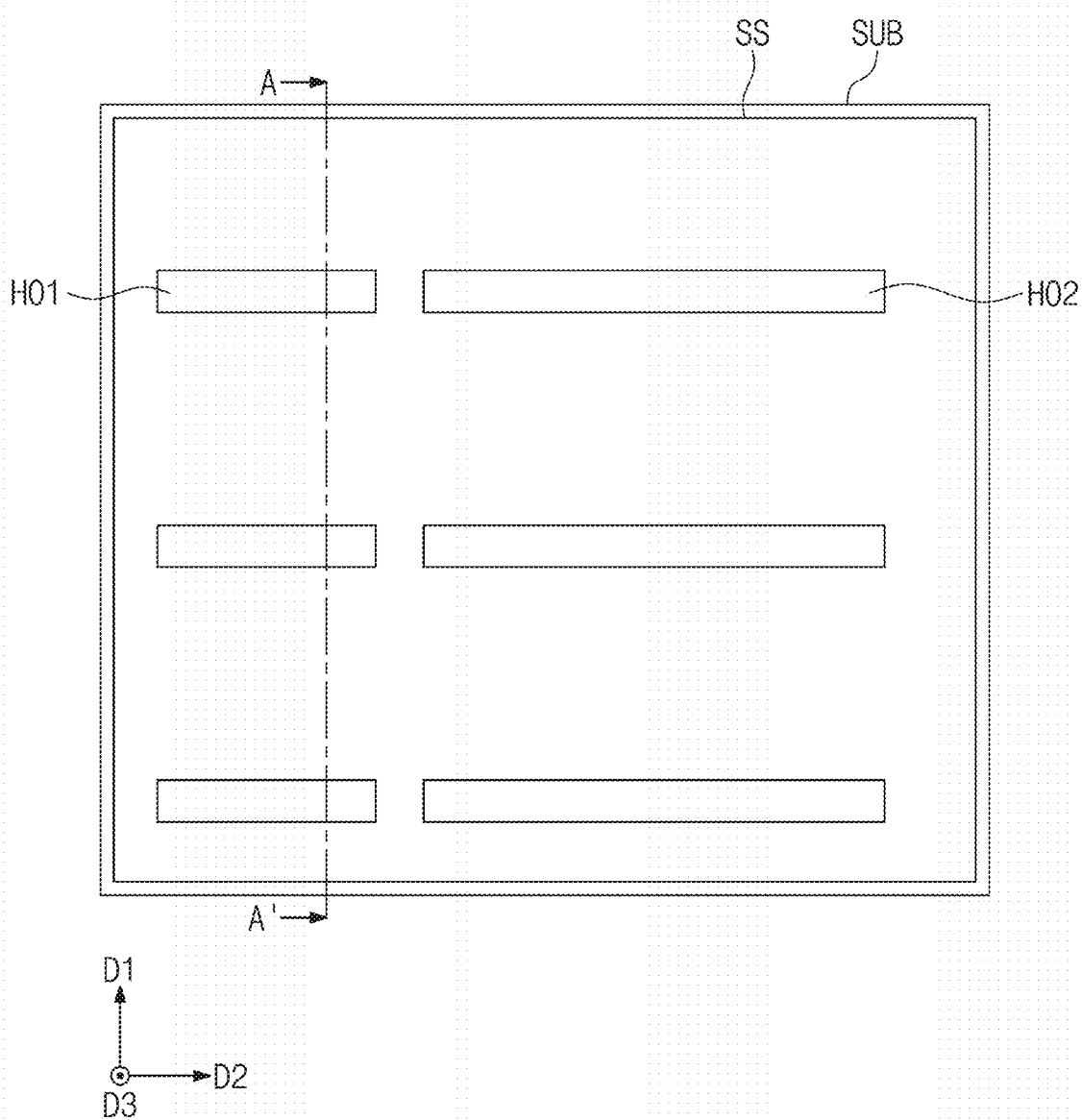
FIGS. 28, 30, 32 and 34 are plan views illustrating a method for manufacturing a 3D semiconductor memory device, according to some example embodiments of inventive concepts.
Figure 29:
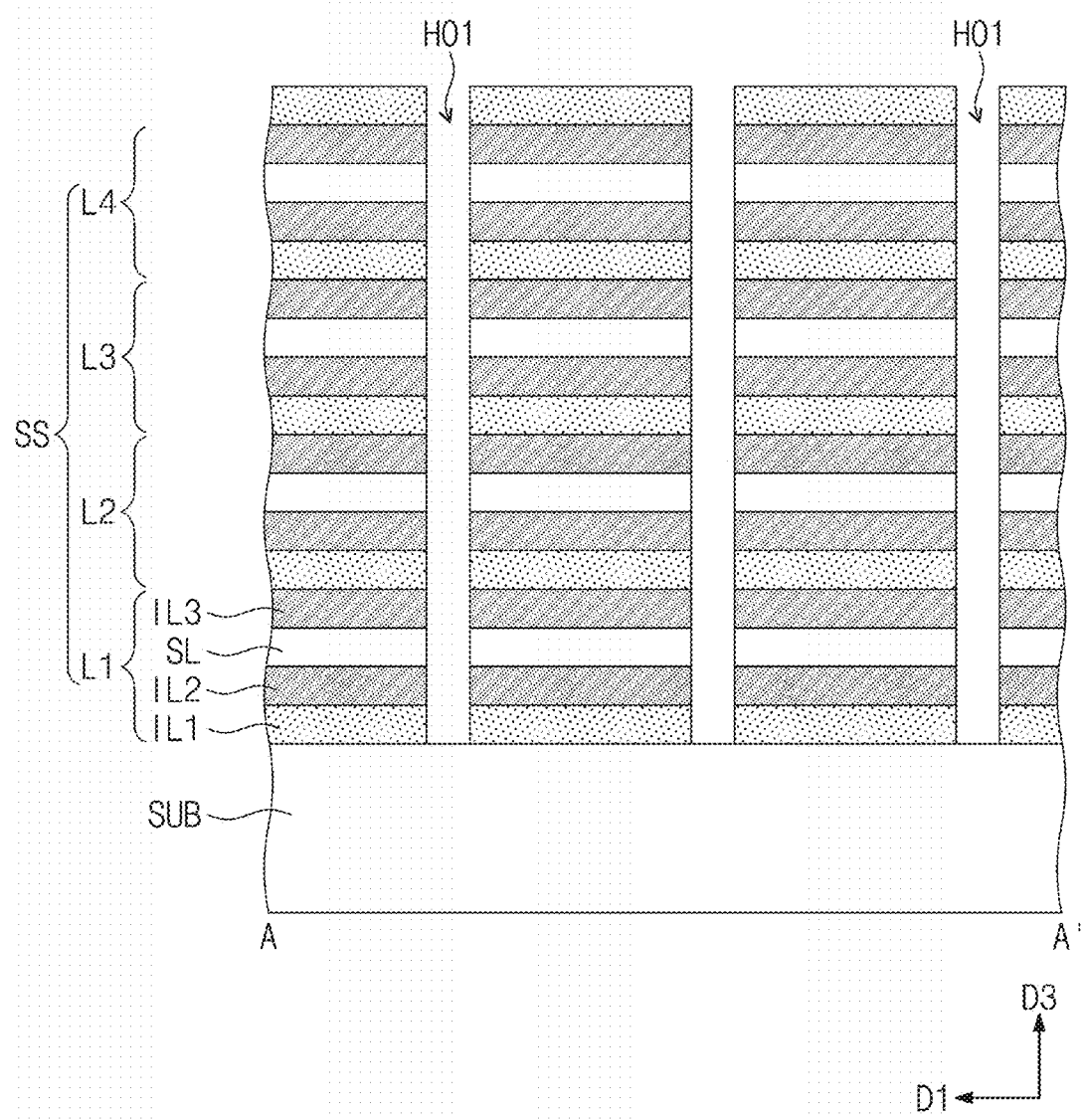
FIGS. 29, 31, 33A and 35A are cross-sectional views taken along lines A-A' of FIGS. 28, 30, 32 and 34, respectively.

Referring to FIGS. 28 and 29, a stack structure SS may be formed on a substrate SUB. The formation of the stack structure SS may include sequentially stacking first to fourth layers L1 to L4. Each of the first to fourth layers L1 to L4 may include a first insulating layer IL1, a second insulating layer IL2 on the first insulating layer IL1, a semiconductor layer SL on the second insulating layer IL2, and a third insulating layer IL3 on the semiconductor layer SL.

First holes HO1 and second holes HO2 may be formed to penetrate the stack structure SS. The second hole HO2 may be formed adjacent to the first hole HO1 in the second direction D2. The second hole HO2 may be aligned with the first hole HO1 in the second direction D2.

Figure 30:
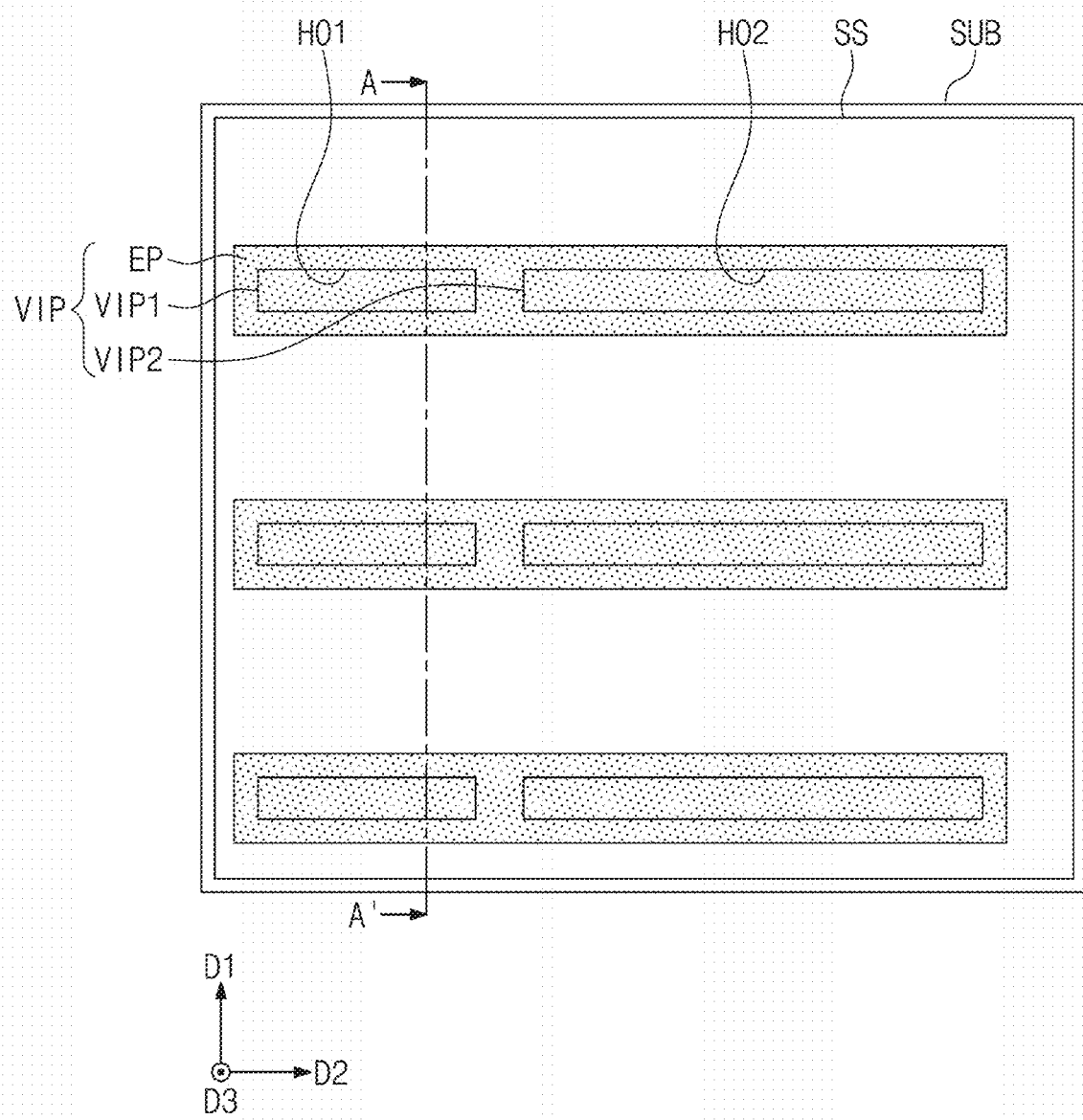
Figure 31:
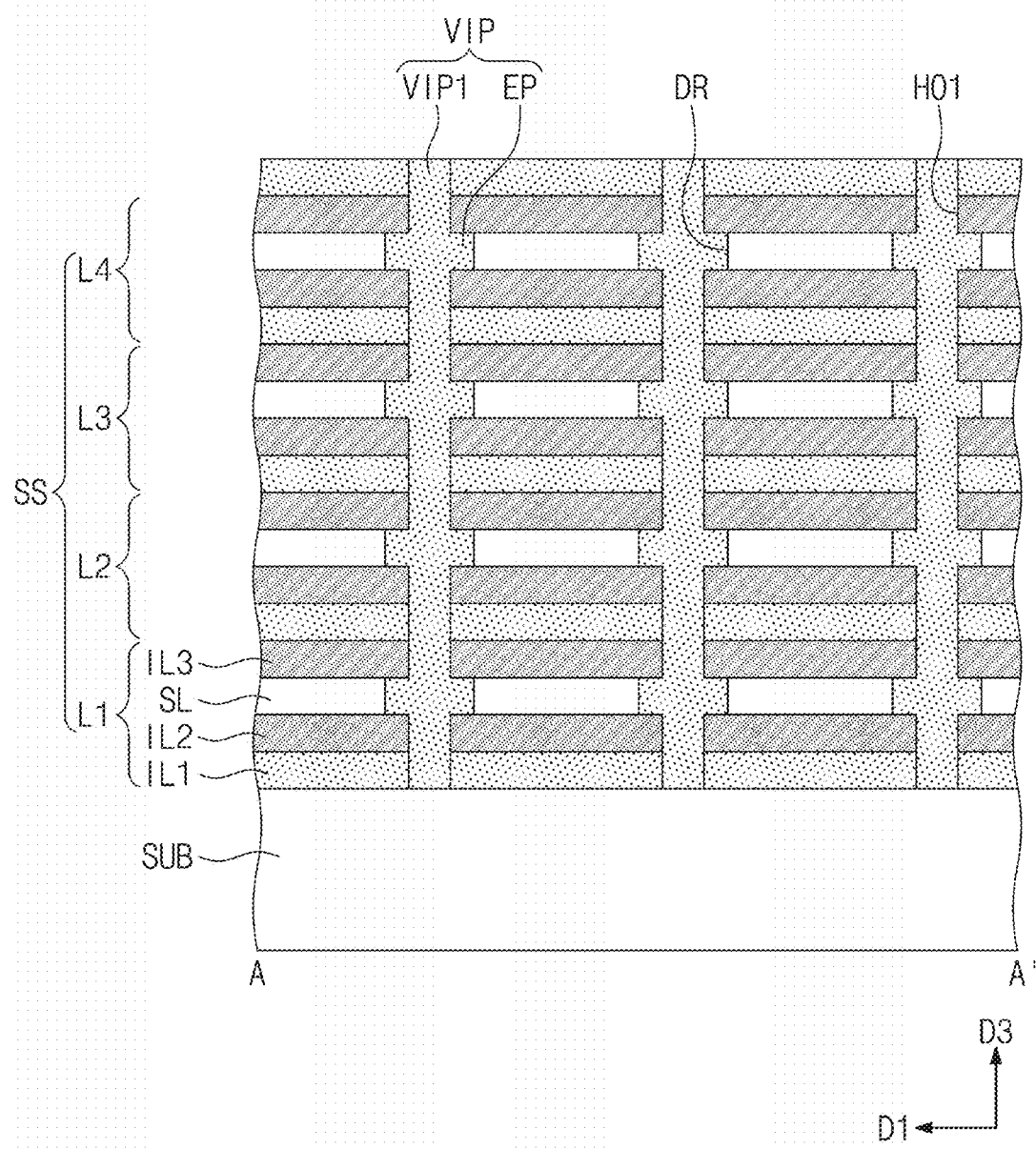

Referring to FIGS. 30 and 31, the semiconductor layers SL exposed by the first and second holes HO1 and HO2 may be partially etched to form depressed regions DR. A plurality of vertical insulators VIP may be formed by filling the first and second holes HO1 and HO2 and the depressed regions DR with an insulating material. The vertical insulators VIP may be arranged in the first direction D1 at a constant pitch. The semiconductor layer SL between the vertical insulators VIP adjacent to each other may be defined as a semiconductor pattern SP.

Figure 32:
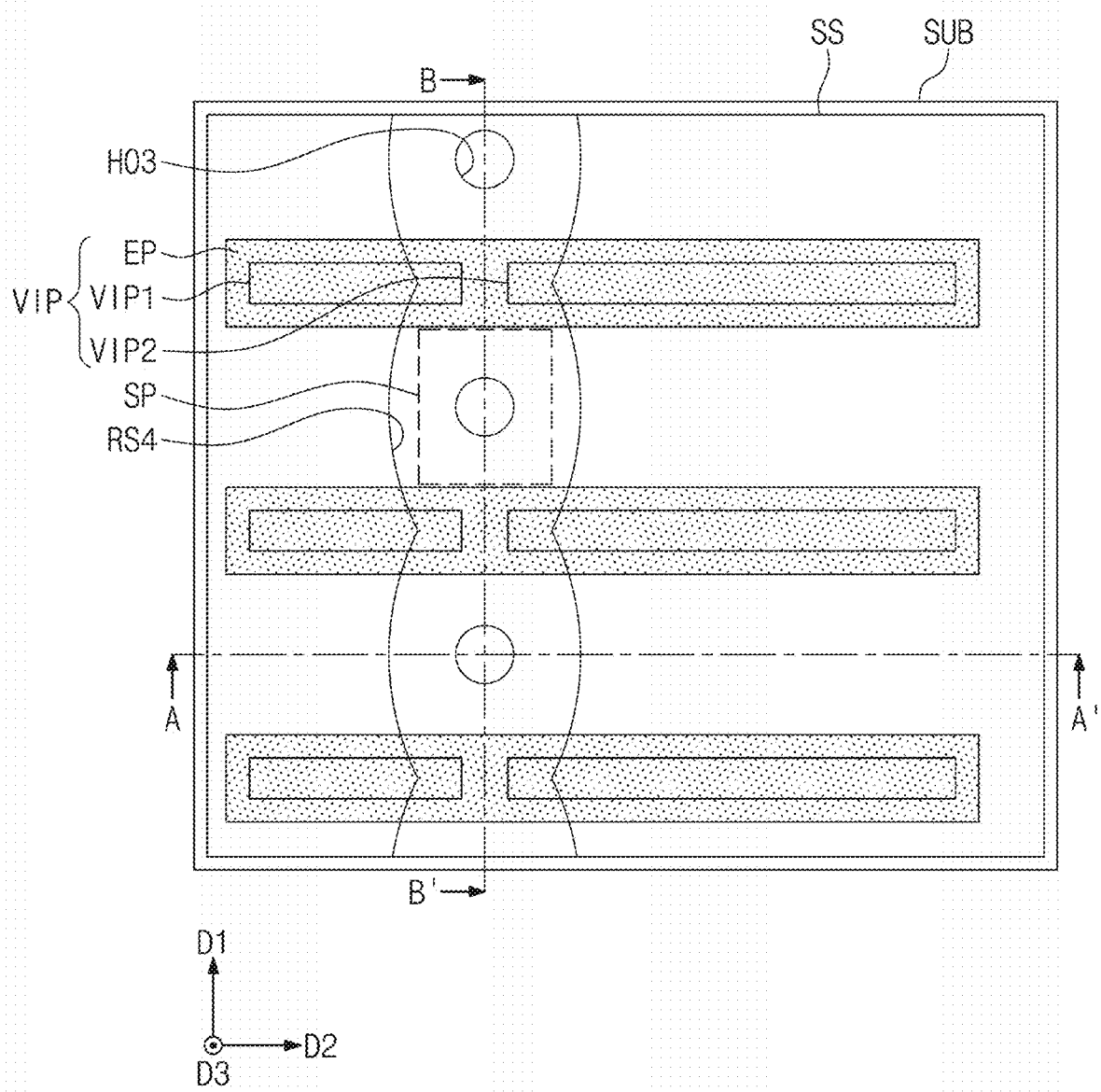
Figure 33A:
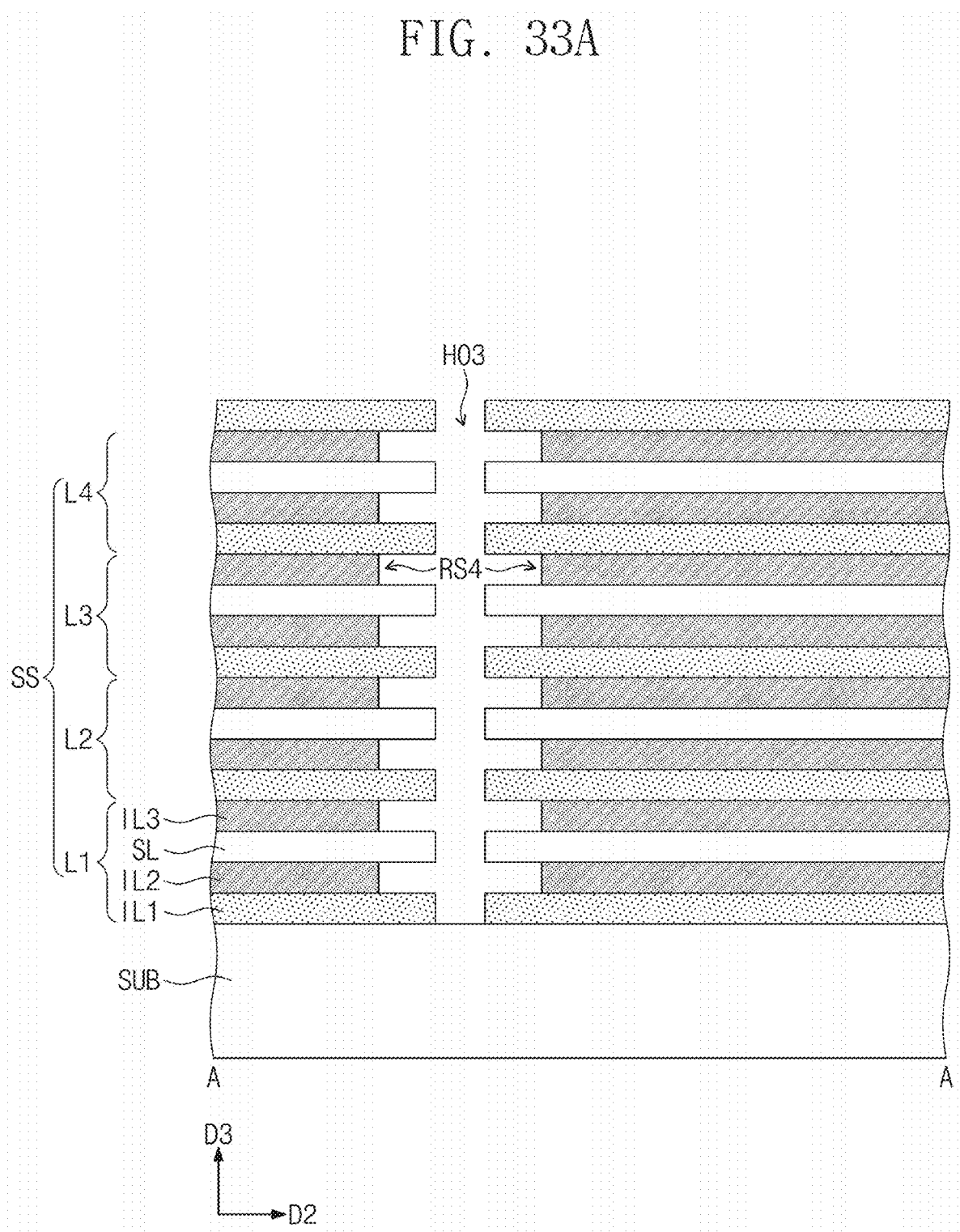
Figure 33B:
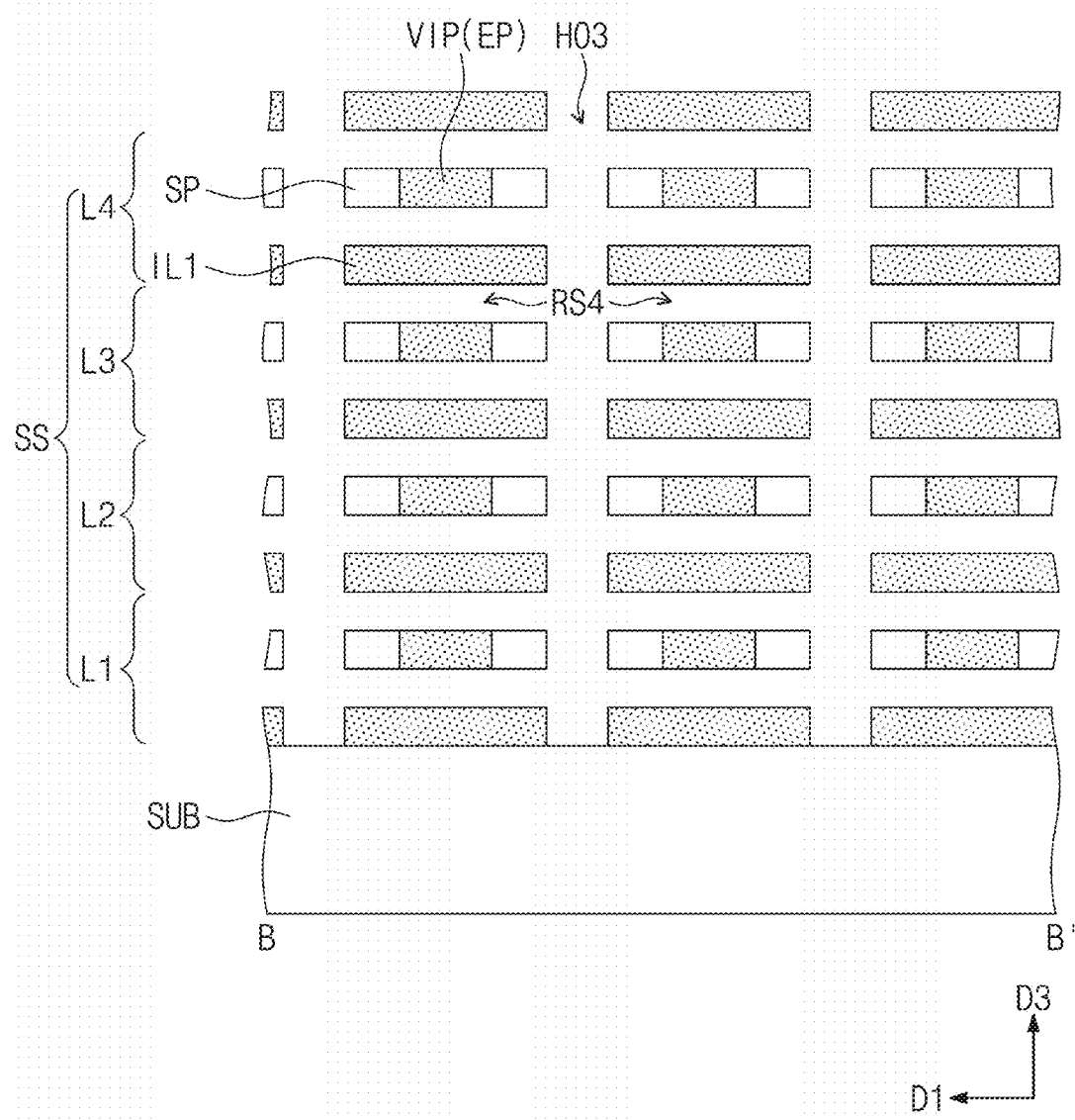
FIGS. 33B and 35B are cross-sectional views taken along lines B-B' of FIGS. 32 and 34, respectively.

Referring to FIGS. 32, 33A and 33B, third holes HO3 penetrating the stack structure SS may be formed. The third hole HO3 may be formed between the vertical insulators VIP adjacent to each other. The third hole HO3 may penetrate a center of the semiconductor pattern SP. The third holes HO3 may be arranged in the first direction D1 at a constant pitch.

The second and third insulating layers IL2 and IL3 exposed by the third hole HO3 may be partially etched to form fourth recesses RS4. For example, a wet etching process of selectively etching the second and third insulating layers IL2 and IL3 may be performed through the third hole HO3. The semiconductor layers SL and the first insulating layers IL1 may remain during the wet etching process.

Etching may be isotropically performed from the third hole HO3 in the wet etching process, and thus the fourth recesses RS4 may horizontally extend from the third hole HO3. Referring again to FIG. 32, sidewalls of the fourth recess RS4 may have curved profiles when viewed in a plan view.

Figure 34:
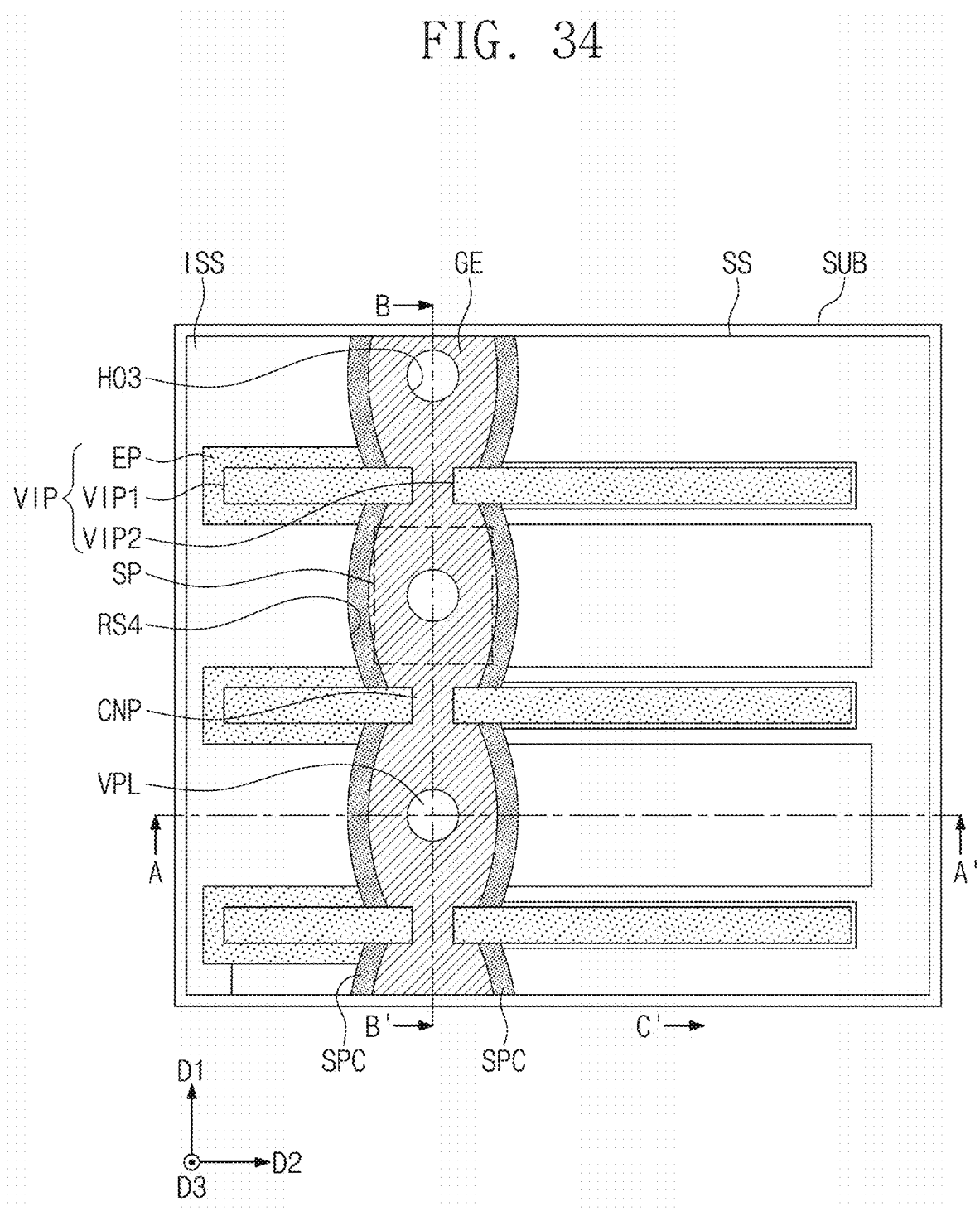
Figure 35A:
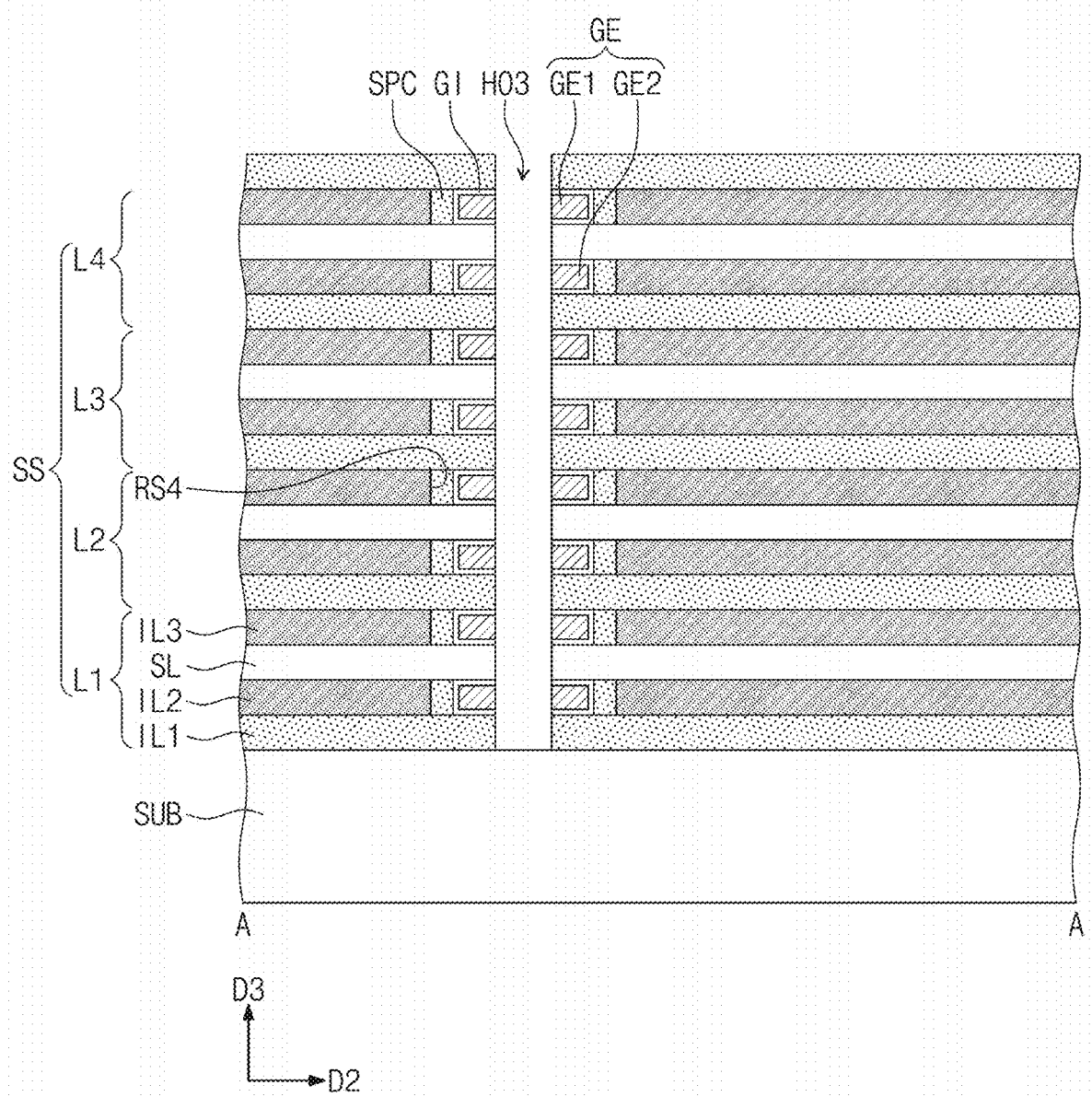
Figure 35B:
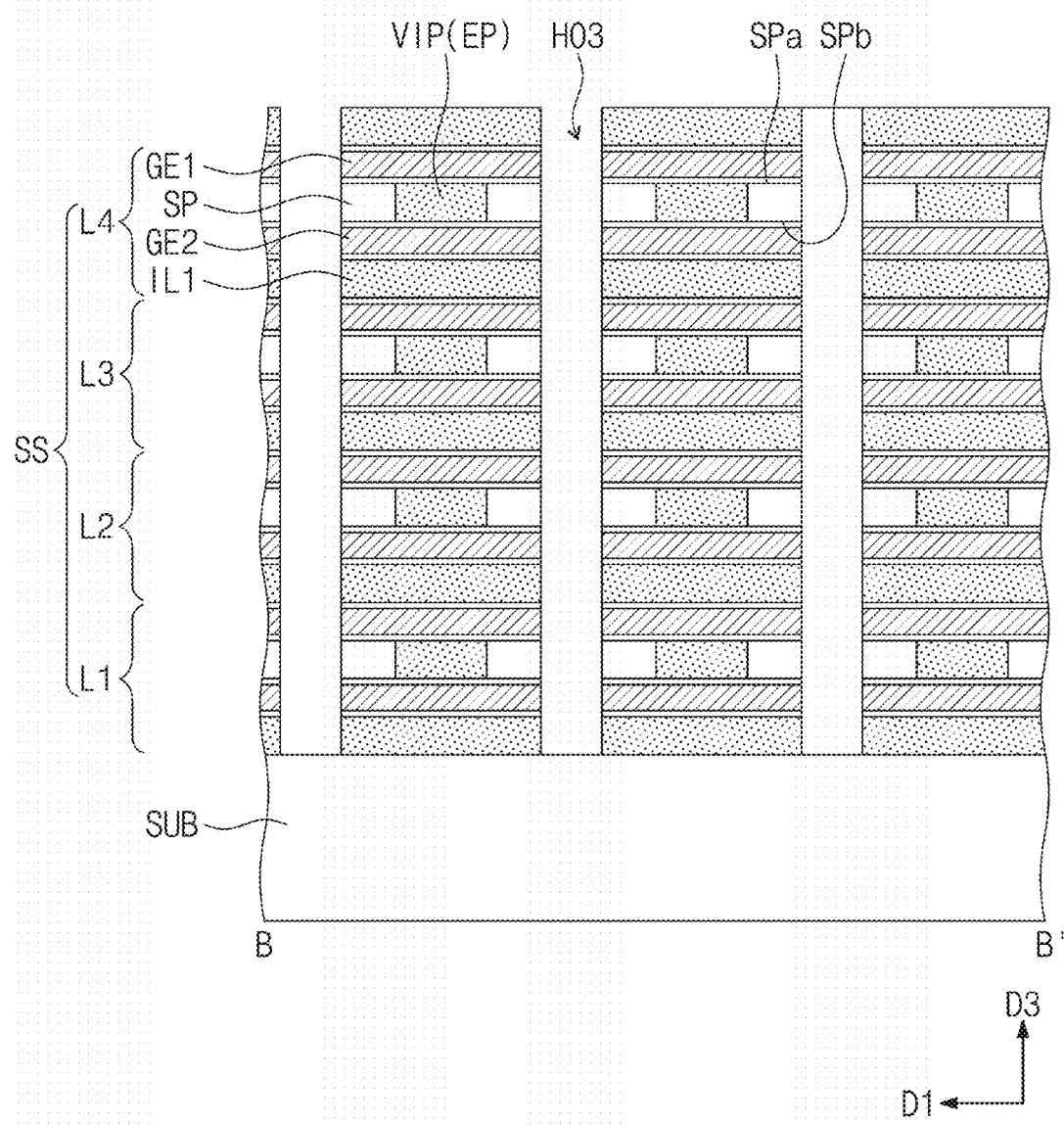

Referring to FIGS. 34, 35A and 35B, a spacer SPC may be formed in the fourth recess RS4. The spacer SPC may partially fill the fourth recess RS4. A gate insulating layer GI and a gate electrode GE may be formed in the fourth recess RS4. Thereafter, an anisotropic etching process may be performed through the third hole HO3 to completely remove materials filling the third hole HO3. Thus, stacked gate electrodes GE may not be vertically connected to each other.

Subsequently, substantially the same manufacturing processes as described above with reference to FIGS. 17 to 20B and 7 to 8C may be performed. For example, the bit lines BL extending in the third direction D3 may be formed at a side of the stack structure SS. The data storage elements DS may be formed at an opposite side of the stack structure SS.

In the 3D semiconductor memory device according to the example embodiments of inventive concepts, the gate electrode may be three-dimensionally provided on the body of the memory cell transistor. Thus, the channel controllability of the gate electrode may be improved.

In the 3D semiconductor memory device according to the example embodiments of inventive concepts, the bit line may be formed vertically, and the word line may be formed horizontally. Thus, when the memory cell array is three-dimensionally realized, process defects may be reduced and the reliability of the device may be improved.

While inventive concepts have been described with reference to some example embodiments, it will be apparent to those of ordinary skill in the art that various changes and modifications may be made without departing from the spirits and scopes of inventive concepts. Therefore, it should be understood that the above example embodiments are not limiting, but illustrative. Thus, the scopes of inventive concepts are to be determined by the broadest permissible interpretation of the following claims and their equivalents, and shall not be restricted or limited by the foregoing description.

What is claimed is:

1. A semiconductor memory device comprising:
a stack structure comprising a plurality of layers vertically stacked on a substrate, wherein each of the plurality of layers includes a semiconductor pattern, a gate electrode extending in a first direction on the semiconductor pattern, and a data storage element electrically connected to the semiconductor pattern;
a plurality of vertical insulators penetrating the stack structure, at least one of the plurality of the vertical insulators arranged in the first direction; and
a bit line vertically extending on a side of the stack structure,
wherein the bit line electrically connects the semiconductor patterns,
each of the vertical insulators comprises, a first vertical insulator, and a second vertical insulator adjacent to the first vertical insulator, and
the gate electrode includes a connection portion between the first vertical insulator and the second vertical insulator.

2. The semiconductor memory device of claim 1, wherein the plurality of vertical insulators divide the semiconductor pattern into a plurality of sub-patterns, and
wherein the sub-patterns are arranged in the first direction.

3. The semiconductor memory device of claim 2, wherein each of the vertical insulators further comprises:
an extension connecting the first vertical insulator and the second vertical insulator,
wherein the sub-patterns adjacent to each other are spaced apart from each other in the first direction by the first vertical insulator, the second vertical insulator, and the extension.

4. The semiconductor memory device of claim 1, wherein the data storage element comprises:
a first electrode electrically connected to the semiconductor pattern;
a second electrode on the first electrode; and
a dielectric layer between the first electrode and the second electrode.

5. The semiconductor memory device of claim 1, wherein the gate electrode comprises:
a first gate electrode on a first surface of the semiconductor pattern; and
a second gate electrode on a second surface of the semiconductor pattern, the second surface opposite to the first surface.

6. The semiconductor memory device of claim 1, wherein the gate electrode is on a top surface, a bottom surface, a first sidewall, and a second sidewall of the semiconductor pattern.

7. The semiconductor memory device of claim 1, wherein the bit line comprises:
stacked horizontal portions, each of the stacked horizontal portions electrically connected to a respective semiconductor pattern of the stack structure; and
a vertical portion connecting the stacked horizontal portions and extending vertically.

8. The semiconductor memory device of claim 1, wherein the second vertical insulator is offset from the first vertical insulator in the first direction.

9. The semiconductor memory device of claim 1, wherein the second vertical insulator is aligned with the first vertical insulator in a second direction, the second direction intersecting the first direction.

10. The semiconductor memory device of claim 1, wherein the gate electrode has a first sidewall and a second sidewall which are opposite to each other in a second direction, the second direction intersecting the first direction, and
wherein each of the first and second sidewalls is curved.

11. A semiconductor memory device comprising:
a stack structure including a plurality of layers vertically stacked on a substrate, wherein each of the plurality of layers includes a semiconductor pattern, a gate electrode extending in a first direction on the semiconductor pattern, and a data storage element electrically connected to the semiconductor pattern;
a vertical insulator penetrating the stack structure, the vertical insulator extending in a second direction intersecting the first direction; and
a bit line vertically extending on a side of the stack structure,
wherein the semiconductor pattern includes a first semiconductor sub-pattern and a second semiconductor sub-pattern which are spaced apart from each other in the first direction with the vertical insulator interposed therebetween,
the vertical insulator includes a first vertical insulator and a second vertical insulator adjacent to the first vertical insulator,
the gate electrode includes a connection portion between the first vertical insulator and the second vertical insulator, and
the gate electrode on the first semiconductor sub-pattern is connected to the gate electrode on the second semiconductor sub-pattern through the connection portion.

12. The semiconductor memory device of claim 11, wherein the bit line comprises:
stacked horizontal portions, each of the stacked horizontal portions electrically connected to a respective semiconductor pattern of the stack structure; and
a vertical portion connecting the stacked horizontal portions and extending vertically.

13. The semiconductor memory device of claim 11, wherein the gate electrode comprises:
a first gate electrode on a first surface of the semiconductor pattern; and
a second gate electrode on a second surface of the semiconductor pattern, the second surface opposite to the first surface.

14. The semiconductor memory device of claim 11, wherein the gate electrode is on a top surface, a bottom surface a first sidewall, and a second sidewall of the semiconductor pattern.

15. The semiconductor memory device of claim 11, wherein the data storage element comprises:
a first electrode electrically connected to the semiconductor pattern;
a second electrode on the first electrode; and
a dielectric layer between the first electrode and the second electrode.

16. A semiconductor memory device comprising:
- a bit line extending in a first direction on a substrate, the first direction perpendicular to a top surface of the substrate;
- a semiconductor pattern extending in a second direction from the bit line, the second direction parallel to the top surface of the substrate, the semiconductor pattern having a first surface and a second surface which are opposite to each other in the first direction;
- a first gate electrode and a second gate electrode on the first surface and the second surface of the semiconductor pattern, respectively, the first and second gate electrodes extending in a third direction, the first and second gate electrodes parallel to each other, the third direction being parallel to the top surface of the substrate and intersecting the second direction; and
- a data storage element electrically connected to the semiconductor pattern.

17. The semiconductor memory device of claim 16, wherein the first gate electrode and the second gate electrode are spaced apart from each other in the first direction.

18. The semiconductor memory device of claim 16, further comprising:
- an insulating pillar penetrating the semiconductor pattern and the first and second gate electrodes,
- wherein each of the first and second gate electrodes has a first sidewall and a second sidewall which are opposite to each other in the second direction, and
- each of the first and second sidewalls is curved.

19. The semiconductor memory device of claim 16, wherein the data storage element comprises:
- a first electrode electrically connected to the semiconductor pattern;
- a second electrode on the first electrode; and
- a dielectric layer between the first electrode and the second electrode.

20. The semiconductor memory device of claim 16, further comprising:
- a peripheral circuit region on the substrate,
- wherein the bit line, the semiconductor pattern, the first and second gate electrodes, and the data storage element correspond to a memory cell of a cell array, and
- the memory cell and the peripheral circuit region are stacked in the first direction.

* * * * *